(12) United States Patent
Tremaine et al.

(10) Patent No.: US 9,837,804 B2
(45) Date of Patent: Dec. 5, 2017

(54) INTEGRATED ELECTRICAL ASSEMBLY, ENCLOSURE, MASTER TUB, MULTI-WIRE CONNECTOR, AND JUNCTION BOX

(71) Applicant: QTran, Inc., Milford, CT (US)

(72) Inventors: John M. Tremaine, New Canaan, CT (US); Adrian R. Teschemaker, West Haven, CT (US)

(73) Assignee: QTRAN, INC., Milford, CT (US)

( * ) Notice: Subject to any disclaimer, the term of this patent is extended or adjusted under 35 U.S.C. 154(b) by 0 days.

(21) Appl. No.: 15/030,514

(22) PCT Filed: Oct. 20, 2014

(86) PCT No.: PCT/US2014/061320
§ 371 (c)(1),
(2) Date: Apr. 19, 2016

(87) PCT Pub. No.: WO2015/061202
PCT Pub. Date: Apr. 30, 2015

(65) Prior Publication Data
US 2016/0241007 A1    Aug. 18, 2016

Related U.S. Application Data

(60) Provisional application No. 61/893,664, filed on Oct. 21, 2013, provisional application No. 61/918,462, (Continued)

(51) Int. Cl.
*H02G 3/12* (2006.01)
*H01R 9/24* (2006.01)
(Continued)

(52) U.S. Cl.
CPC .............. *H02G 3/12* (2013.01); *H01R 9/2416* (2013.01); *H02G 3/081* (2013.01); *H02G 3/123* (2013.01);
(Continued)

(58) Field of Classification Search
USPC ................................................ 174/50, 58, 67
See application file for complete search history.

(56) References Cited

U.S. PATENT DOCUMENTS 2,397,102 A    3/1946    Graham
2,398,901 A    4/1946    West
(Continued)

FOREIGN PATENT DOCUMENTS

GB            17512        0/1908

*Primary Examiner* — Dhirubhai R Patel
(74) *Attorney, Agent, or Firm* — Ware, Fressola, Maguire & Barber LLP

(57) ABSTRACT

An example integrated electrical assembly for installation in a building structure is disclosed. The integrated electrical assembly may provide for power and telecommunications distribution in a building structure or a subspace of a building structure. A master tub configured to receive a plurality of electrical components and provide a common ground is disclosed. The master tub may be used in the integrated electrical assembly or alone. A multi-wire connector that may provide coupling of one or more wires to a circuit is disclosed. A junction box that may be installed in a wall, such as a pre-fabricated wall is disclosed.

4 Claims, 80 Drawing Sheets

Related U.S. Application Data filed on Dec. 19, 2013, provisional application No. 62/003,456, filed on May 27, 2014.

(51) Int. Cl.
    *H02G 3/08*     (2006.01)
    *H02G 3/14*     (2006.01)
    *H05K 5/00*     (2006.01)
    *H05K 5/03*     (2006.01)
    *H05K 5/06*     (2006.01)

(52) U.S. Cl.
    CPC ............... *H02G 3/083* (2013.01); *H02G 3/14* (2013.01); *H05K 5/0004* (2013.01); *H05K 5/03* (2013.01); *H05K 5/061* (2013.01)

(56) References Cited

U.S. PATENT DOCUMENTS

| | | |
|---|---|---|
| 2,787,773 A | 4/1957 | Potter |
| 4,334,261 A | 6/1982 | Gonzales |
| 5,232,277 A | 8/1993 | Cassady et al. |
| 5,238,133 A | 8/1993 | Cox |
| 5,831,212 A | 11/1998 | Whitehead et al. |
| 6,170,928 B1 | 1/2001 | Eardley et al. |
| 7,762,415 B2 * | 7/2010 | Matsui .................. H02G 3/088 174/58 |
| 2001/0023772 A1 | 9/2001 | Layne |
| 2007/0145871 A1 | 6/2007 | Christie |
| 2009/0283291 A1 | 11/2009 | Ni |
| 2011/0005800 A1 | 1/2011 | Magno, Jr. |
| 2012/0024803 A1 | 2/2012 | Replogle |
| 2012/0200211 A1 | 8/2012 | Yanni |

\* cited by examiner

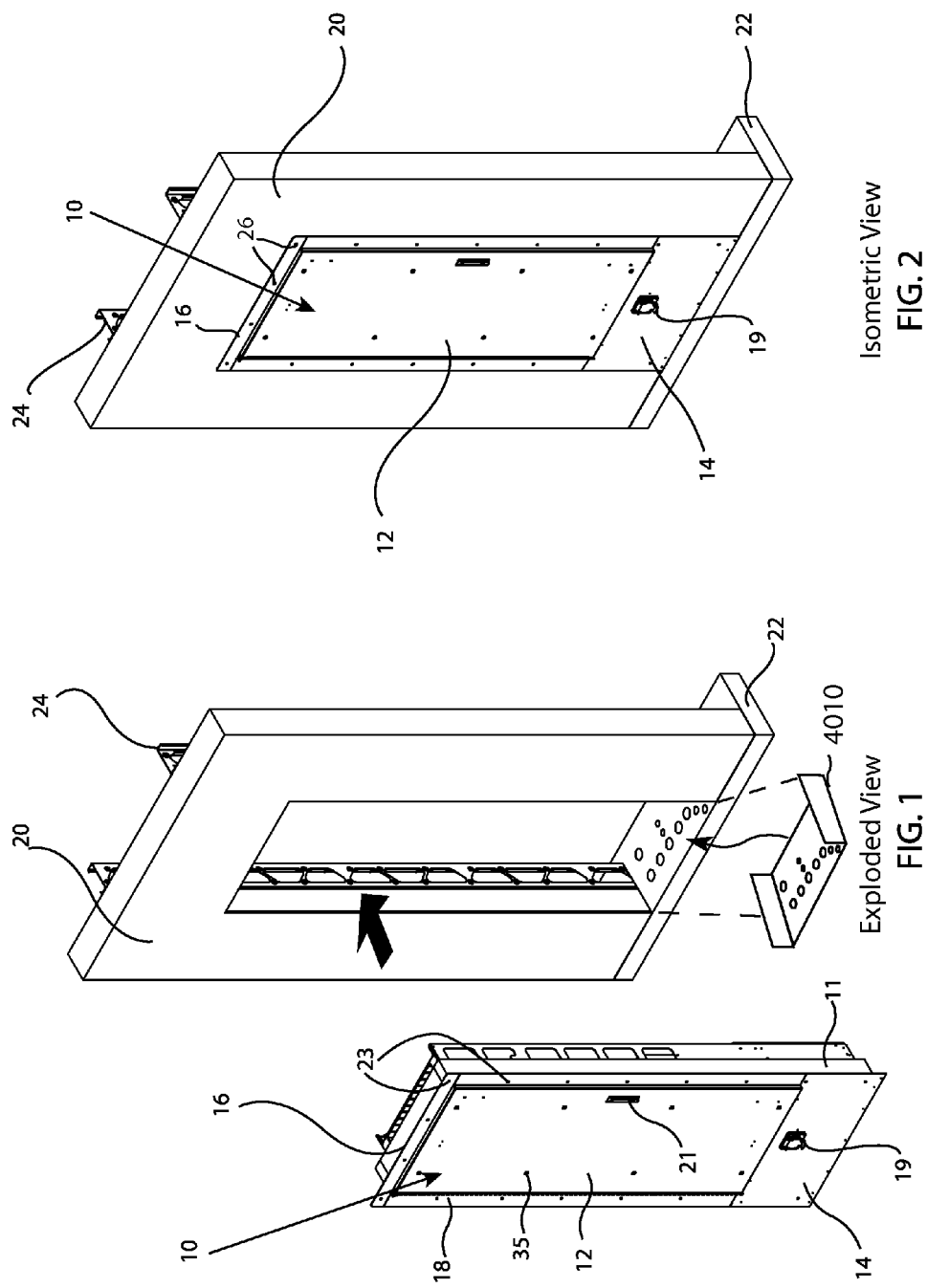

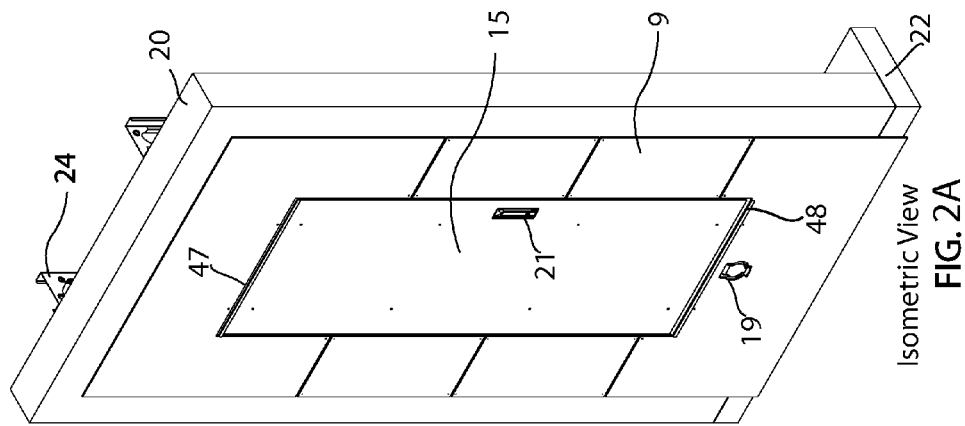
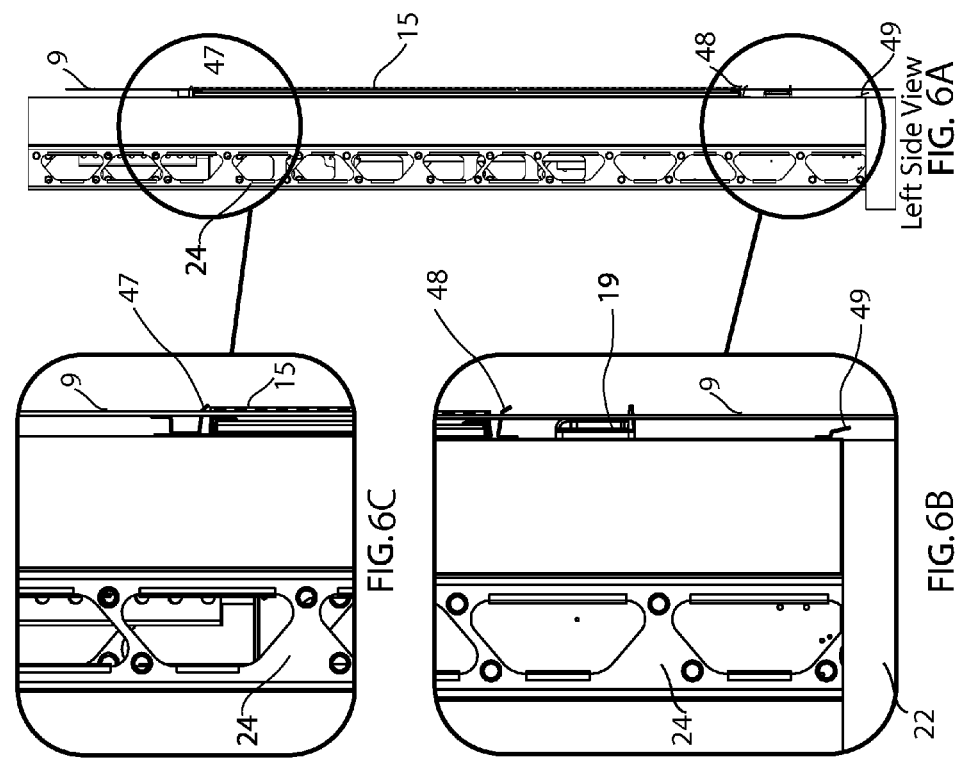

RIGHT SIDE VIEW

FRONT VIEW

LEFT SIDE VIEW

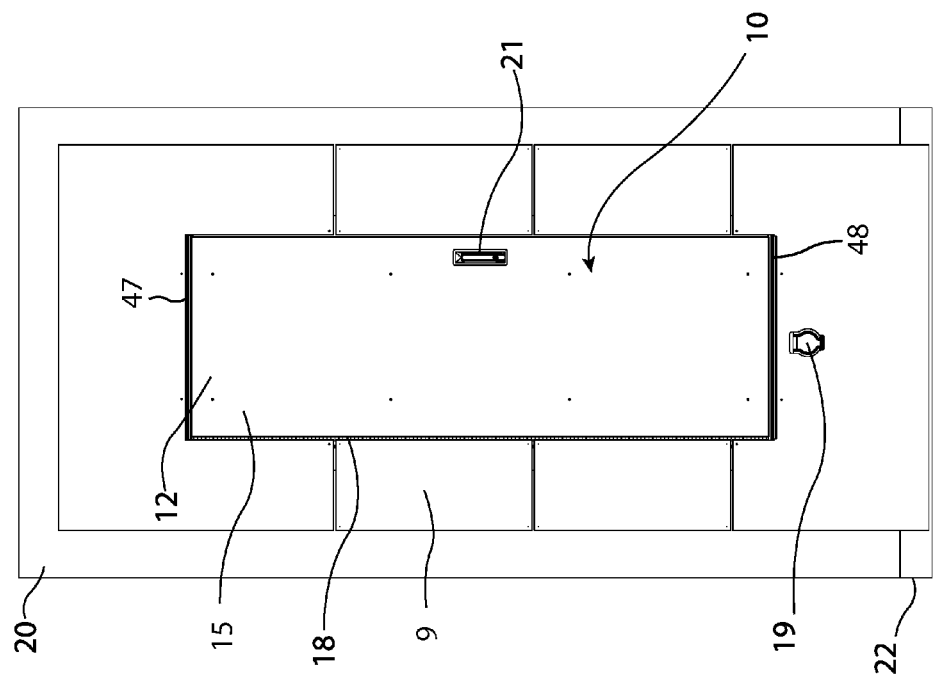
FIG. 3A Front View
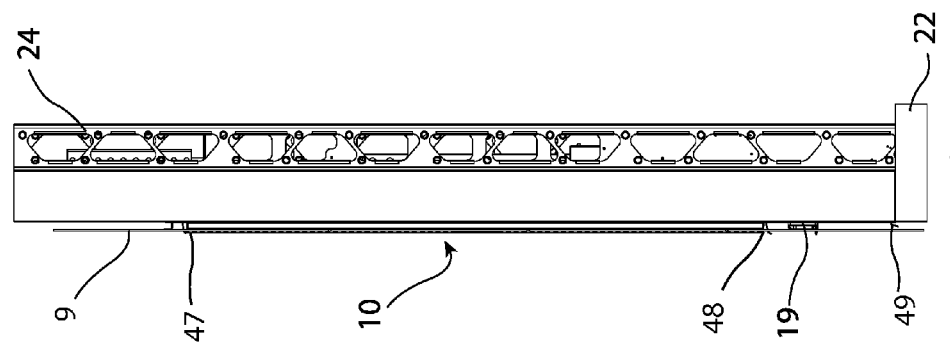
FIG. 5A Right Side View

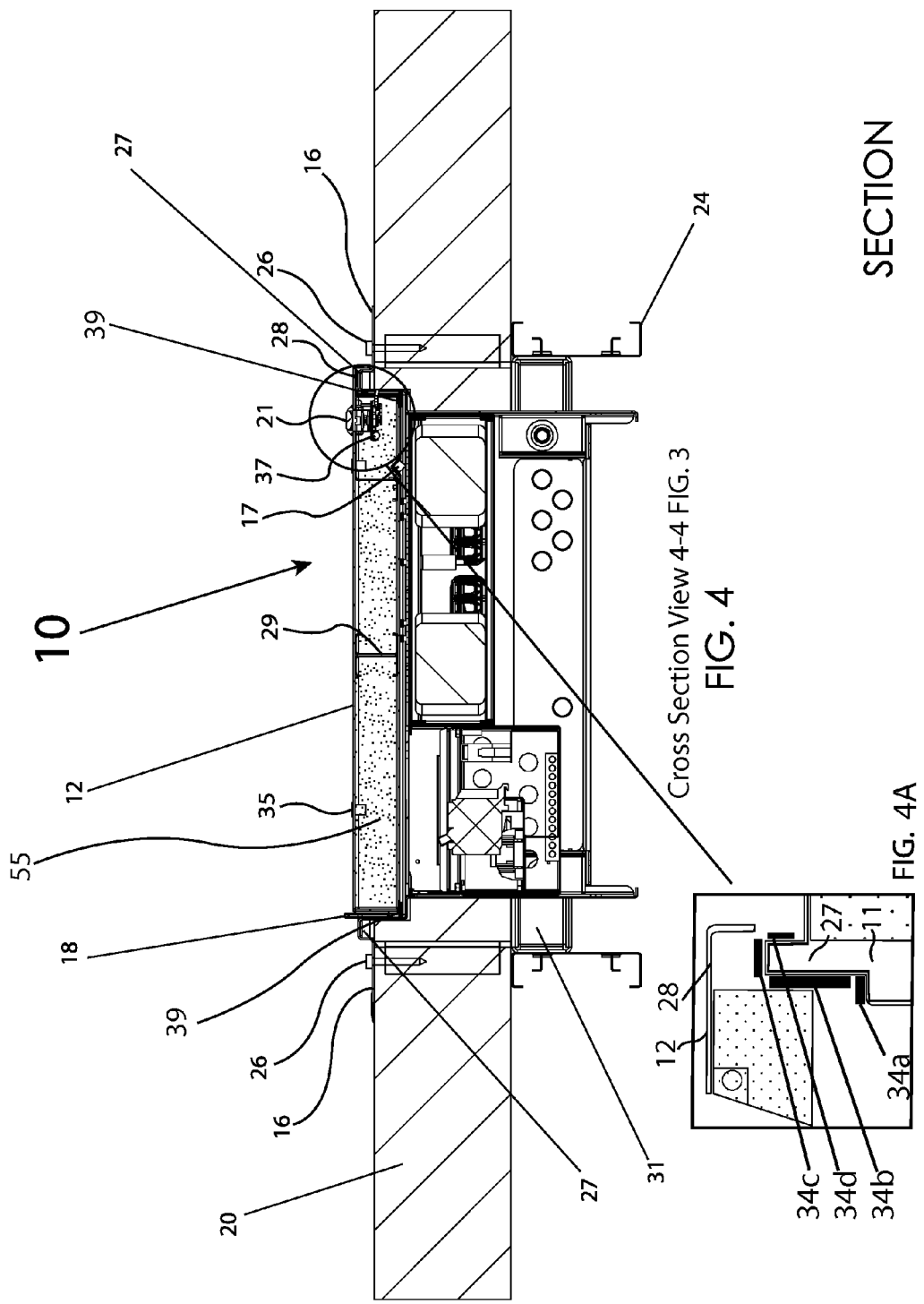

Bottom View

Top View

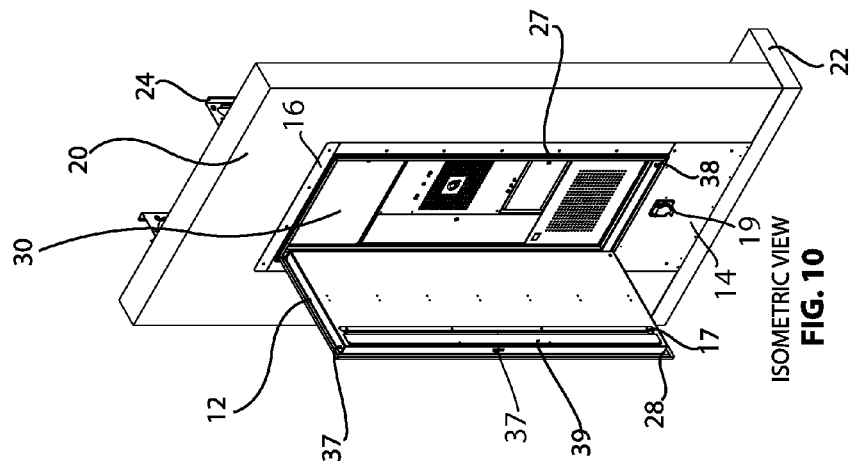
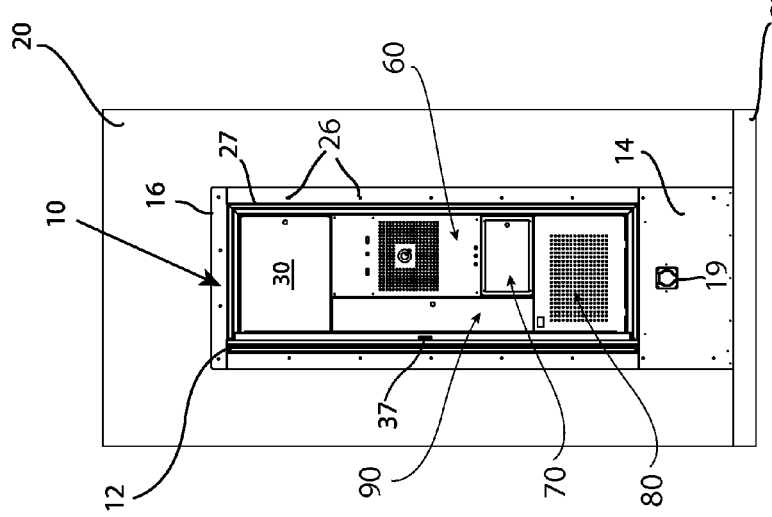
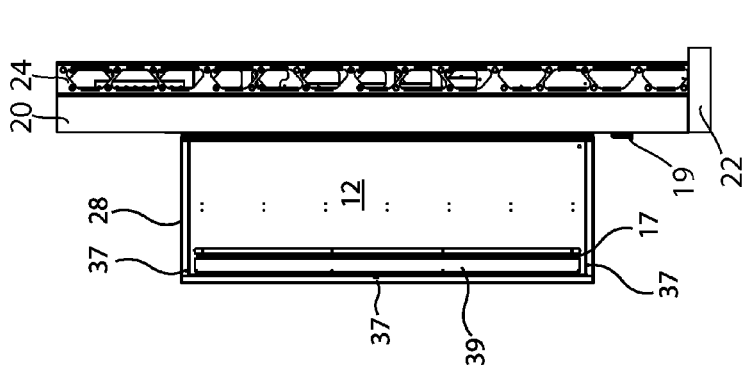

Top View

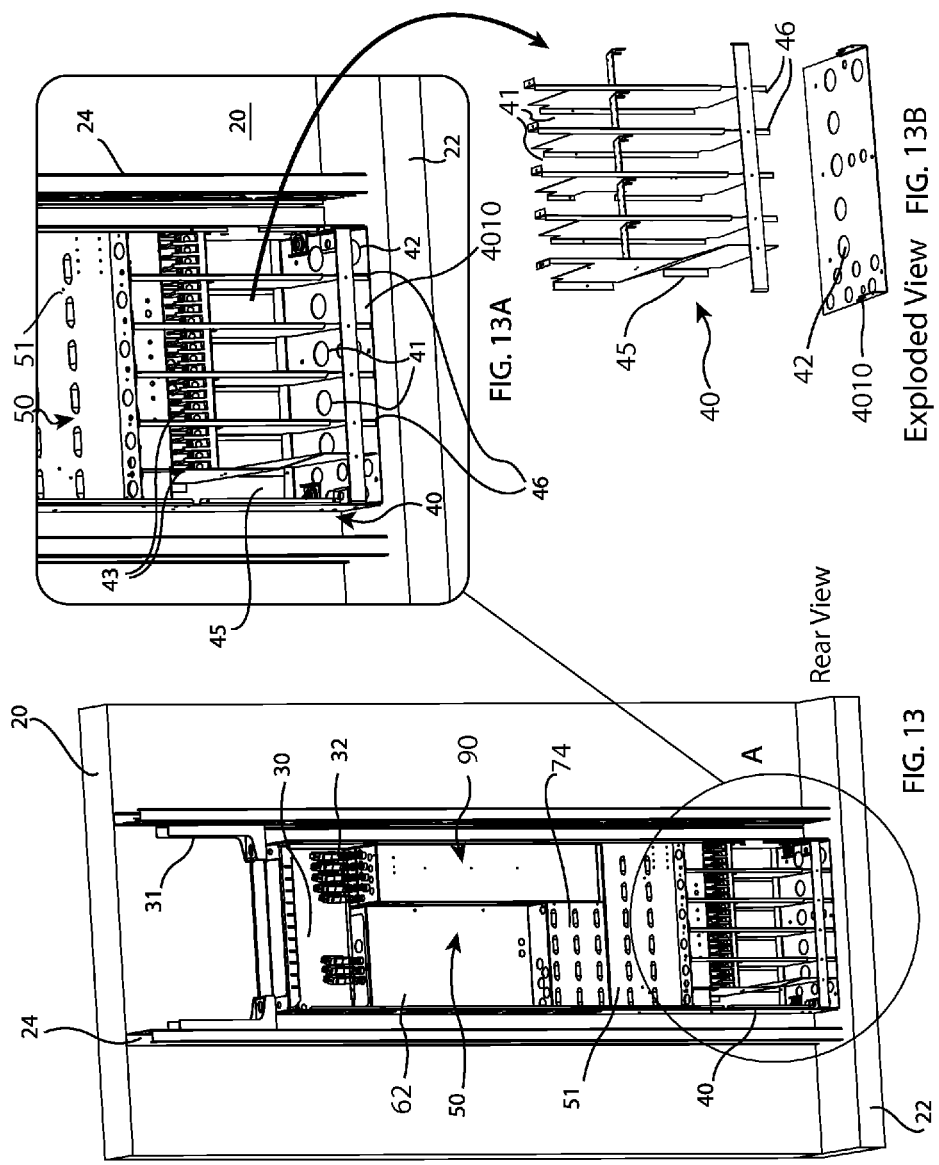

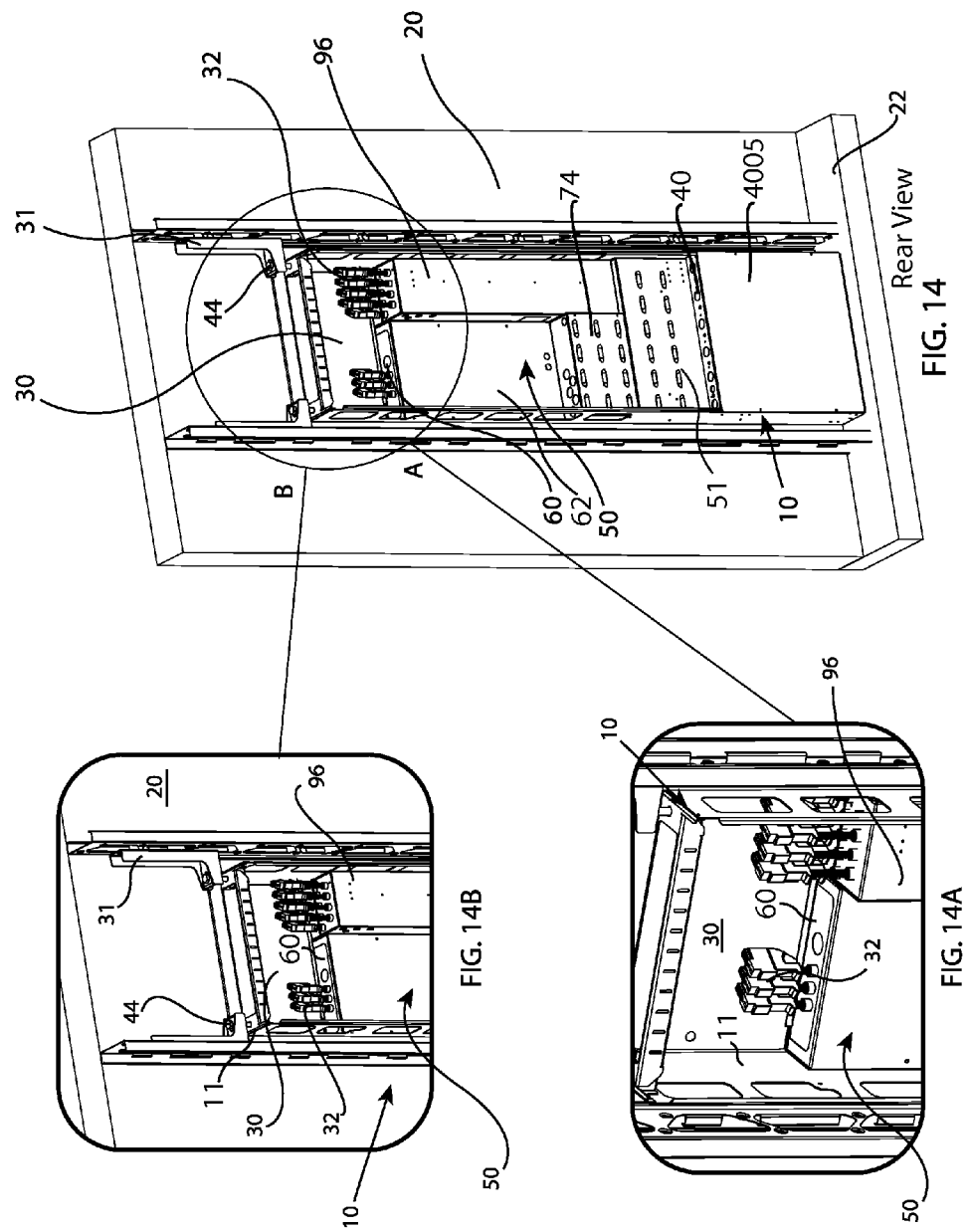

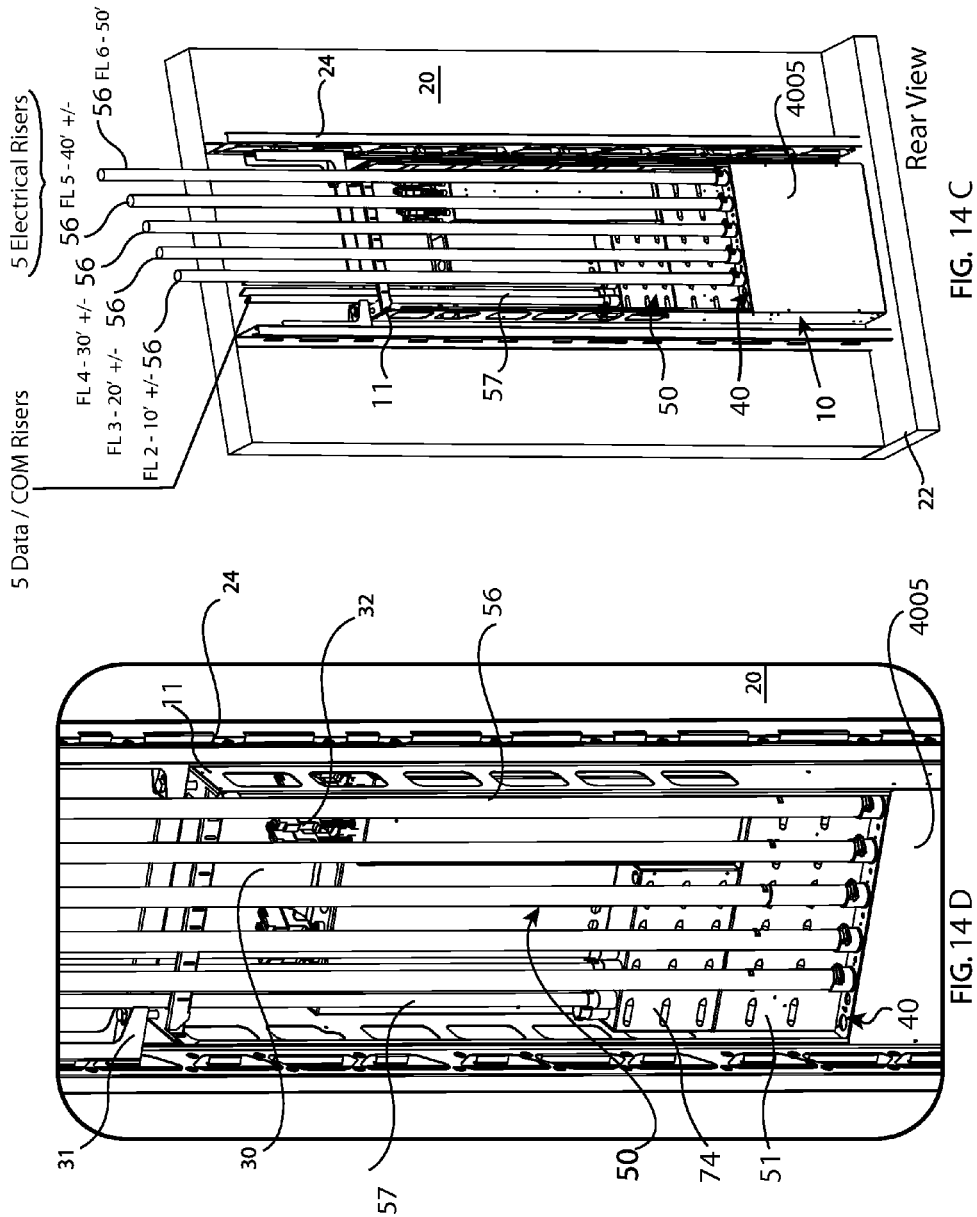

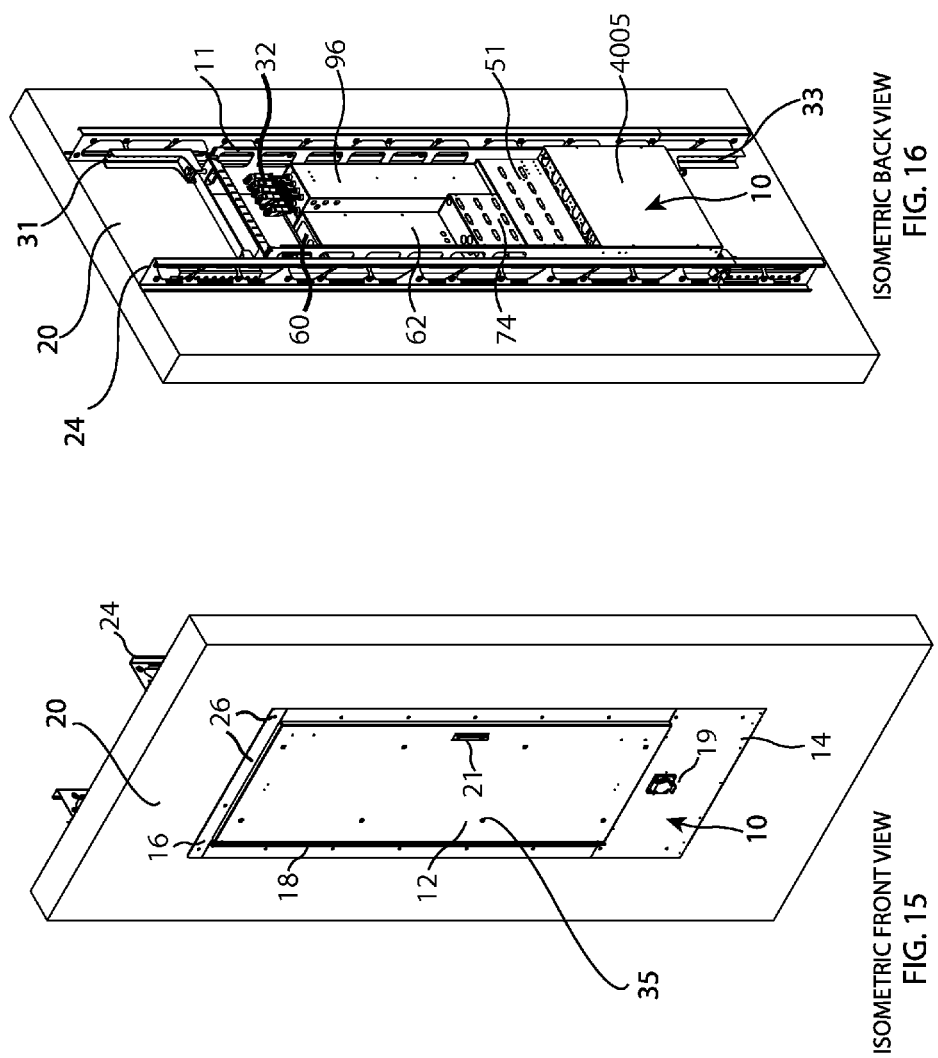

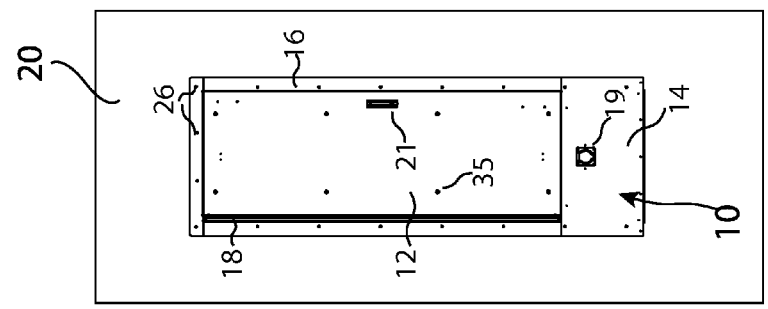
FRONT
FIG. 19
2ND FLOOR AND UP
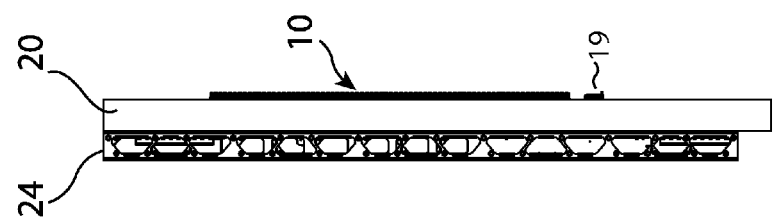
LEFT SIDE FIG. 18
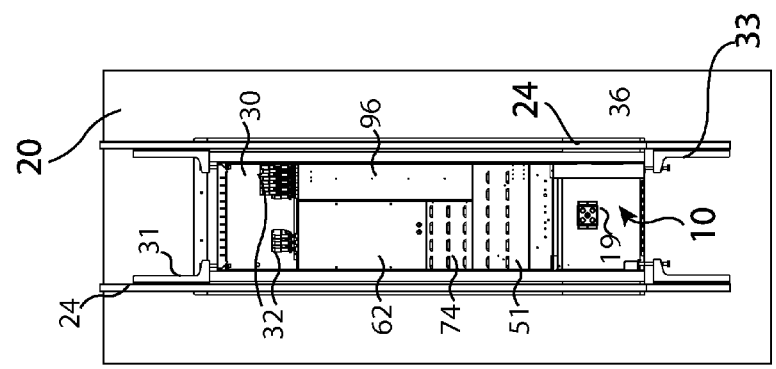
BACK  Without plate 4005
FIG. 17

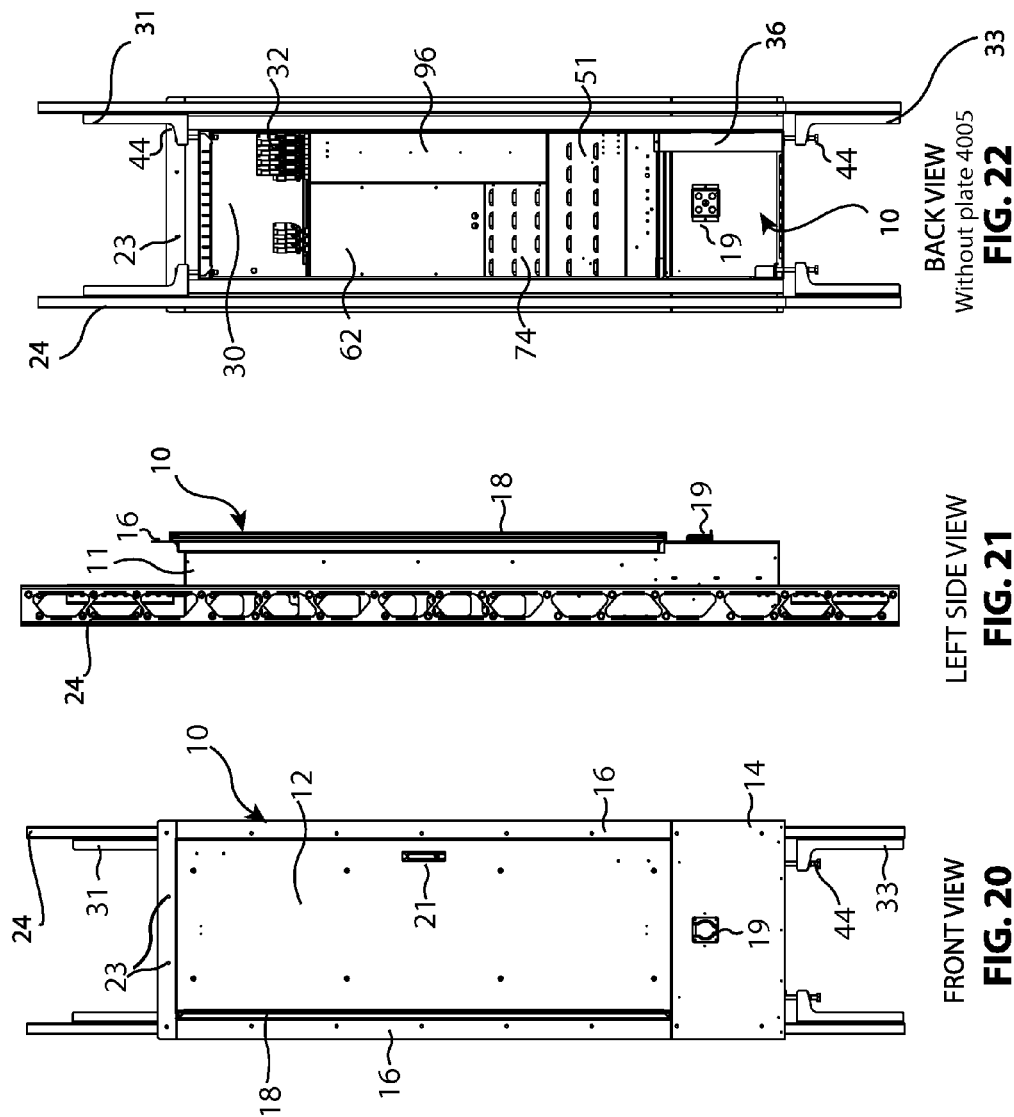

ISOMETRIC FRONT VIEW

Without Panel

ISOMETRIC BACK VIEW

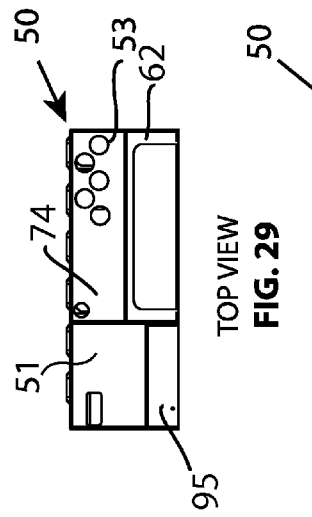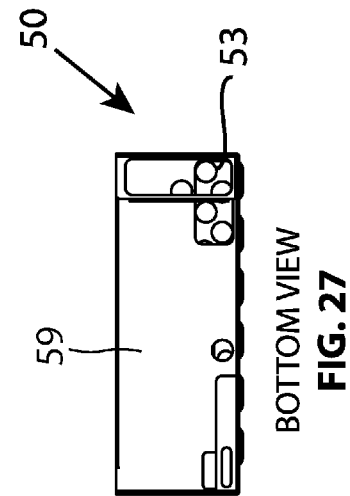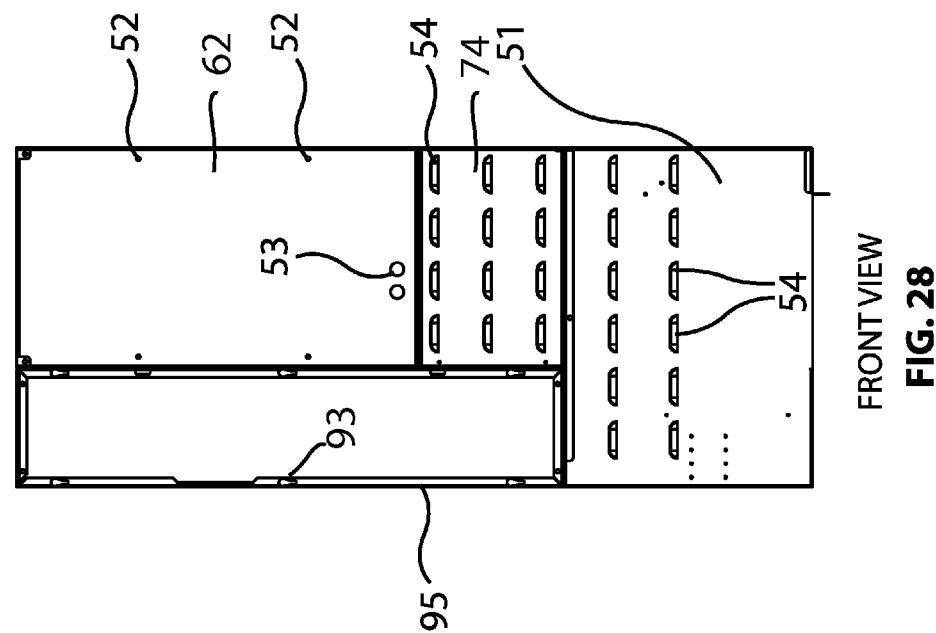

ISOMETRIC VIEW

RIGHT SIDE VIEW

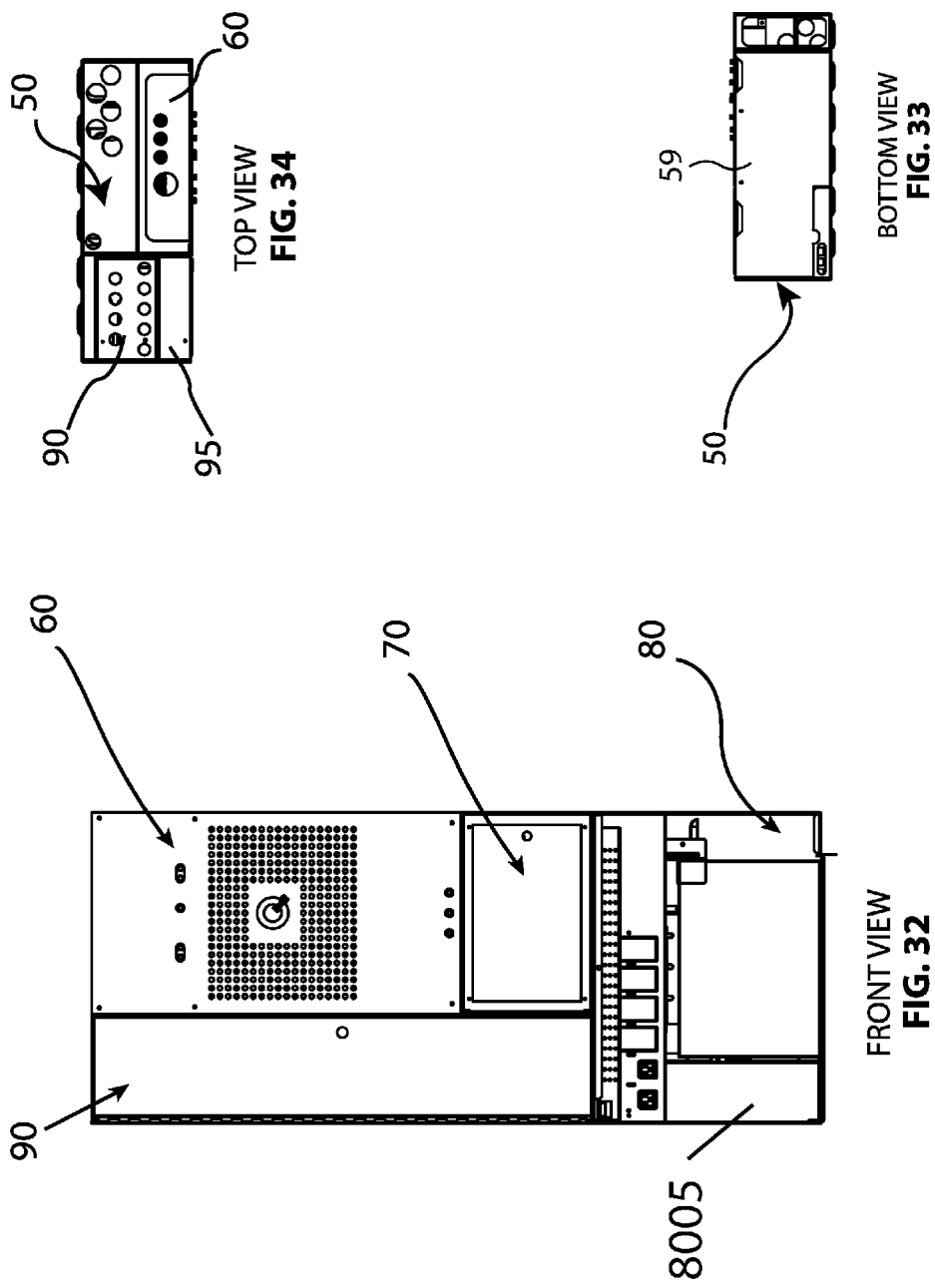

Exploded View

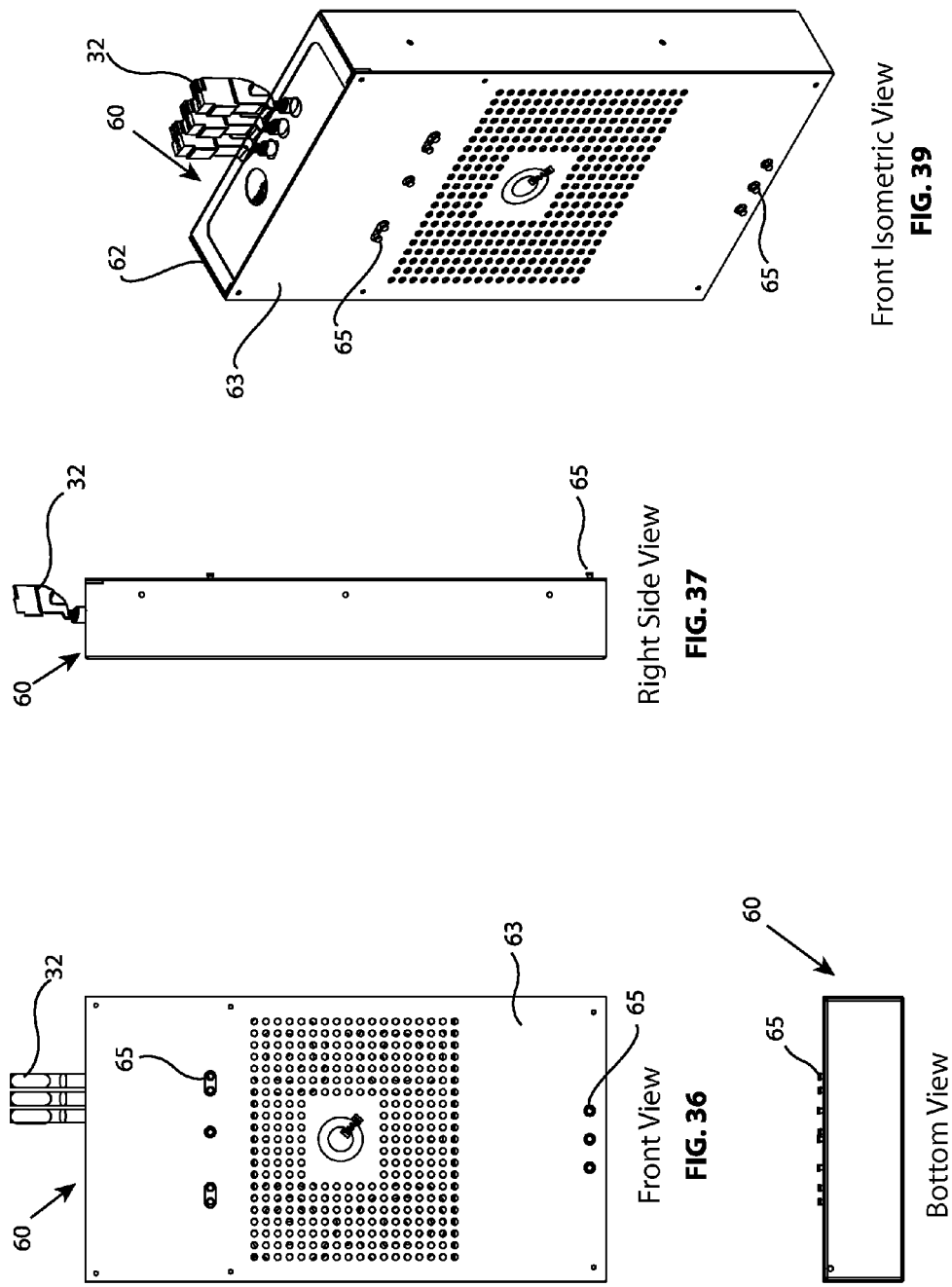

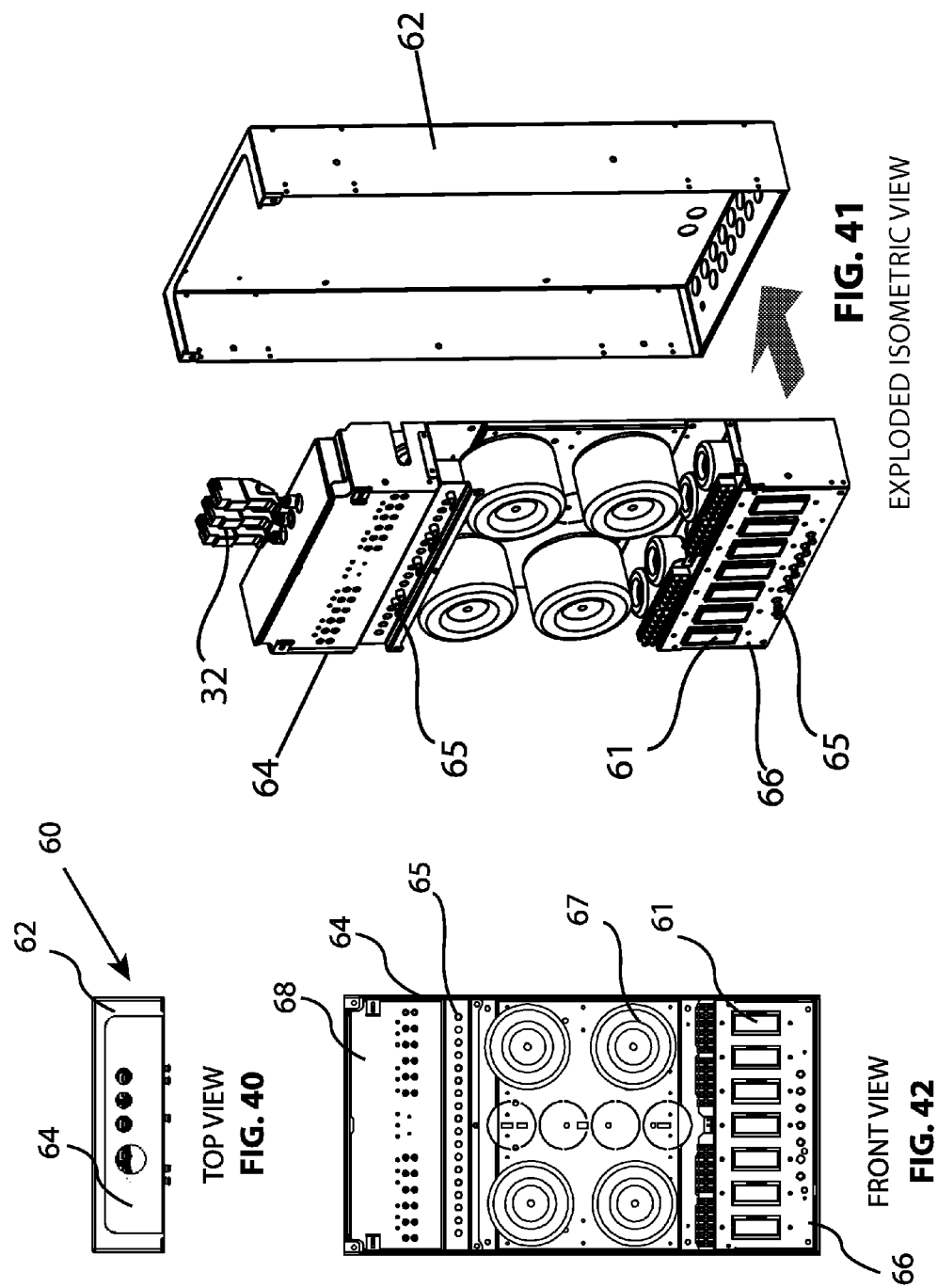

Front Isometric View

Front Isometric View

Top Isometric View

Front View

Top Isometric View

Top Isometric View

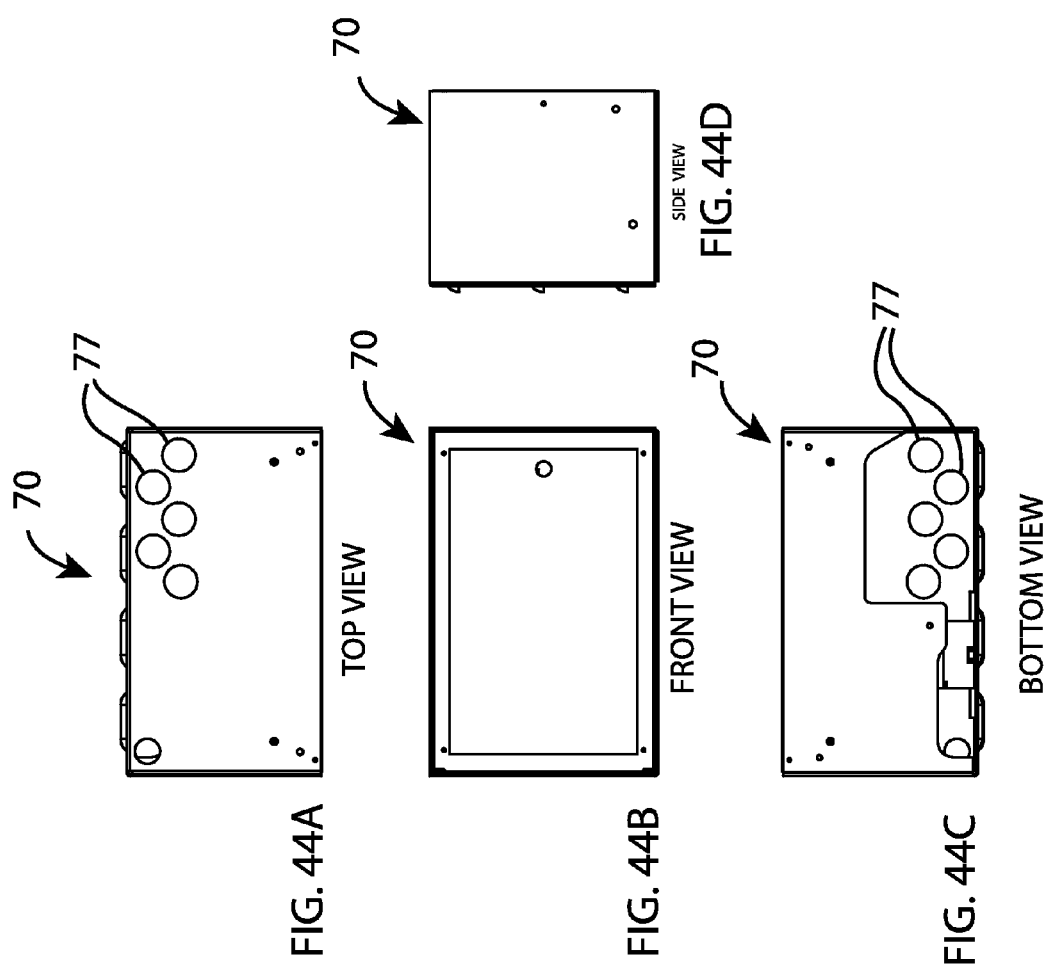

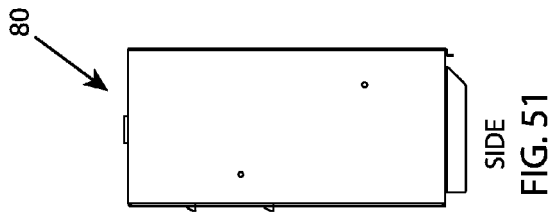
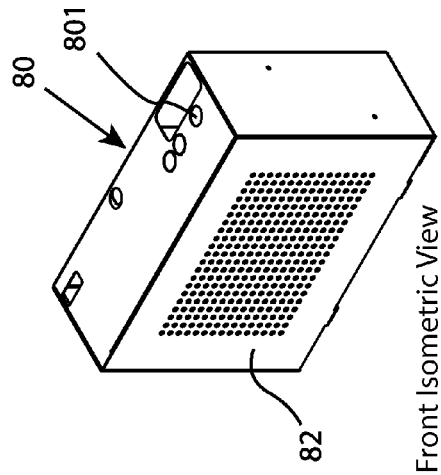
FIG. 48
Front Isometric View
FIG. 51
SIDE
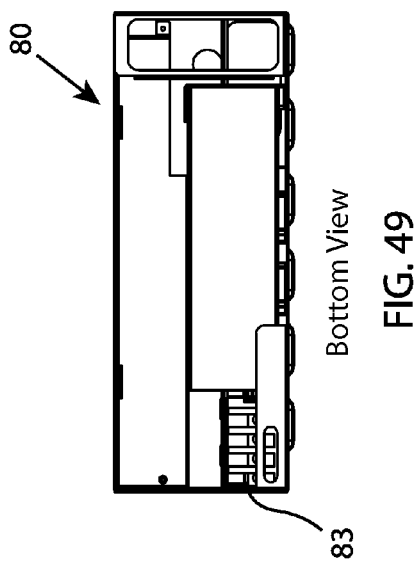
FIG. 49
Bottom View
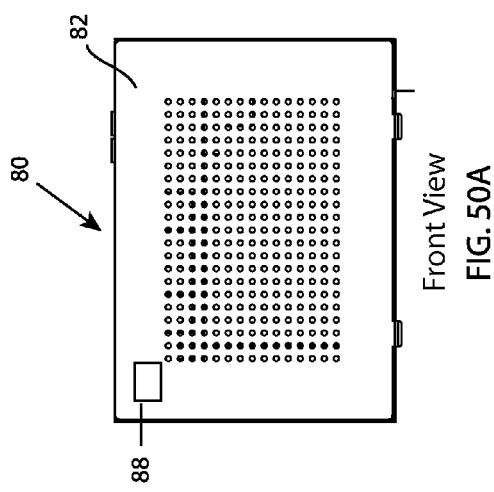
FIG. 50A
Front View Front View Front View

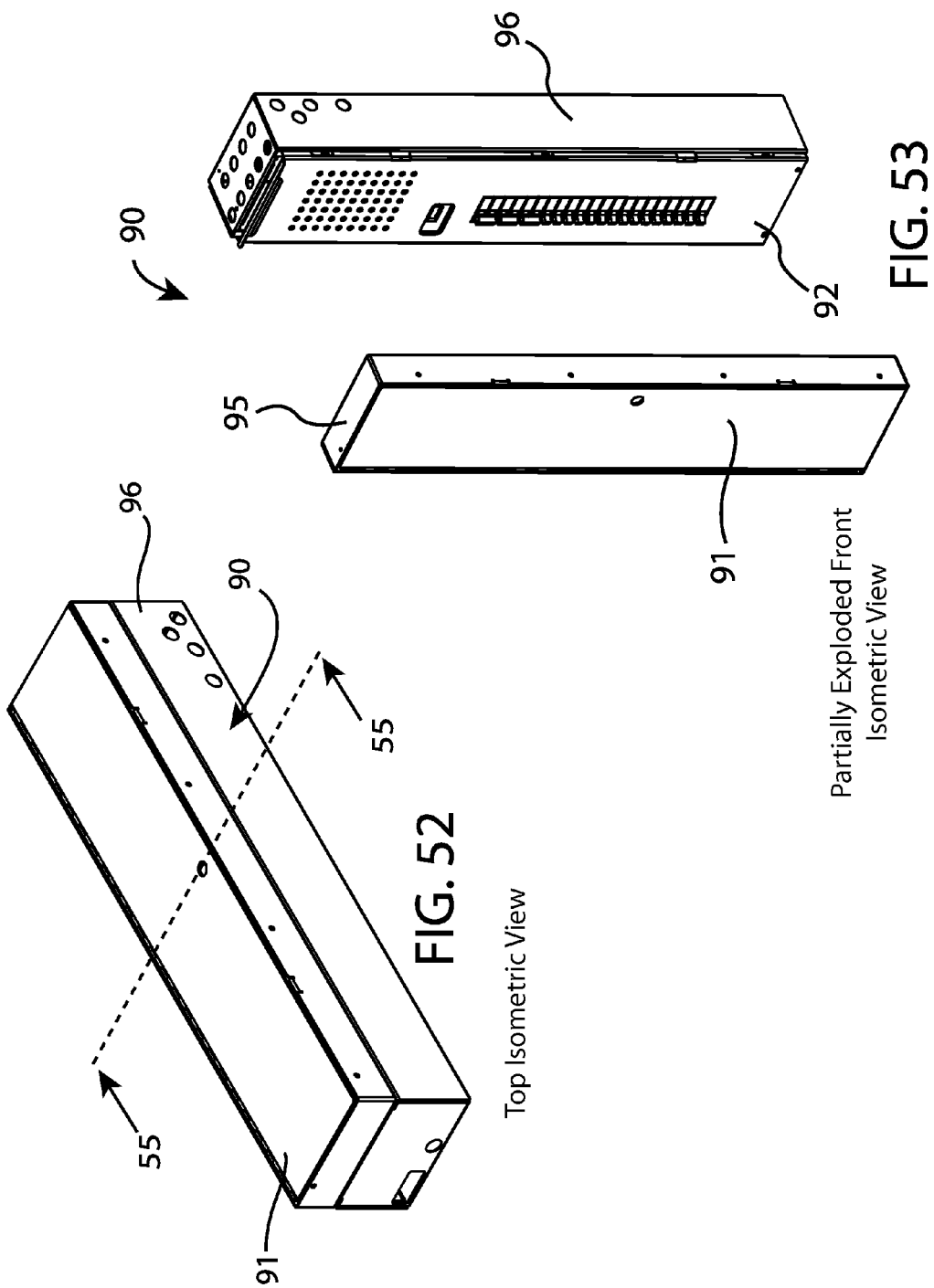

Exploded Isometric View

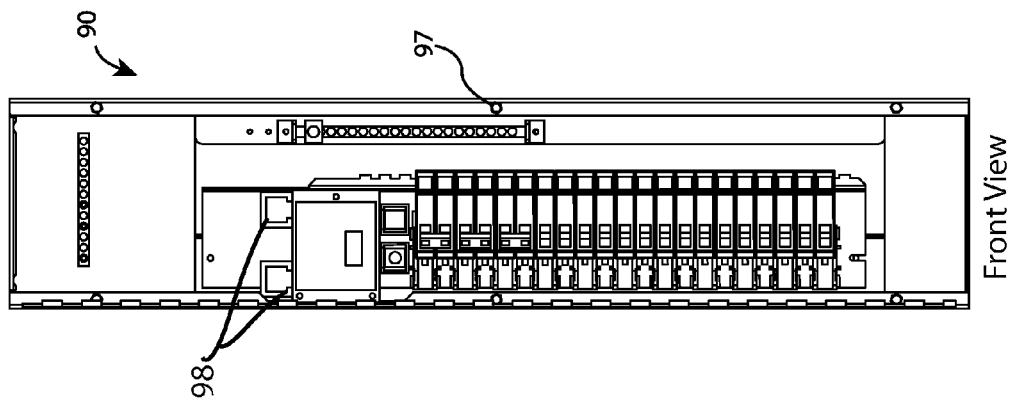
Front View FIG. 56
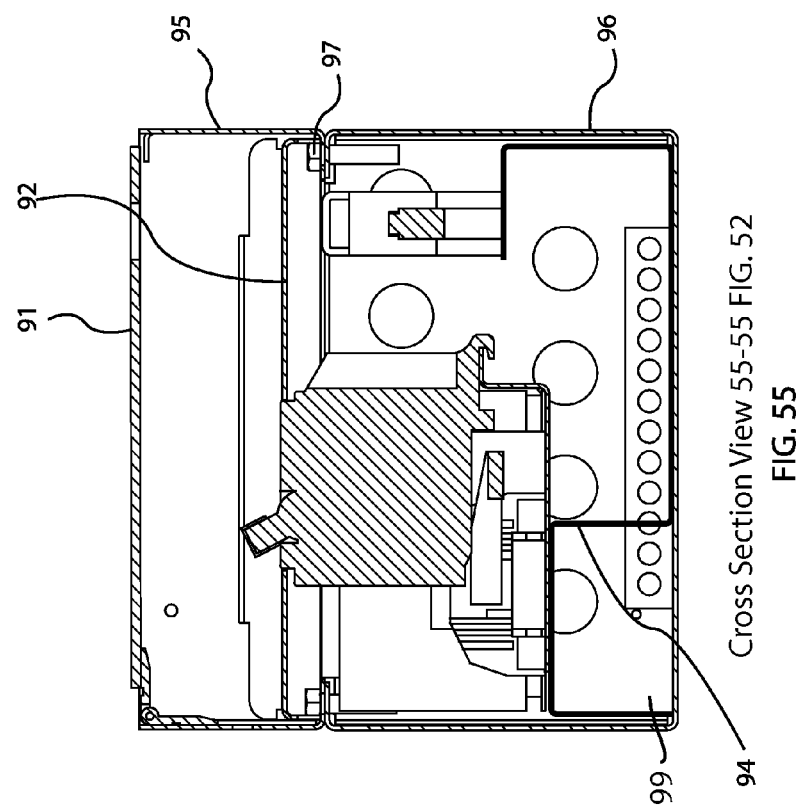
Cross Section View 55-55 FIG. 52
FIG. 55

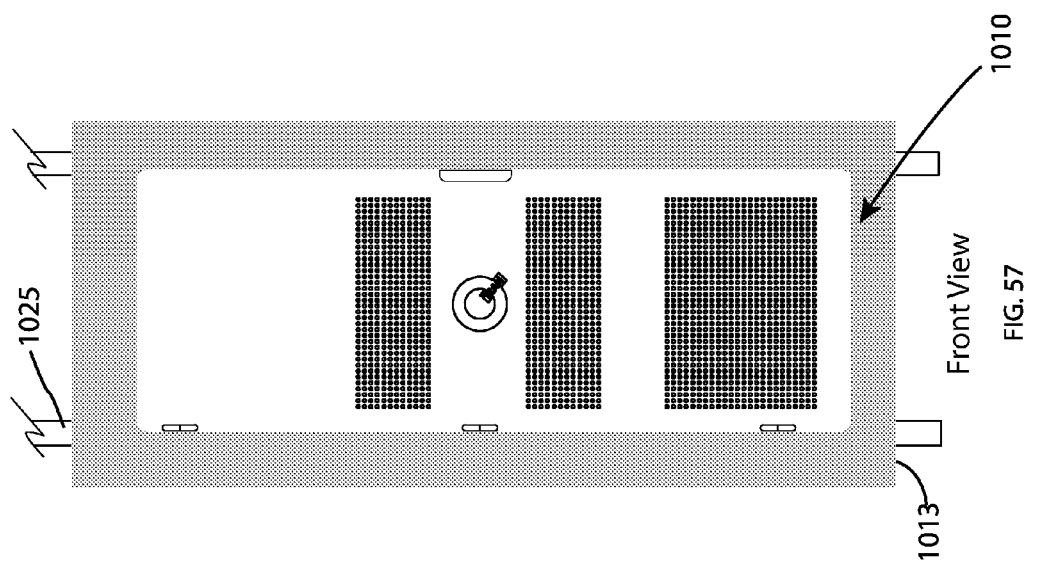

FRONT ISOMETRIC VIEW

SIDE VIEW

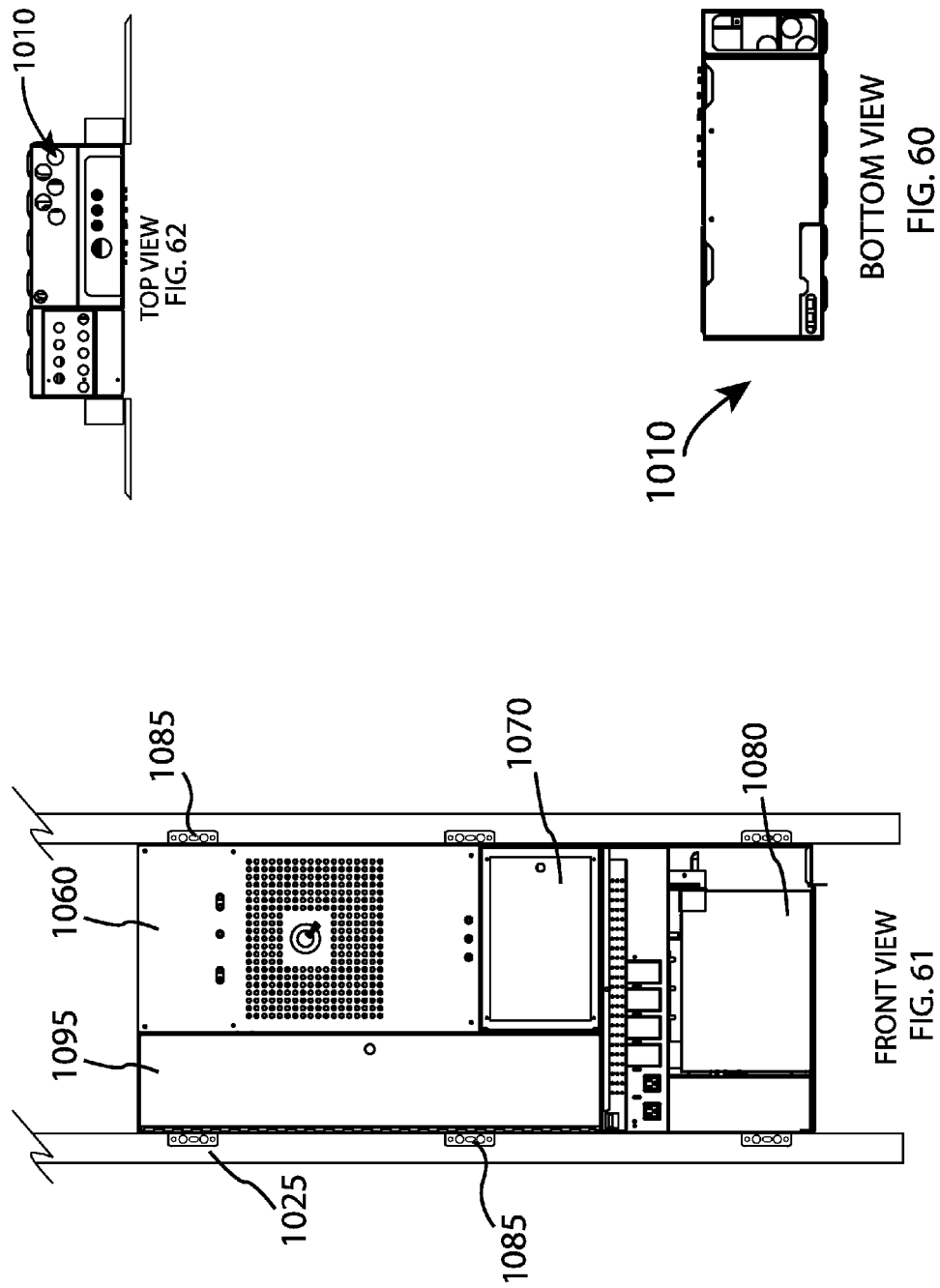

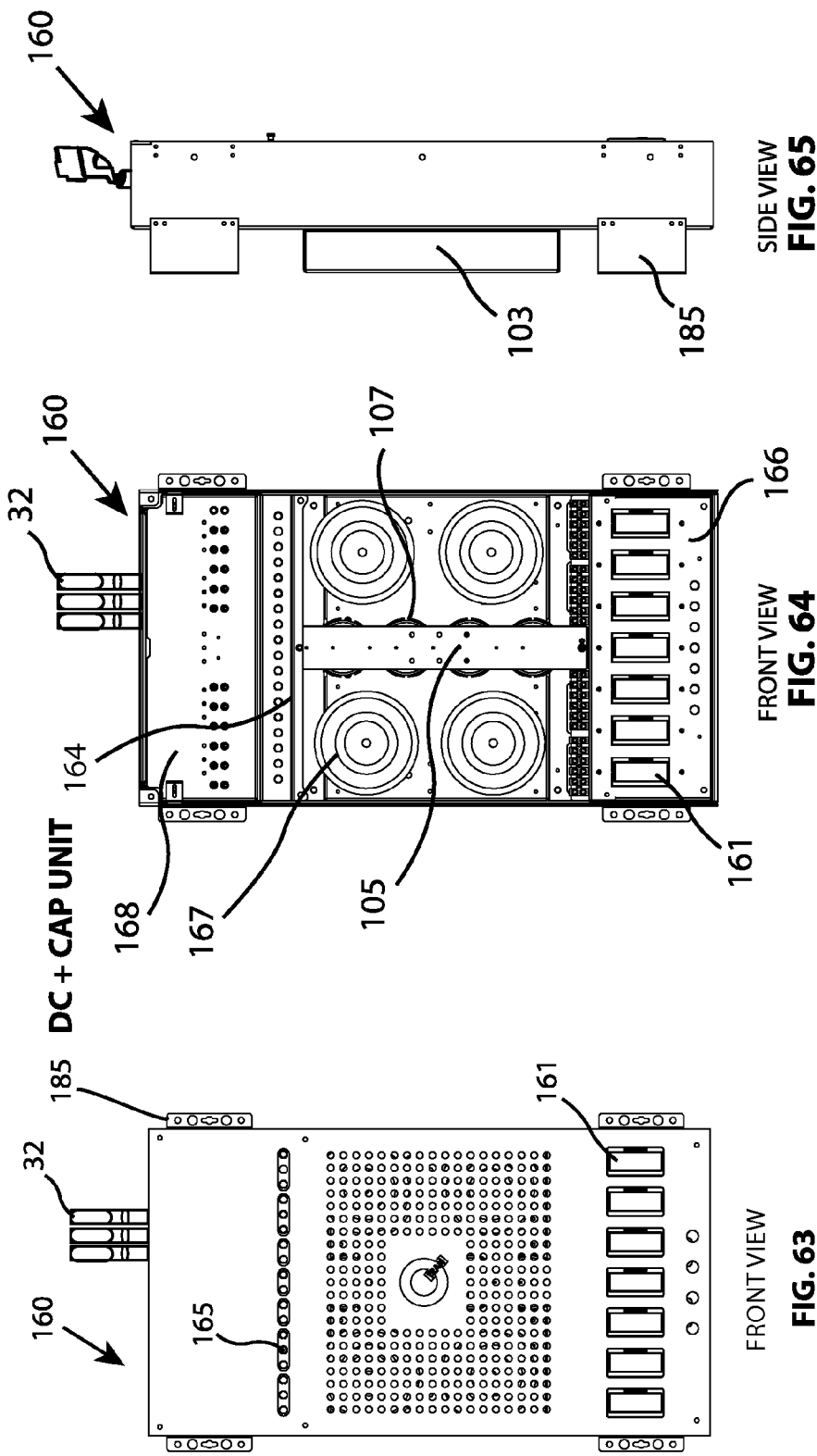

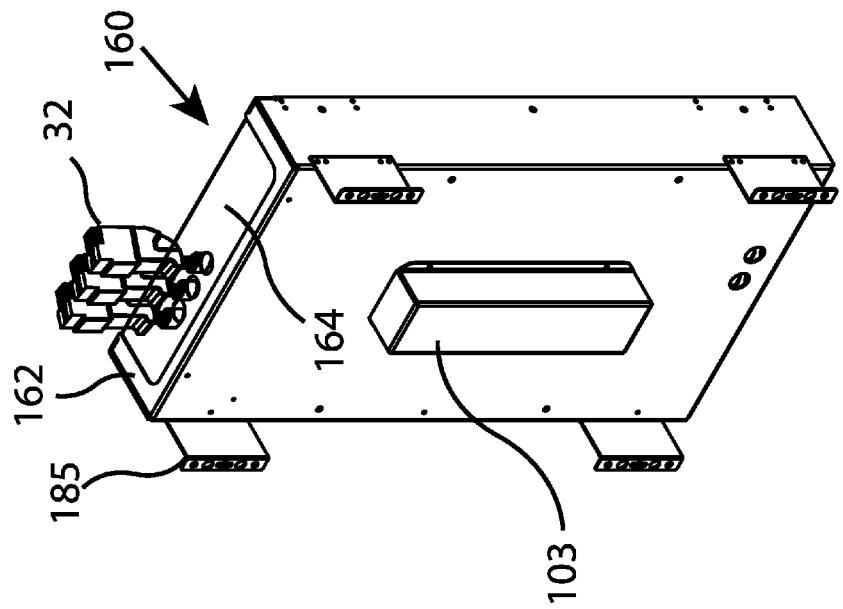
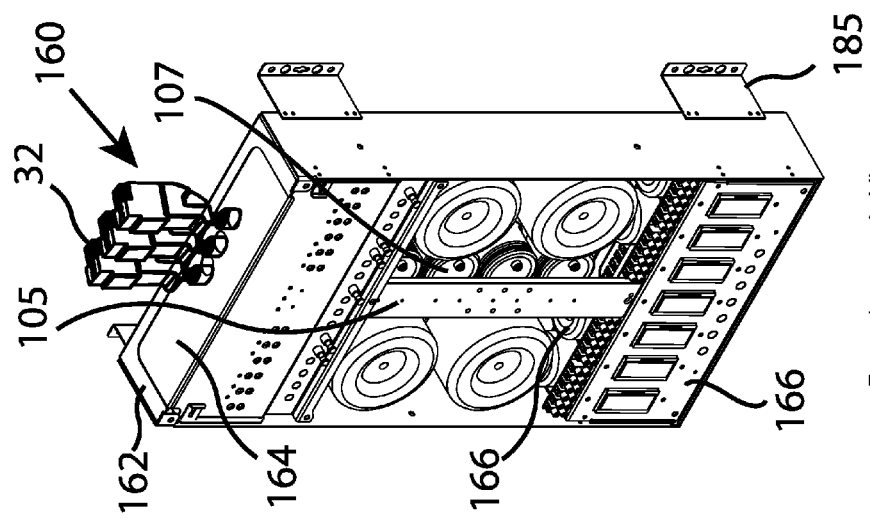

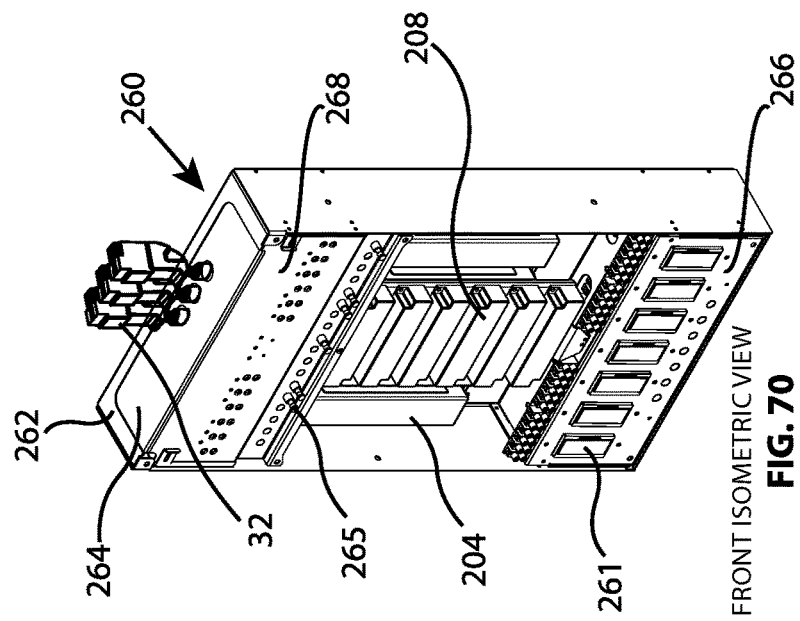
FIG. 70 FRONT ISOMETRIC VIEW
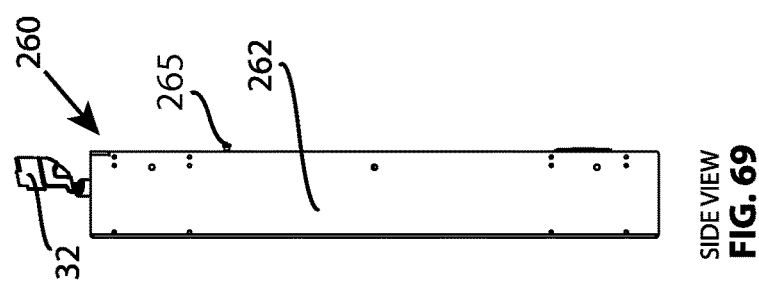
FIG. 69 SIDE VIEW
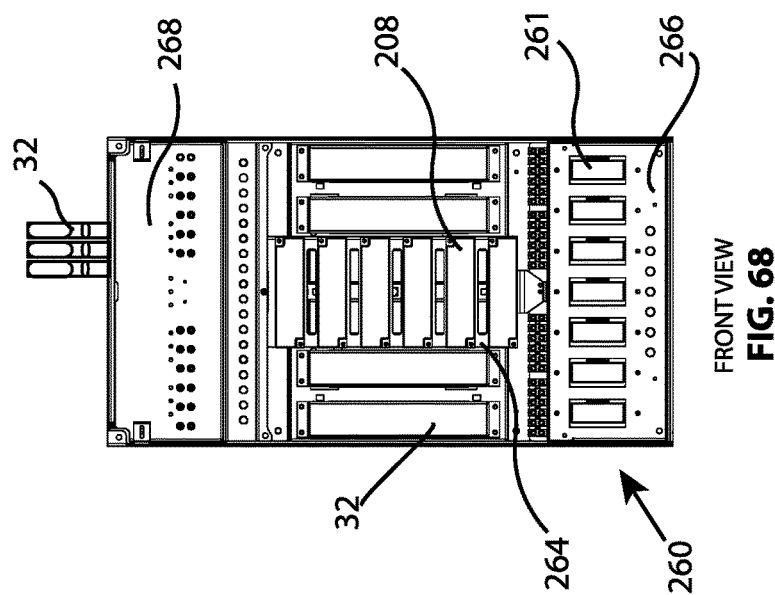
FIG. 68 FRONT VIEW

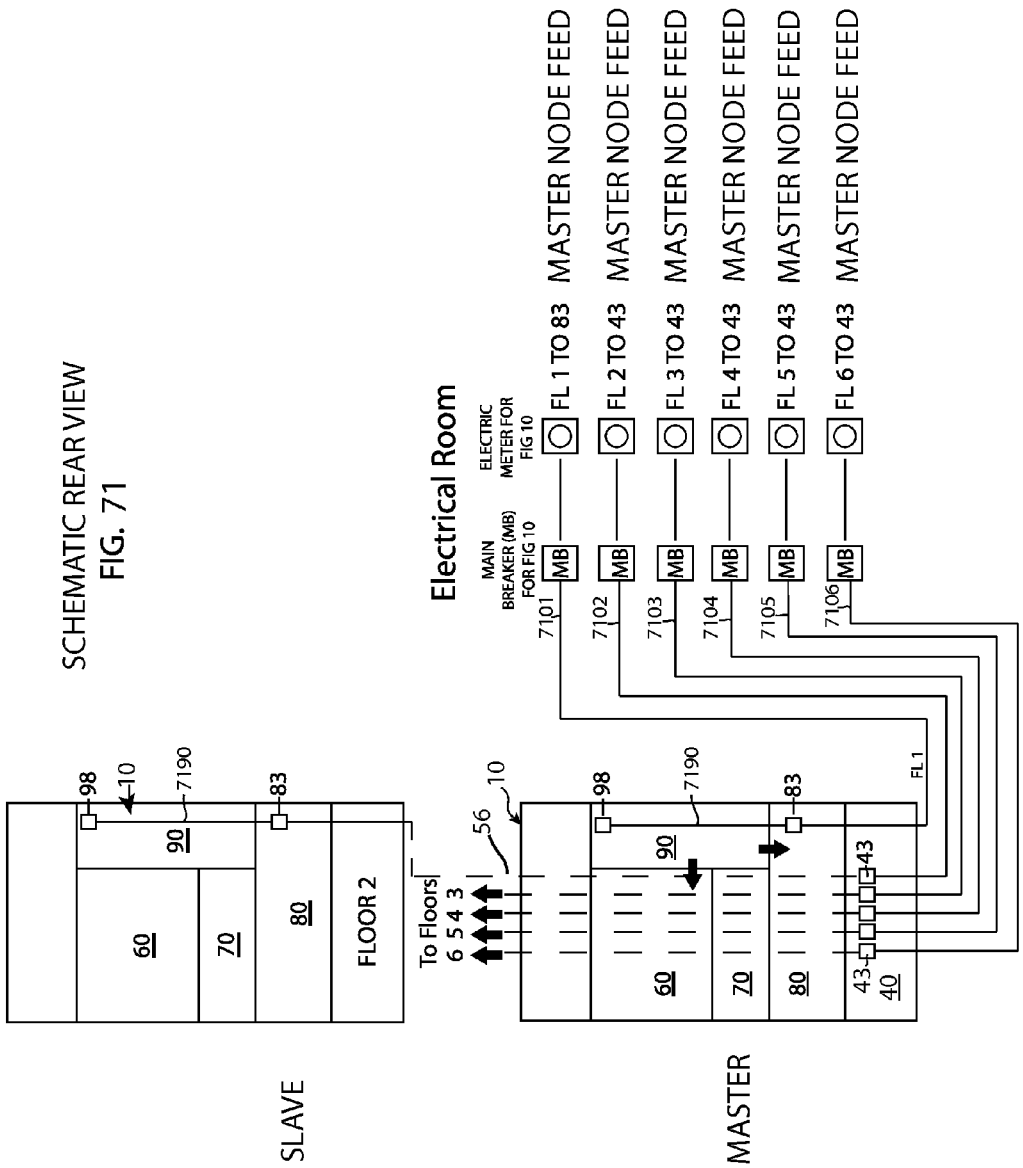

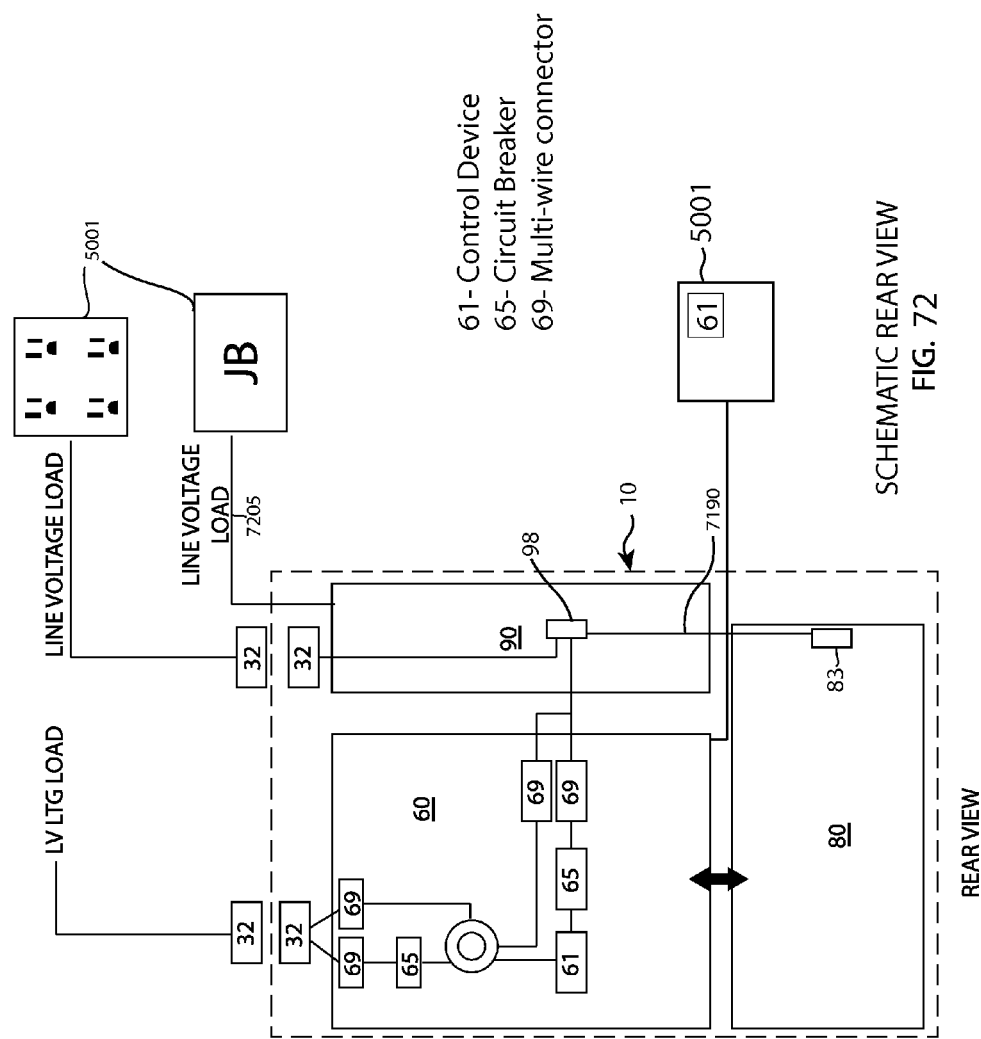

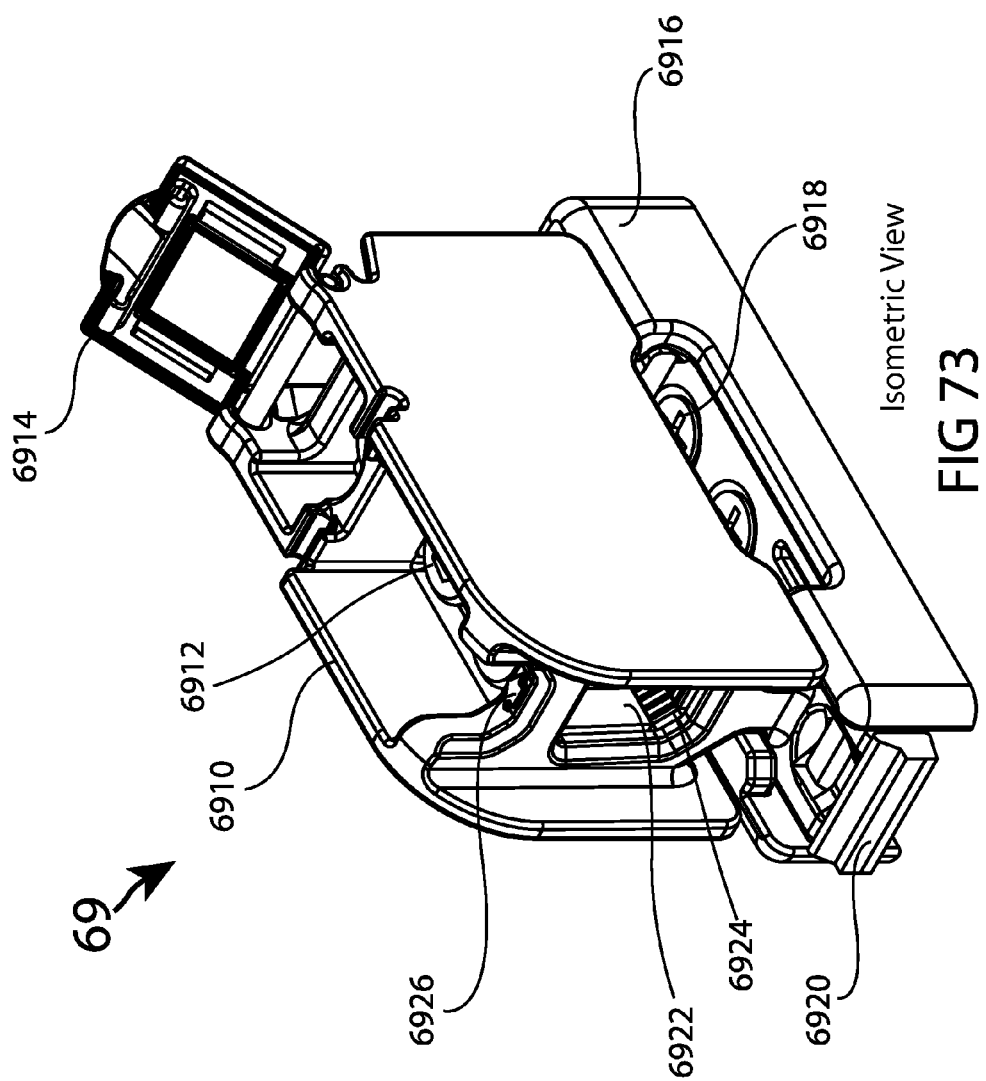

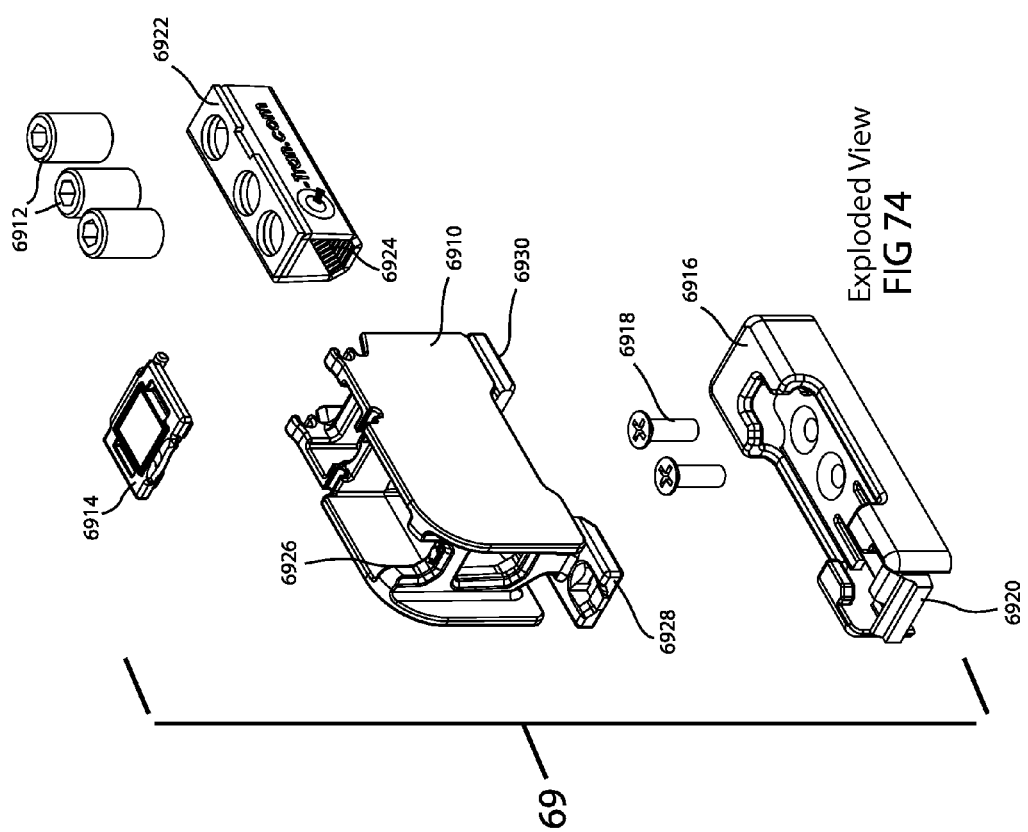

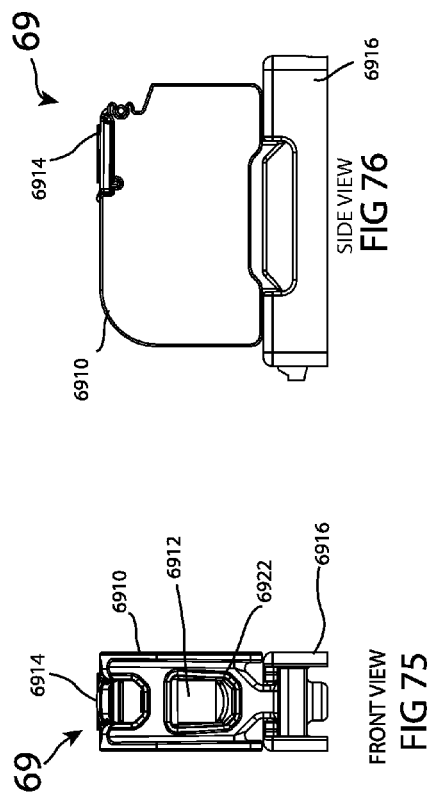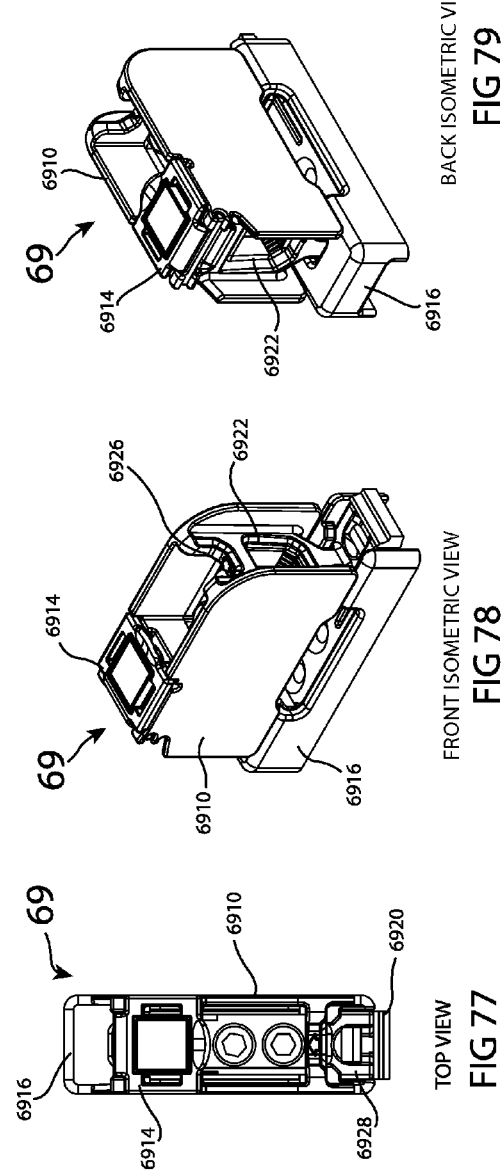

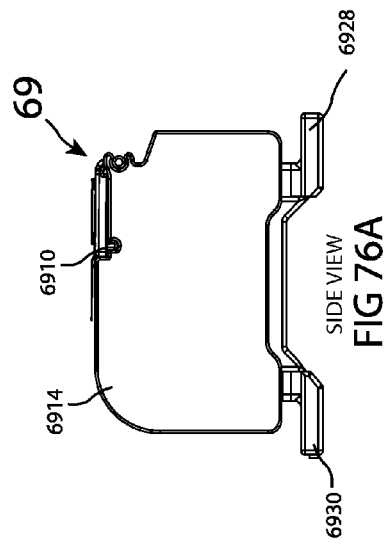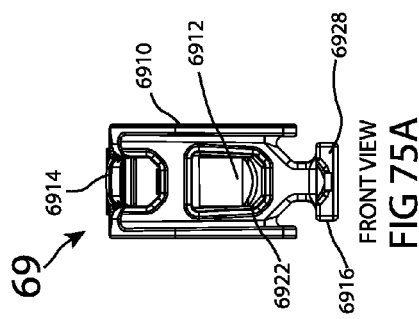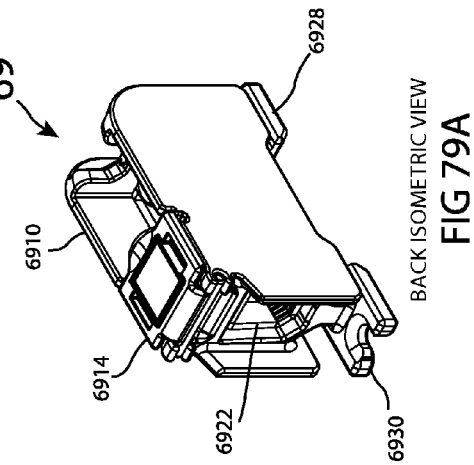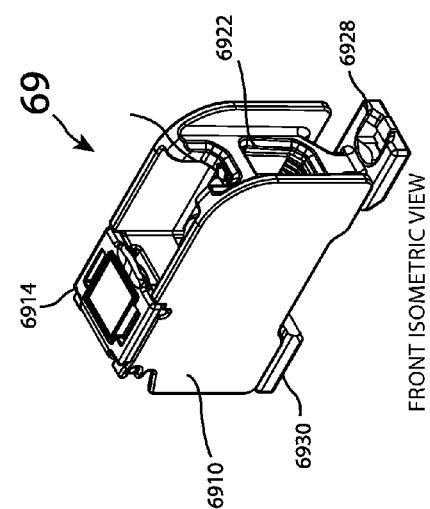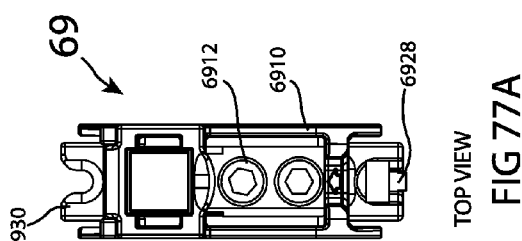

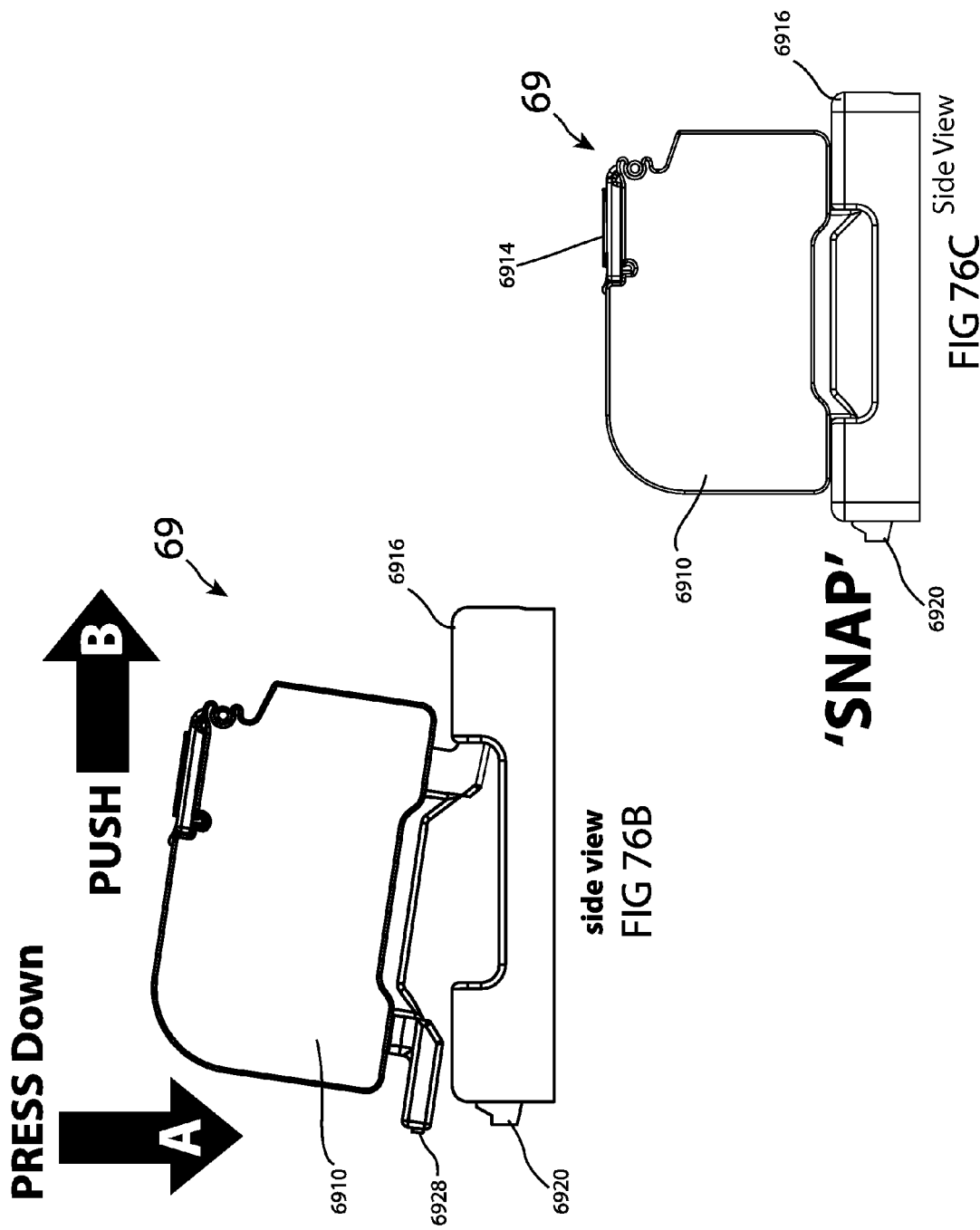

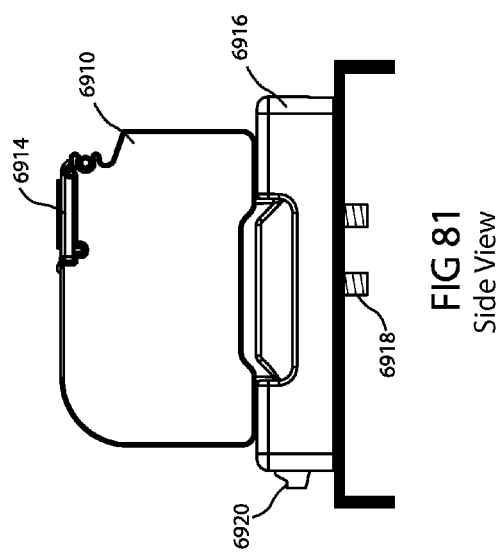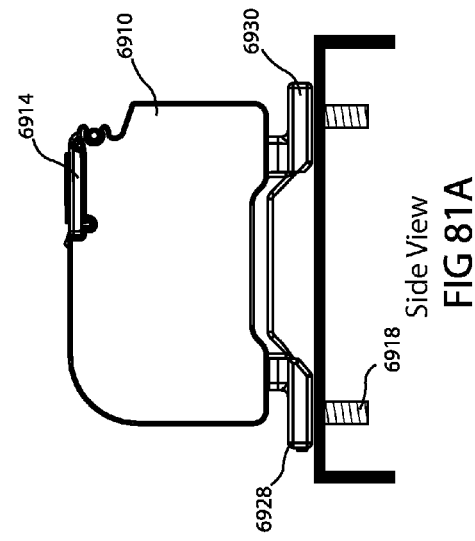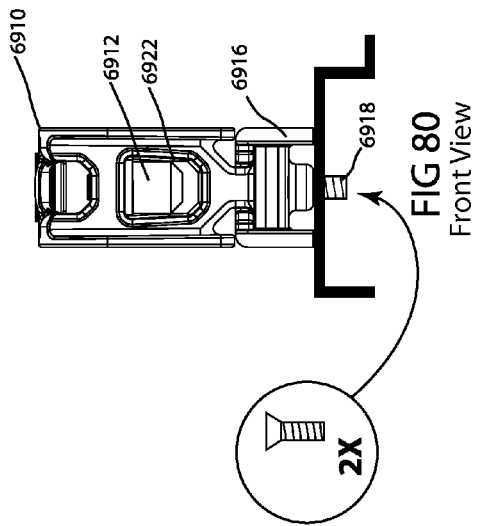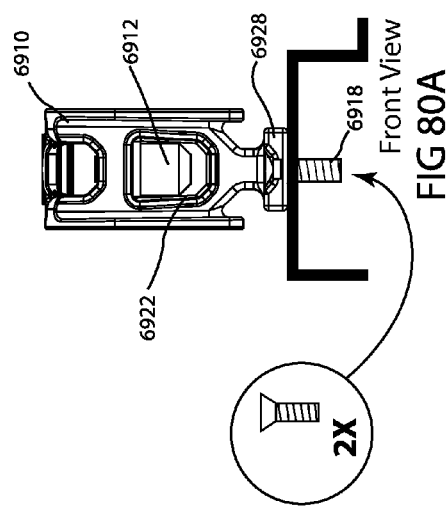

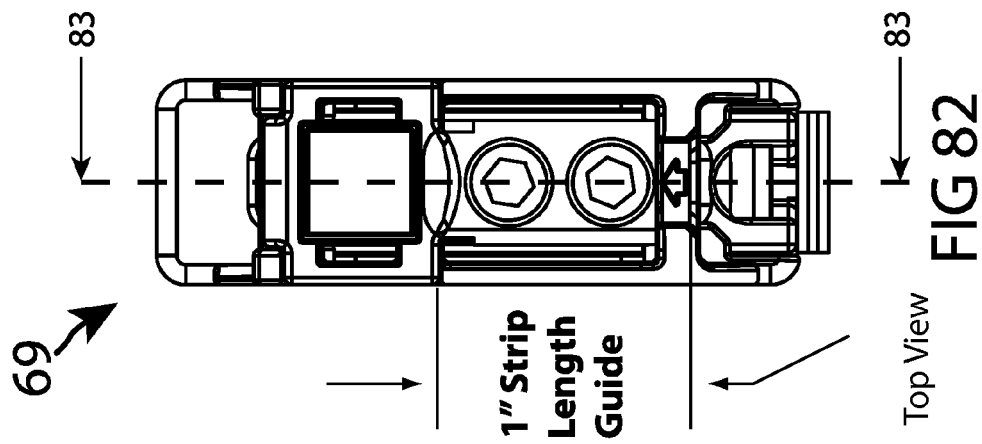
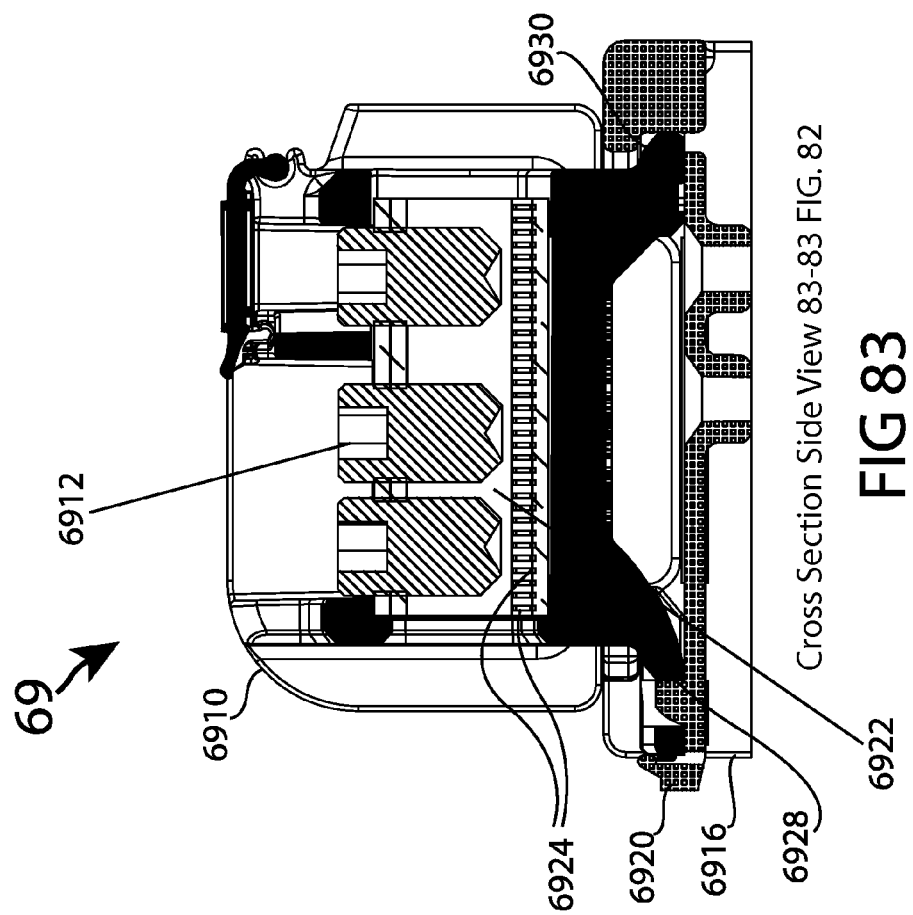

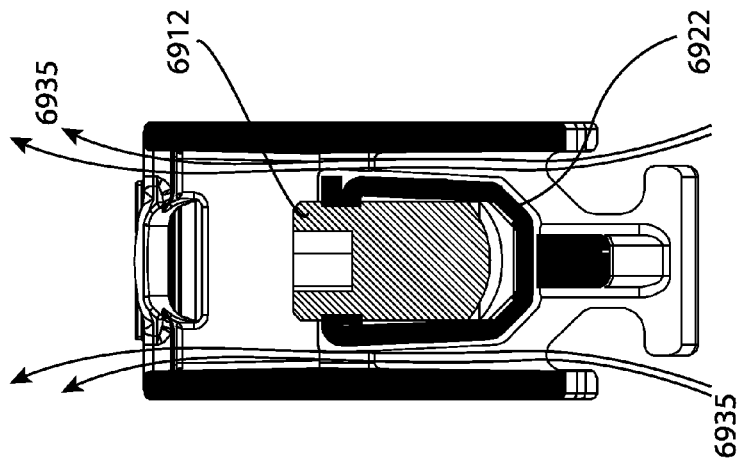
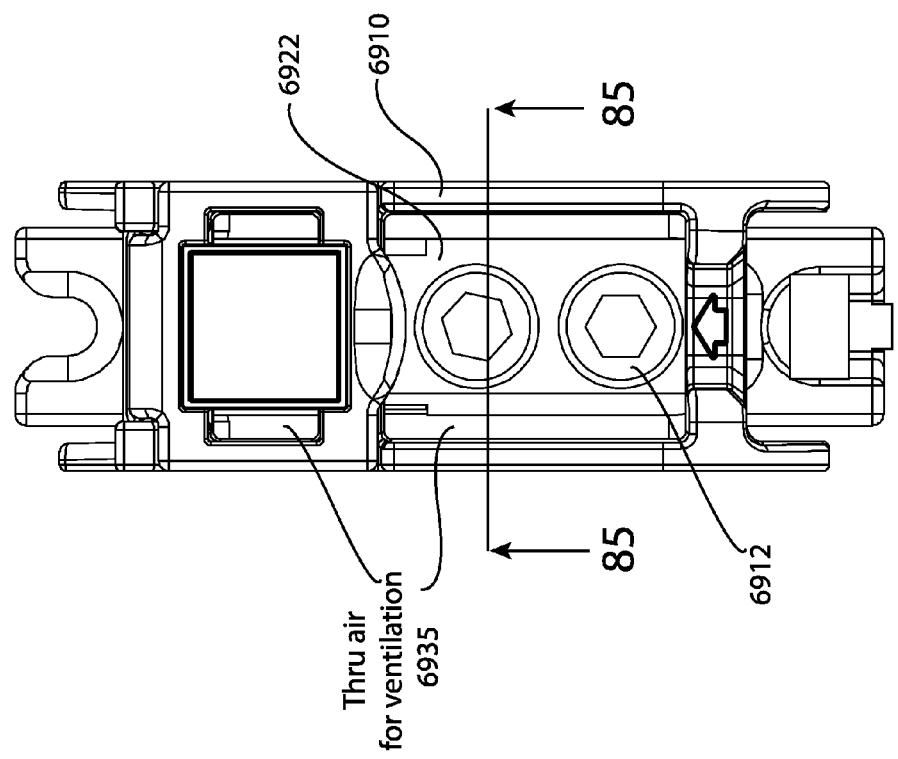

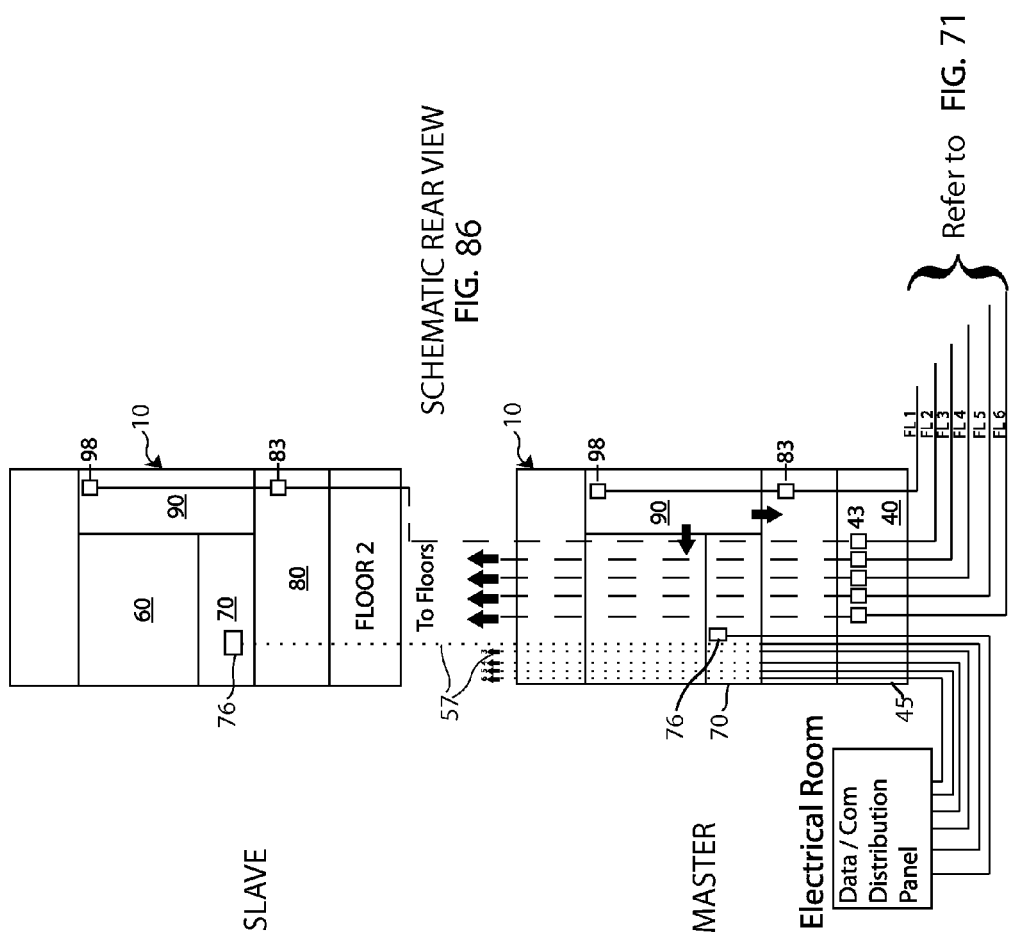

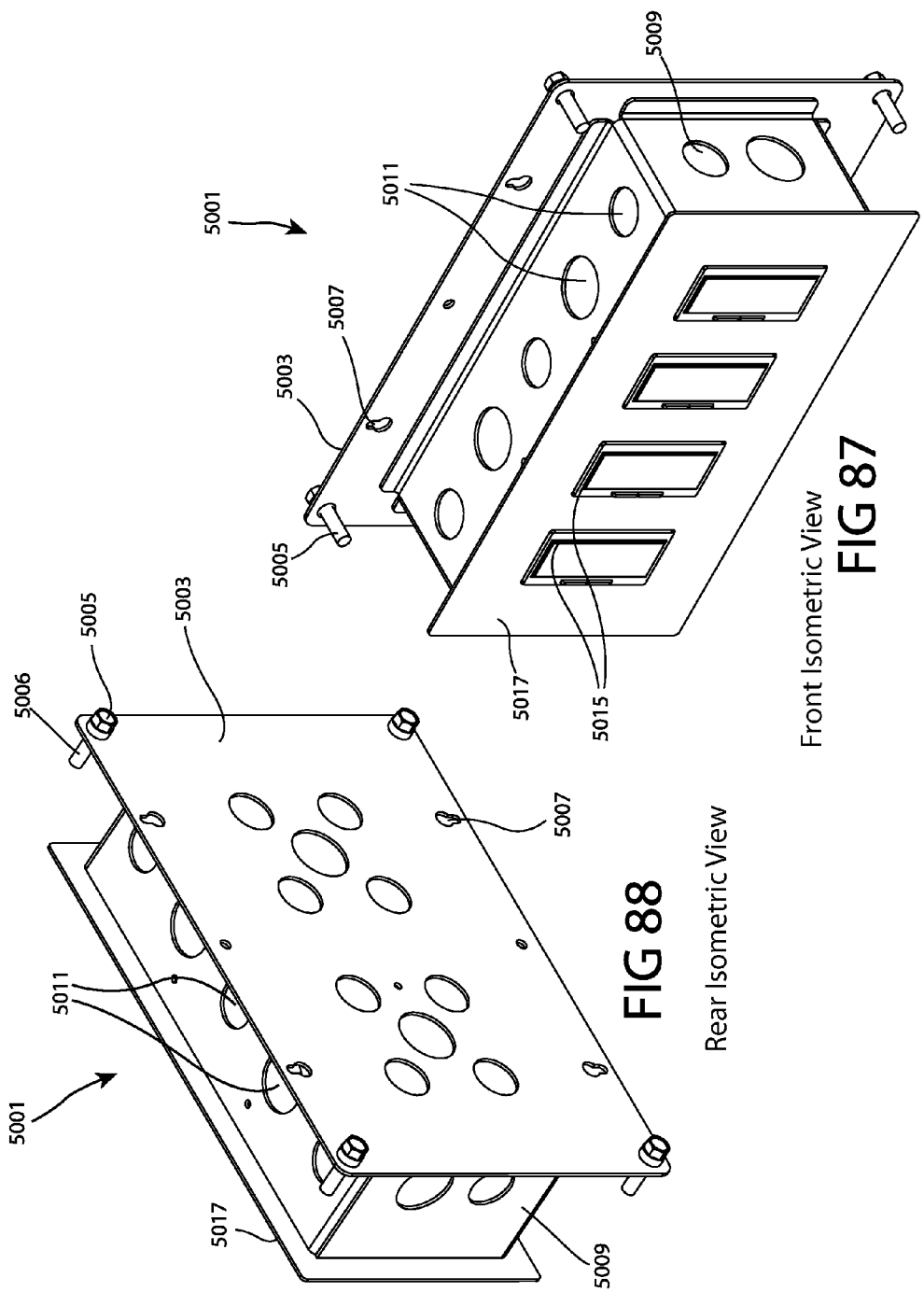

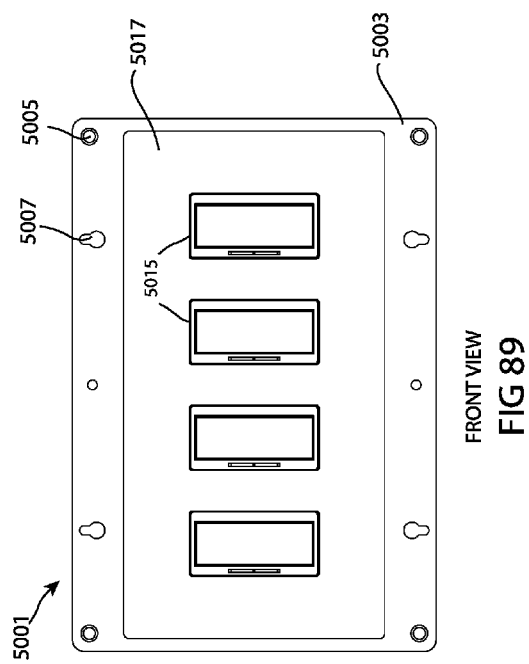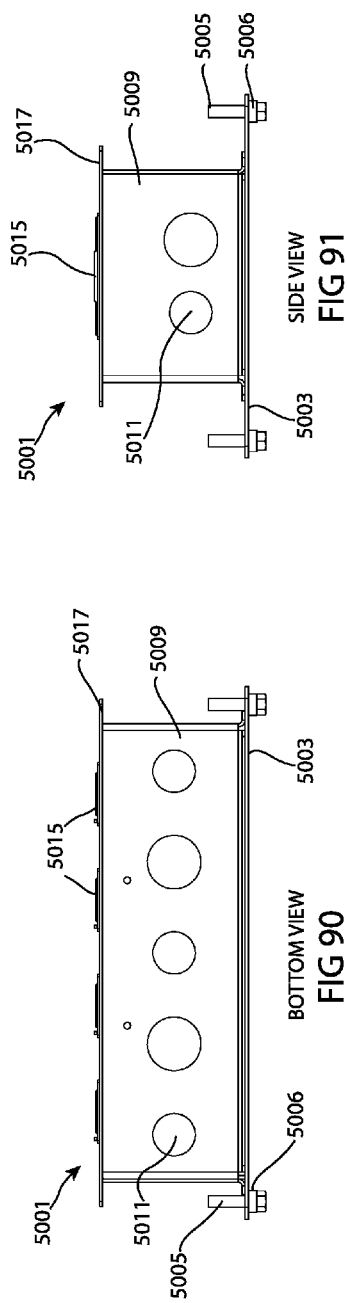

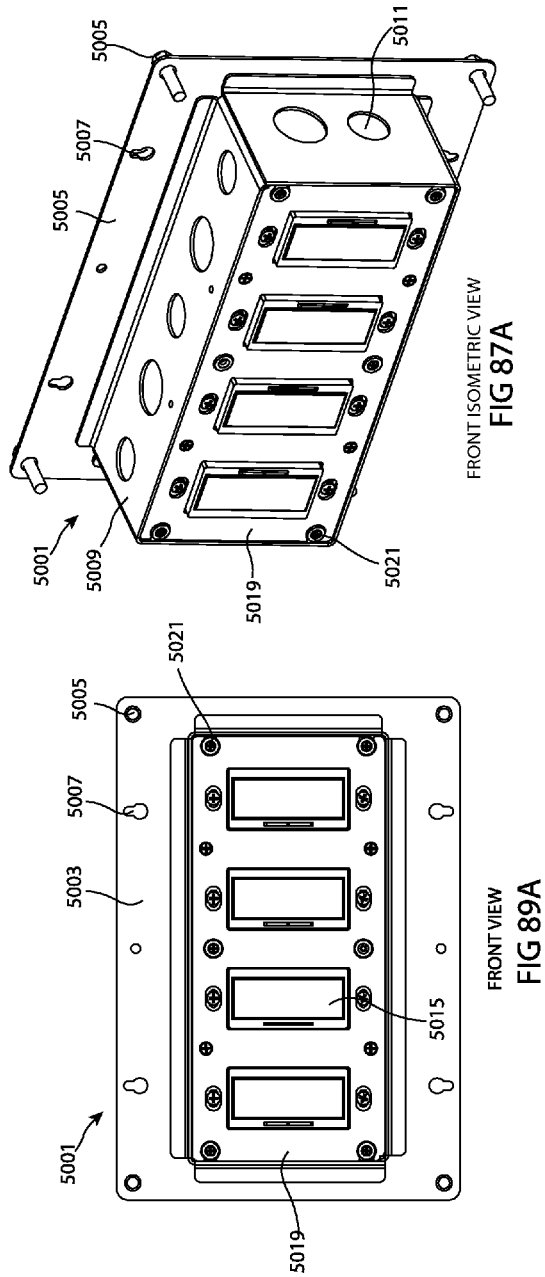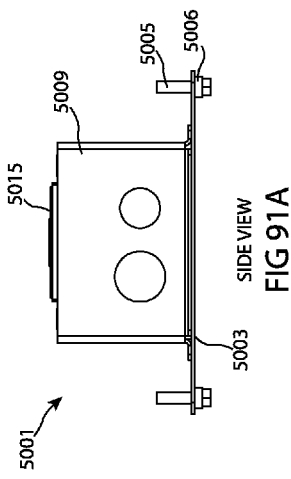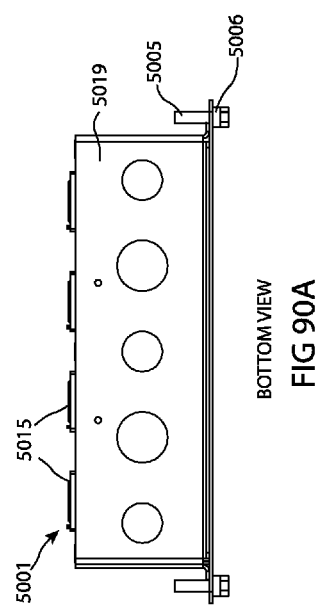

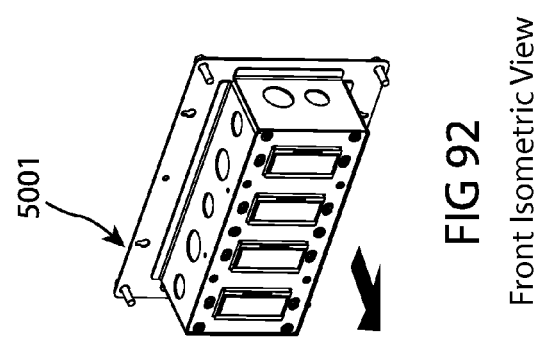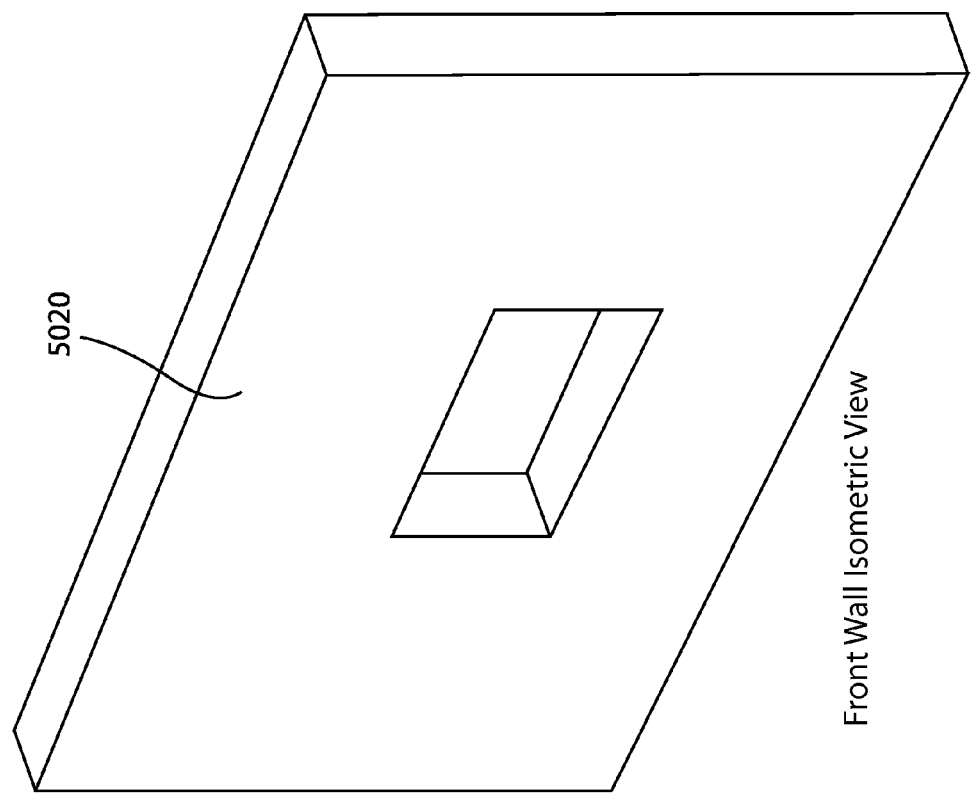
FIG 92
Front Isometric View
Front Wall Isometric View

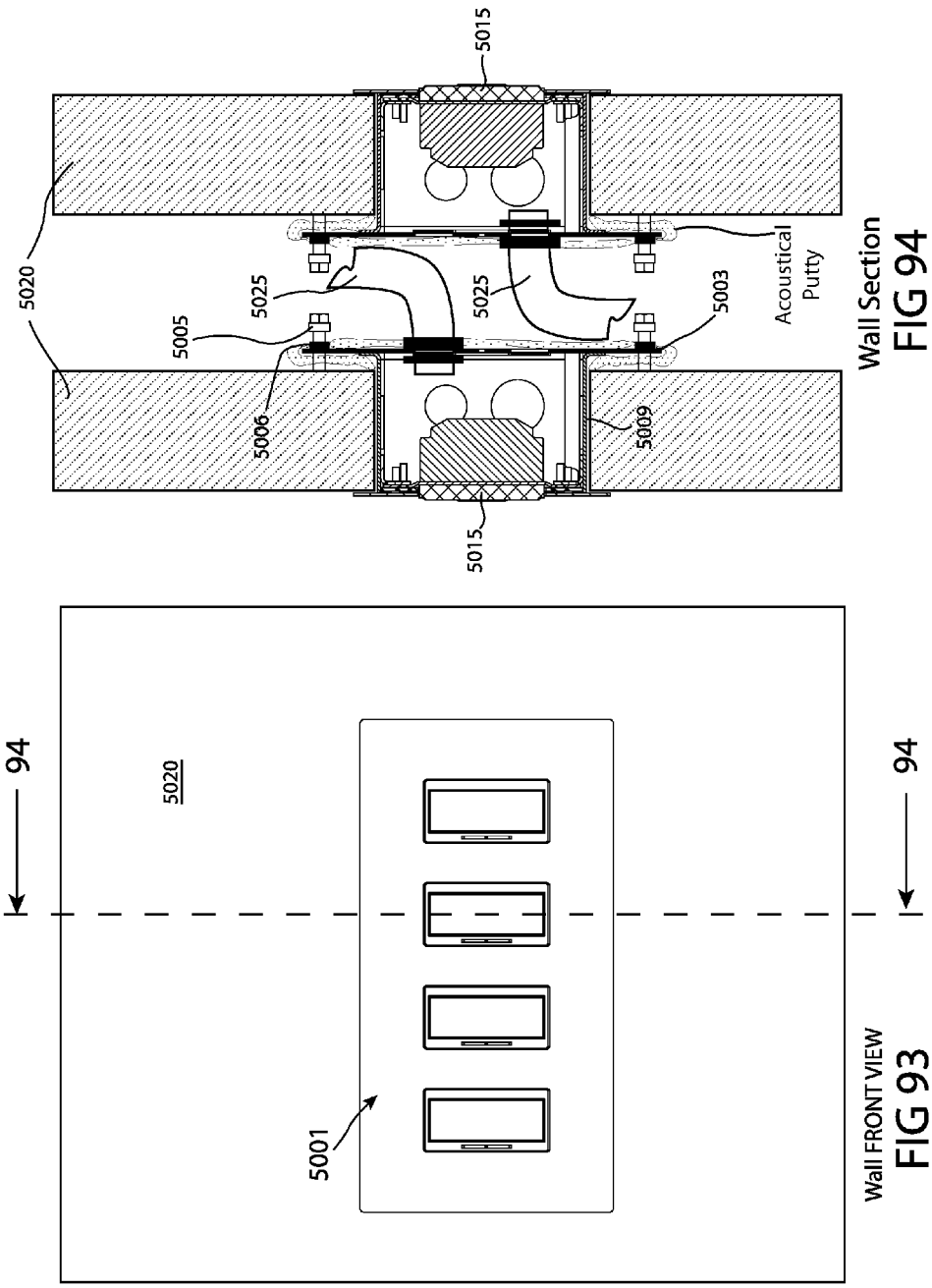

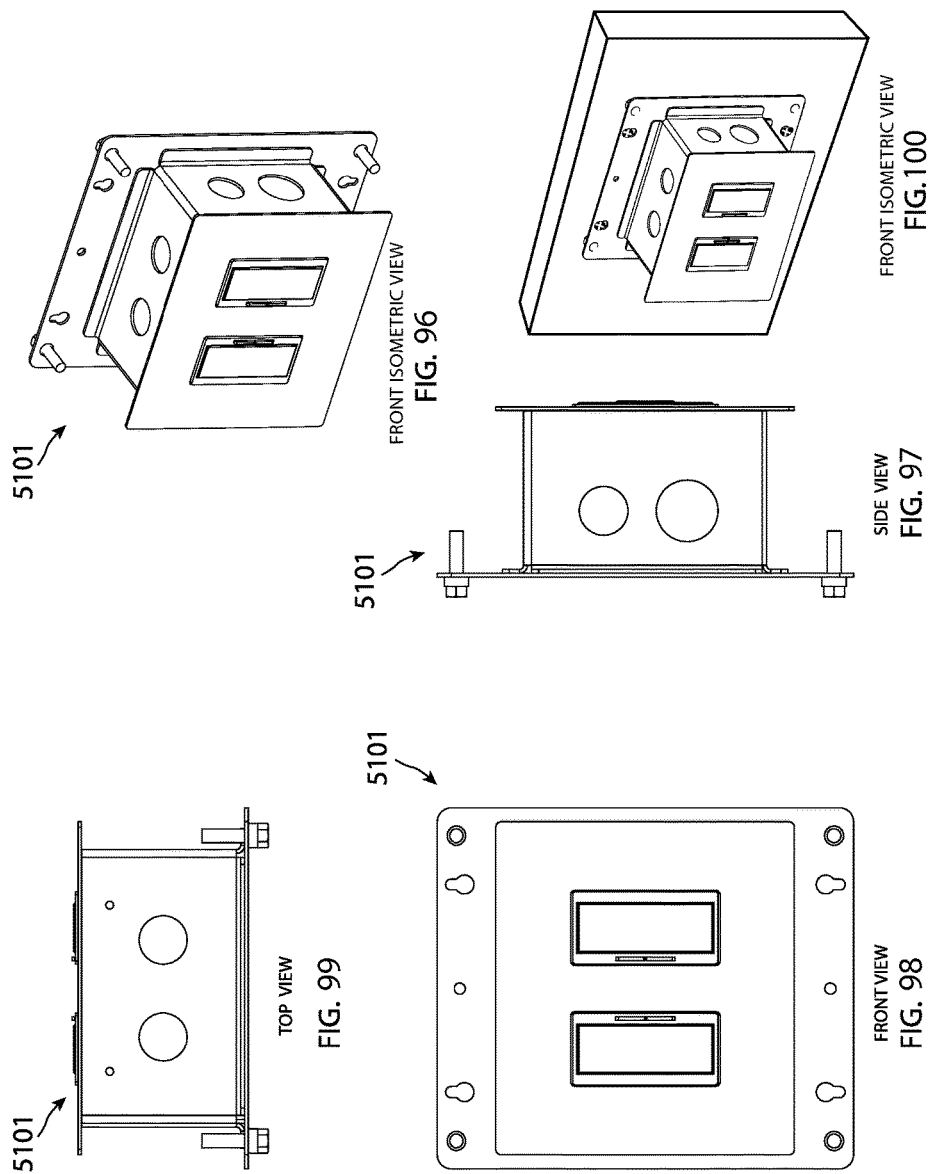

ISOMETRIC VIEW

SIDE VIEW

TOP VIEW

FRONT VIEW

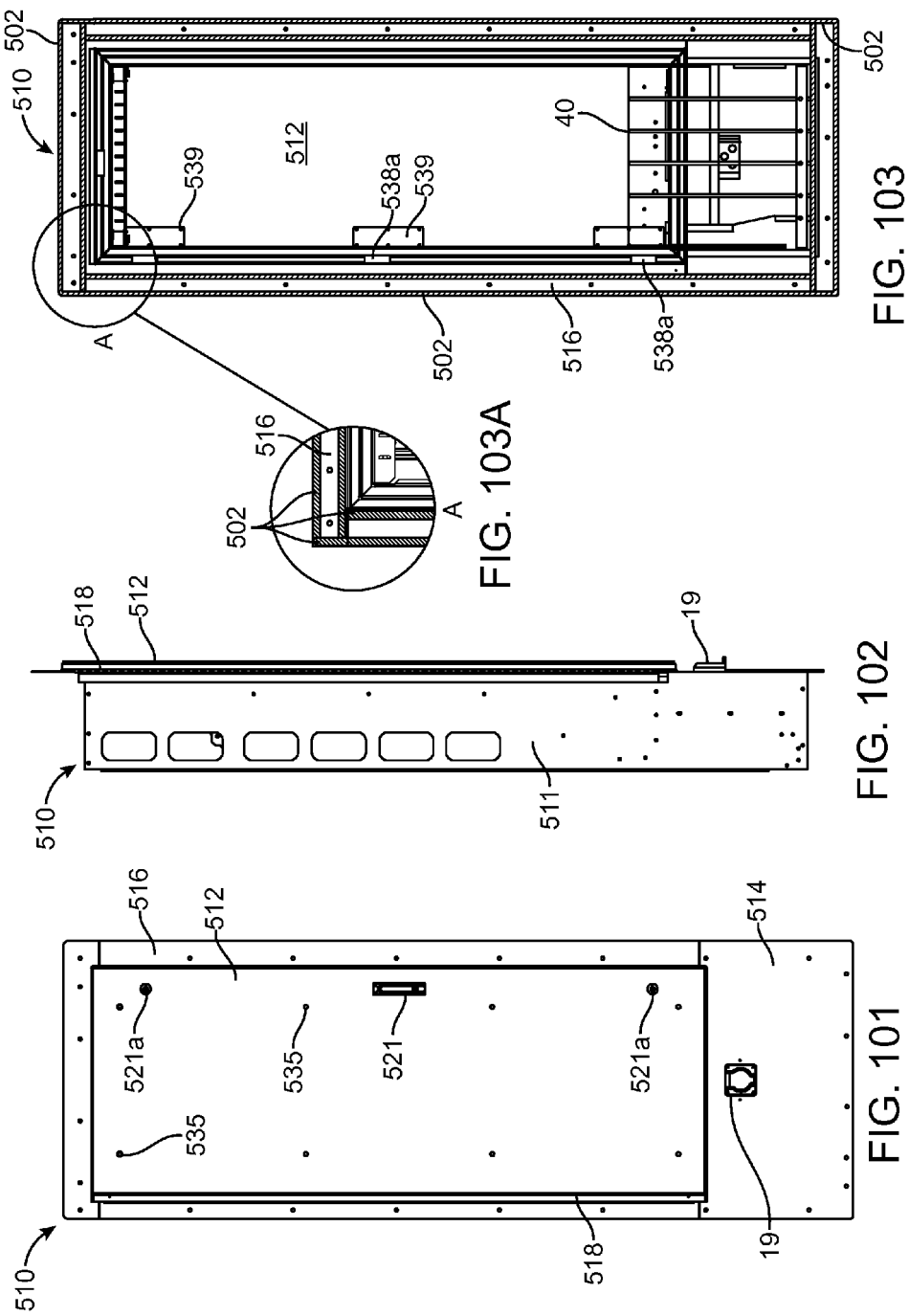

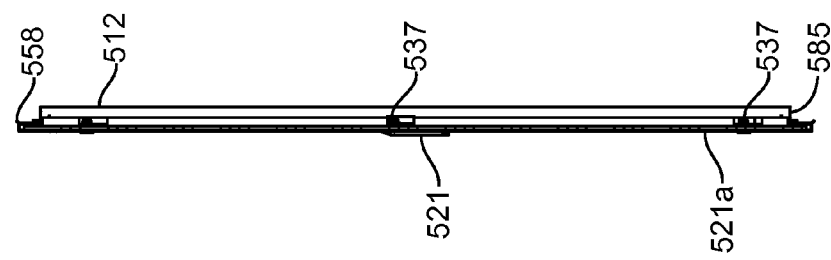
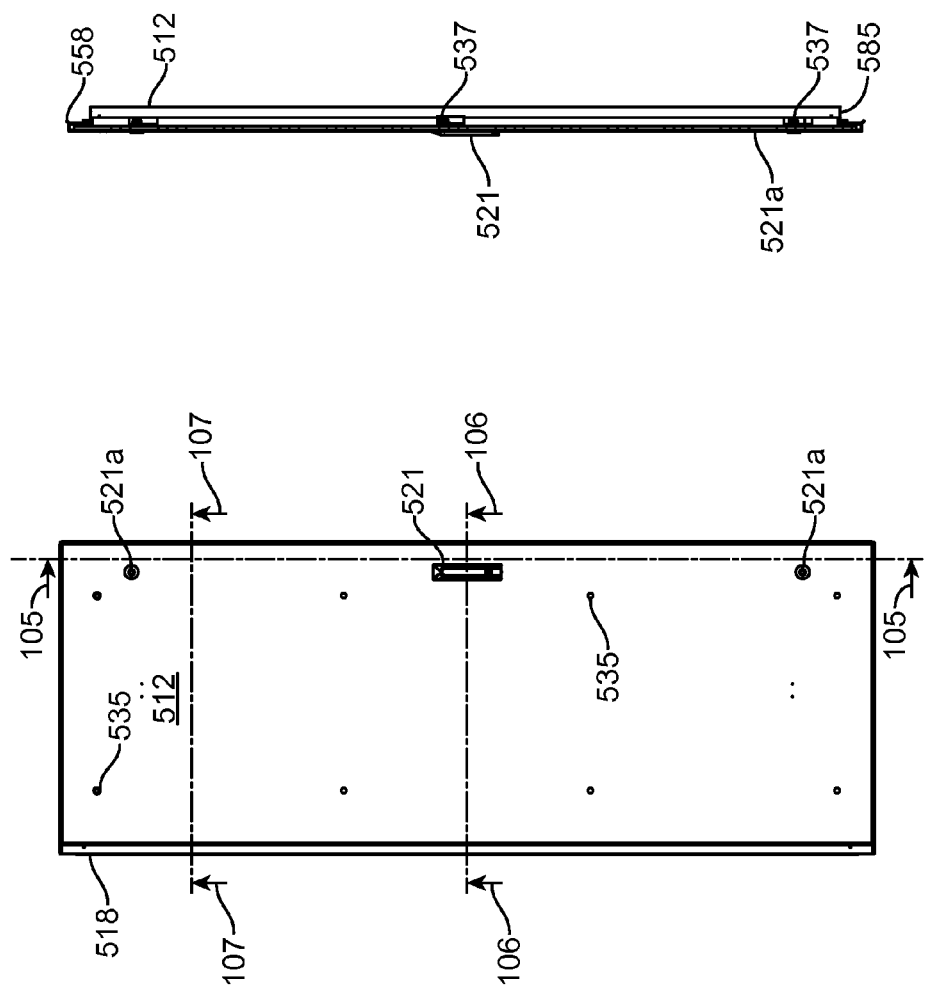

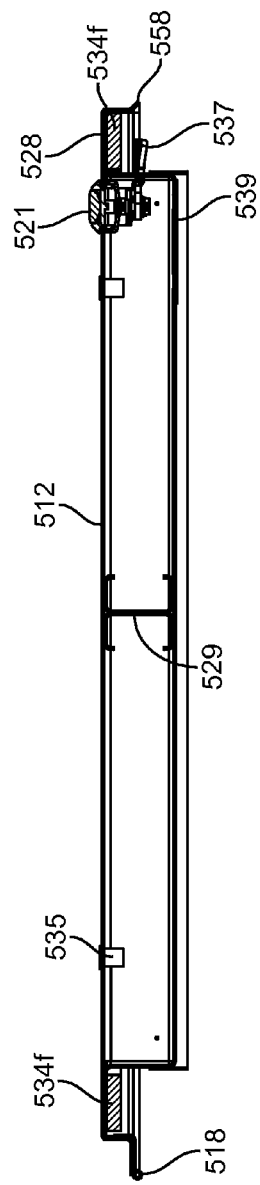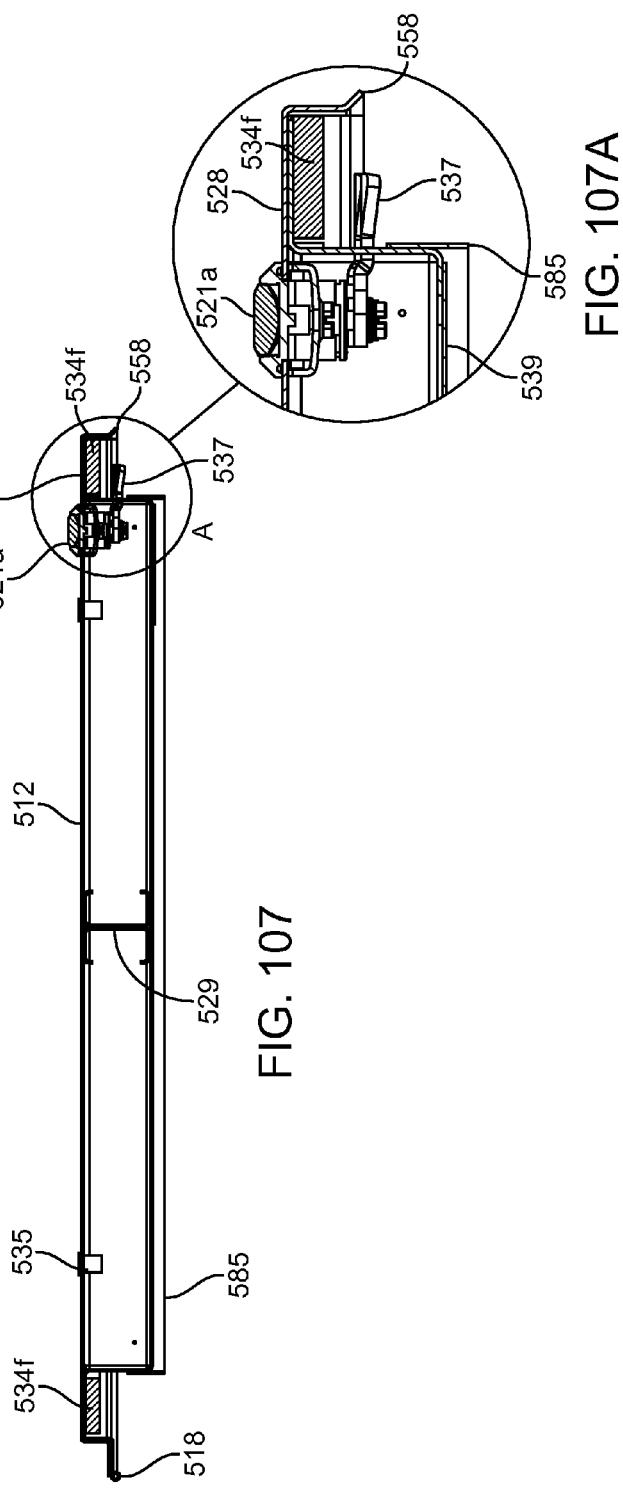

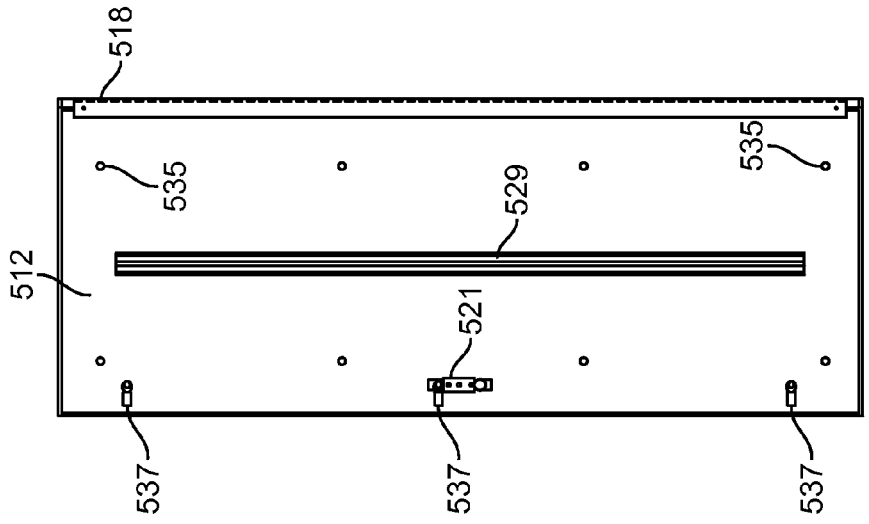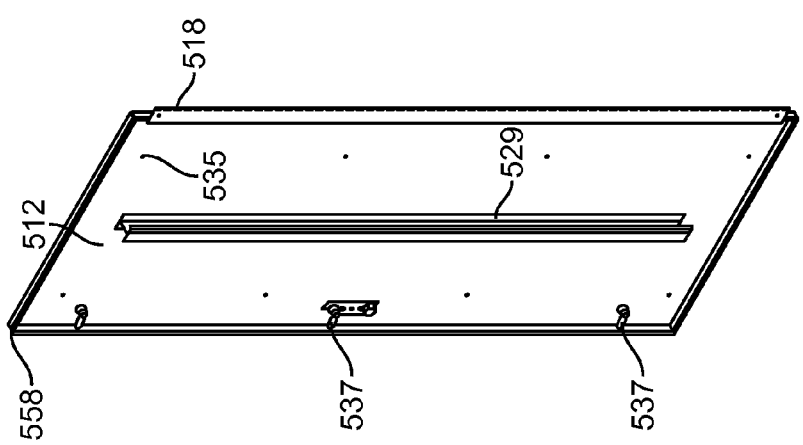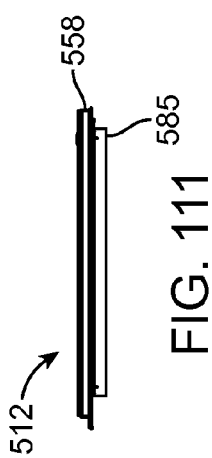

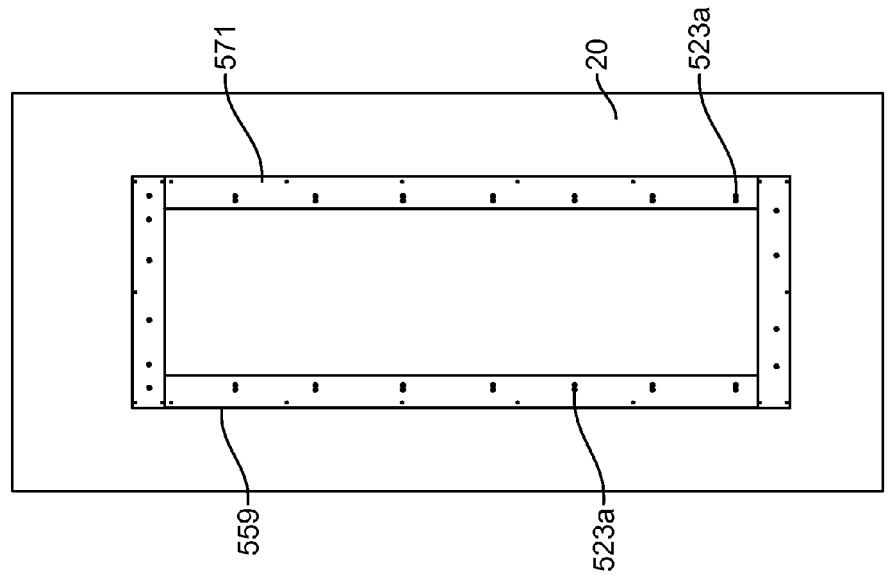
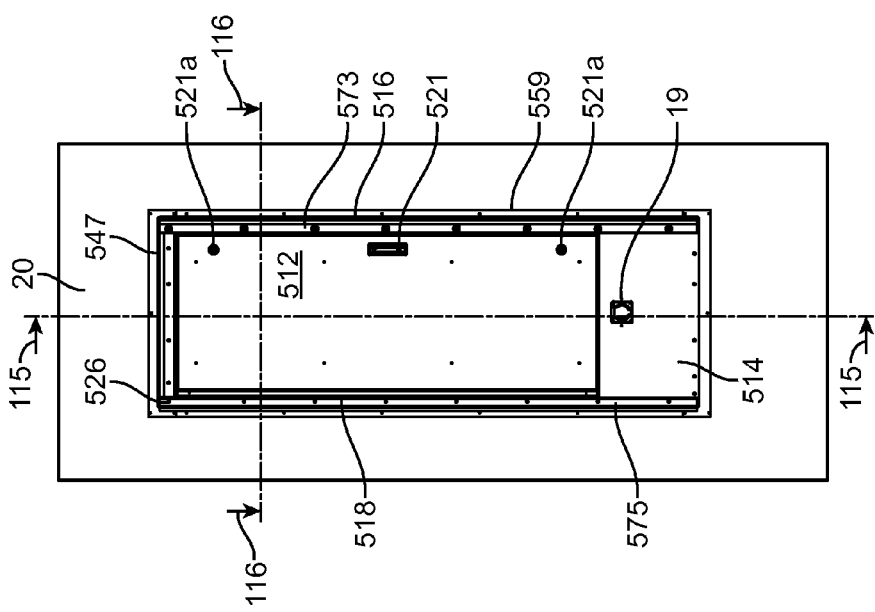

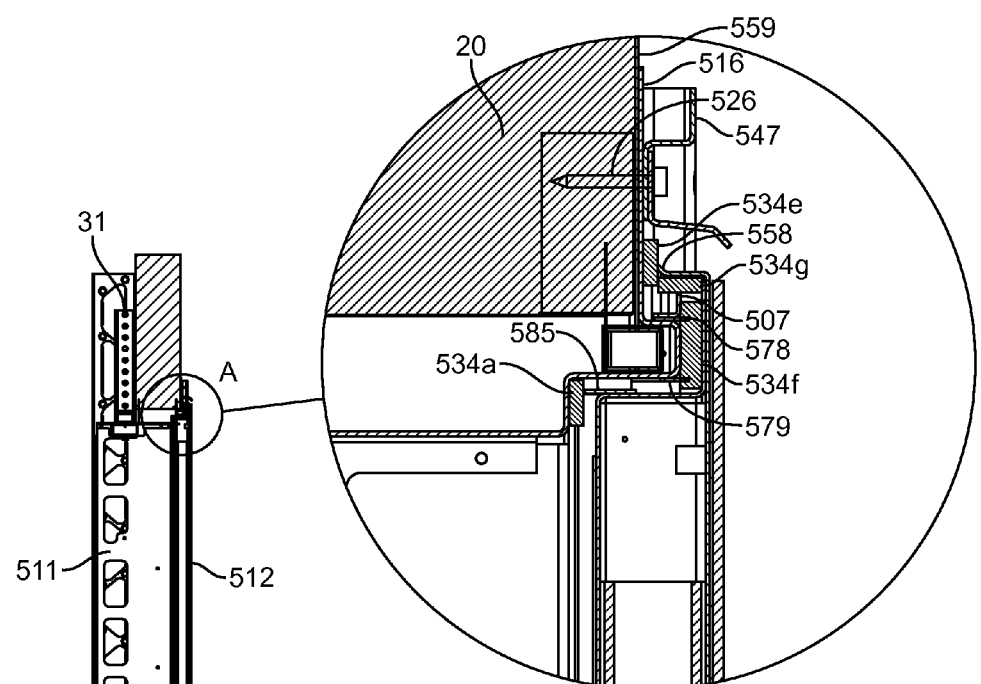
FIG. 115A
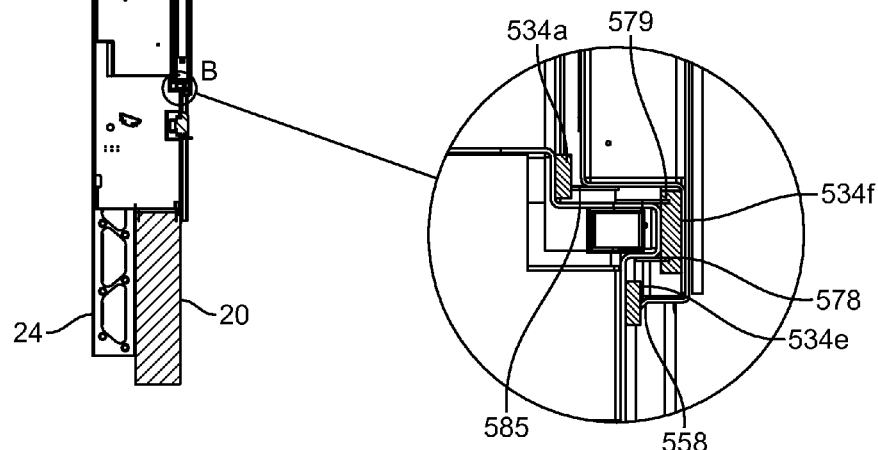
FIG. 115
FIG. 115B

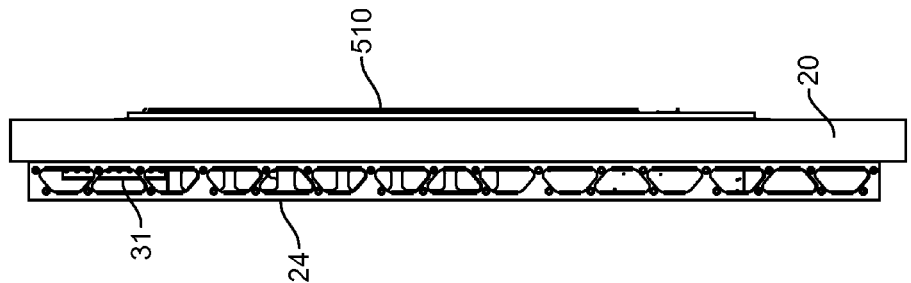
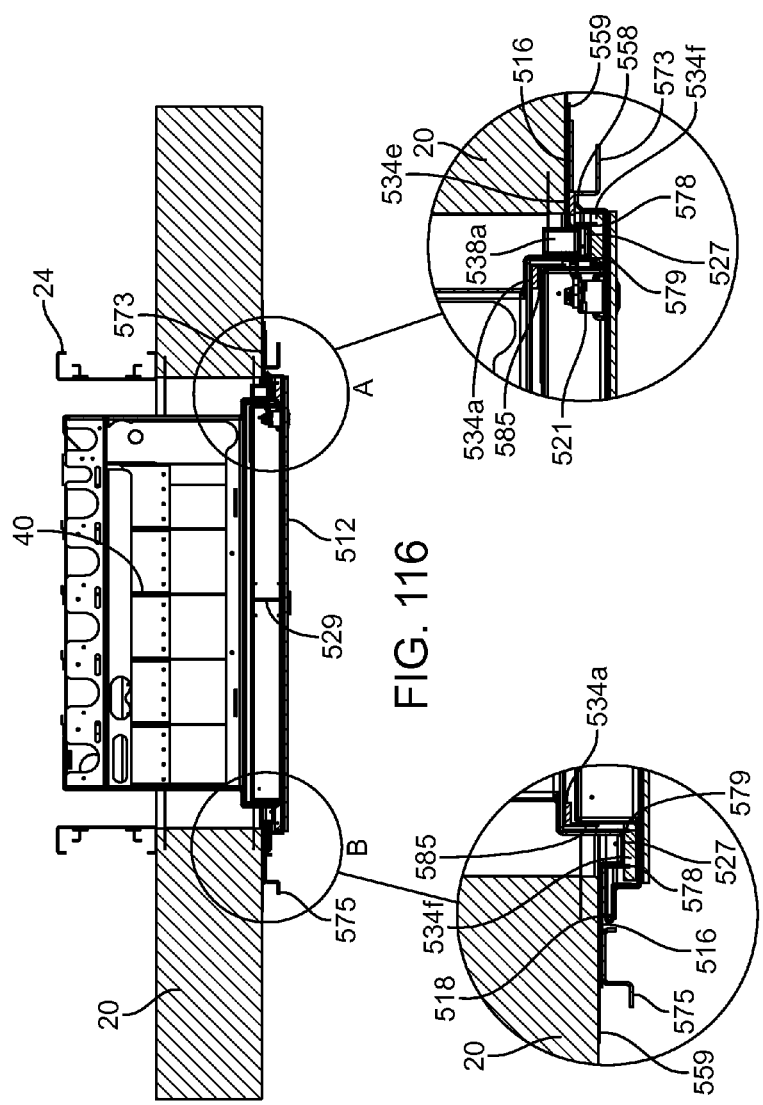

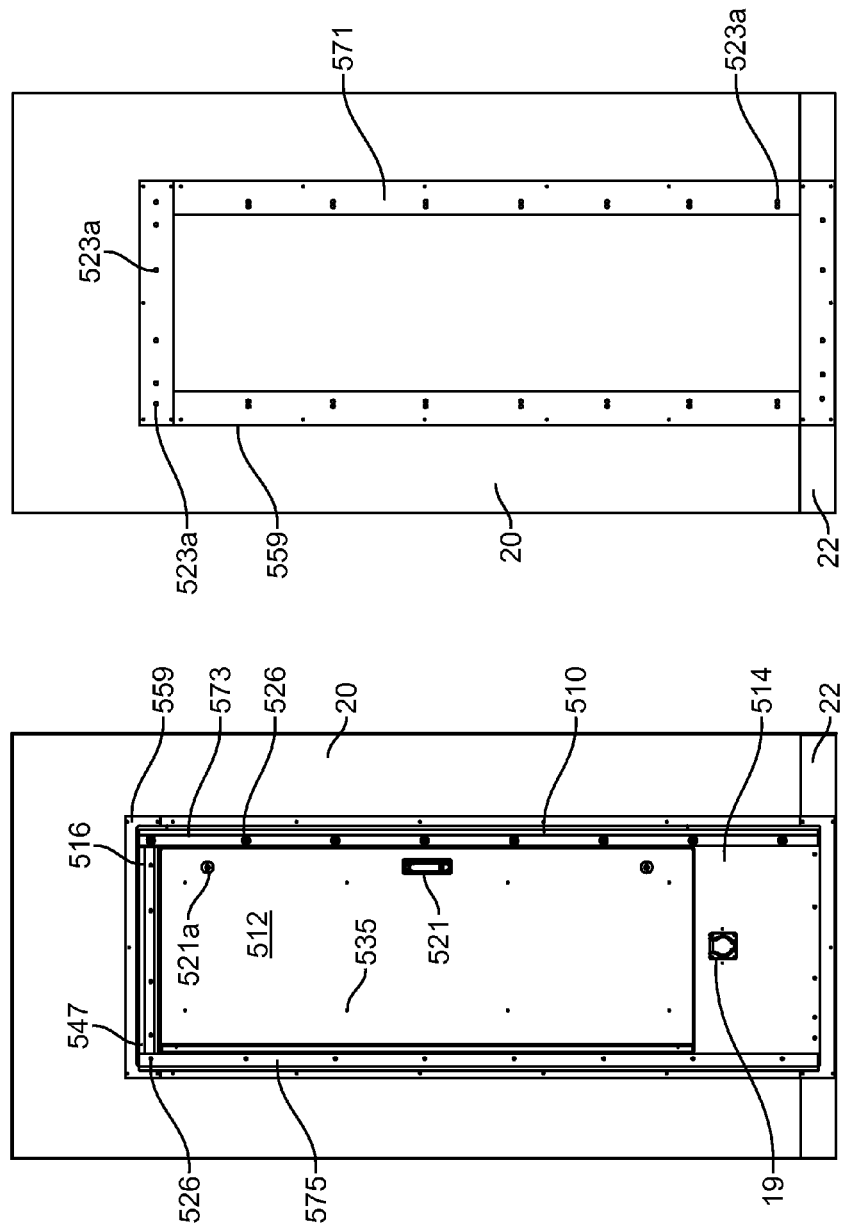

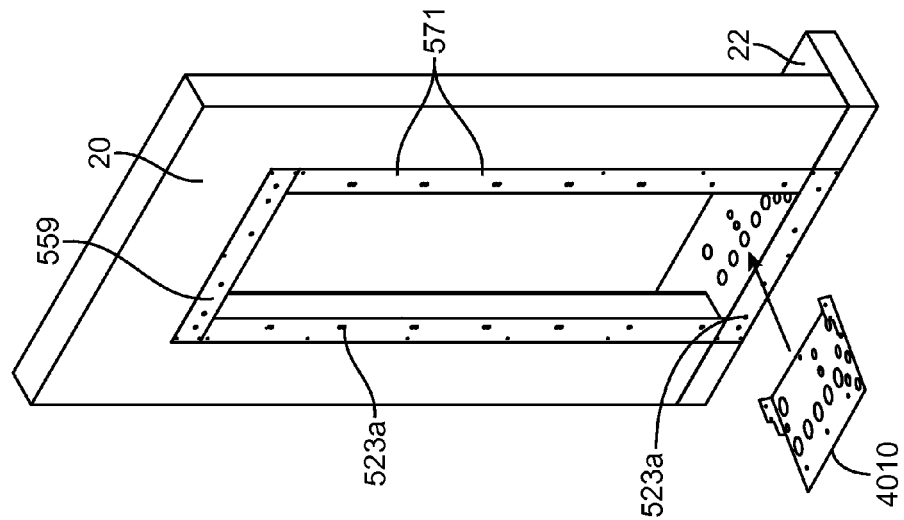
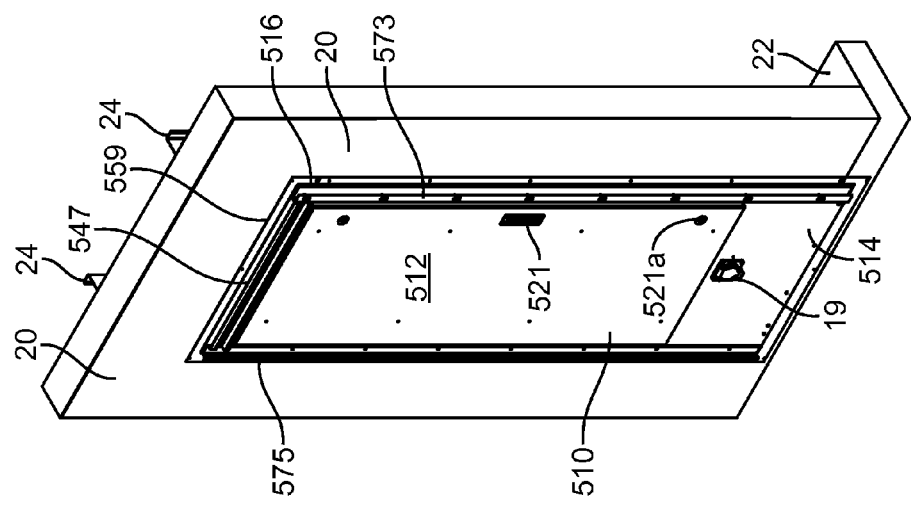
FIG. 119A
FIG. 119

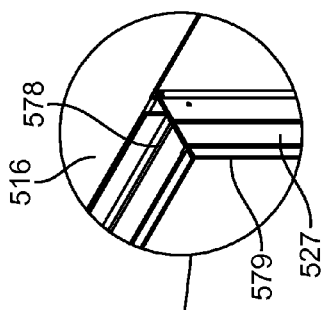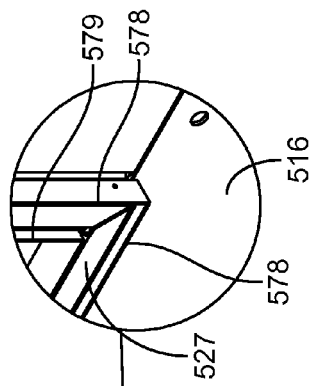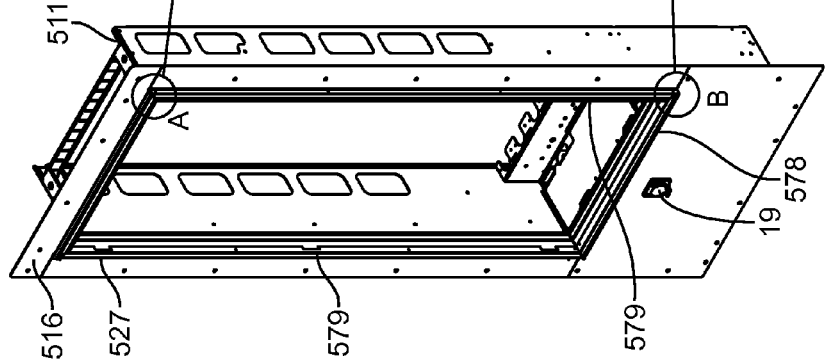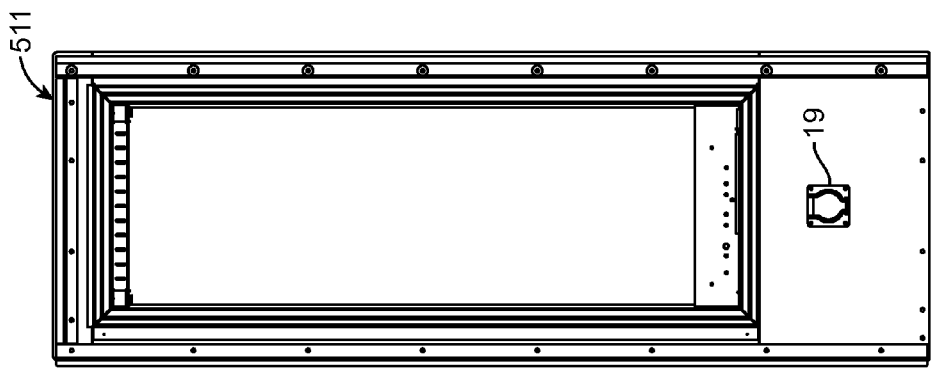

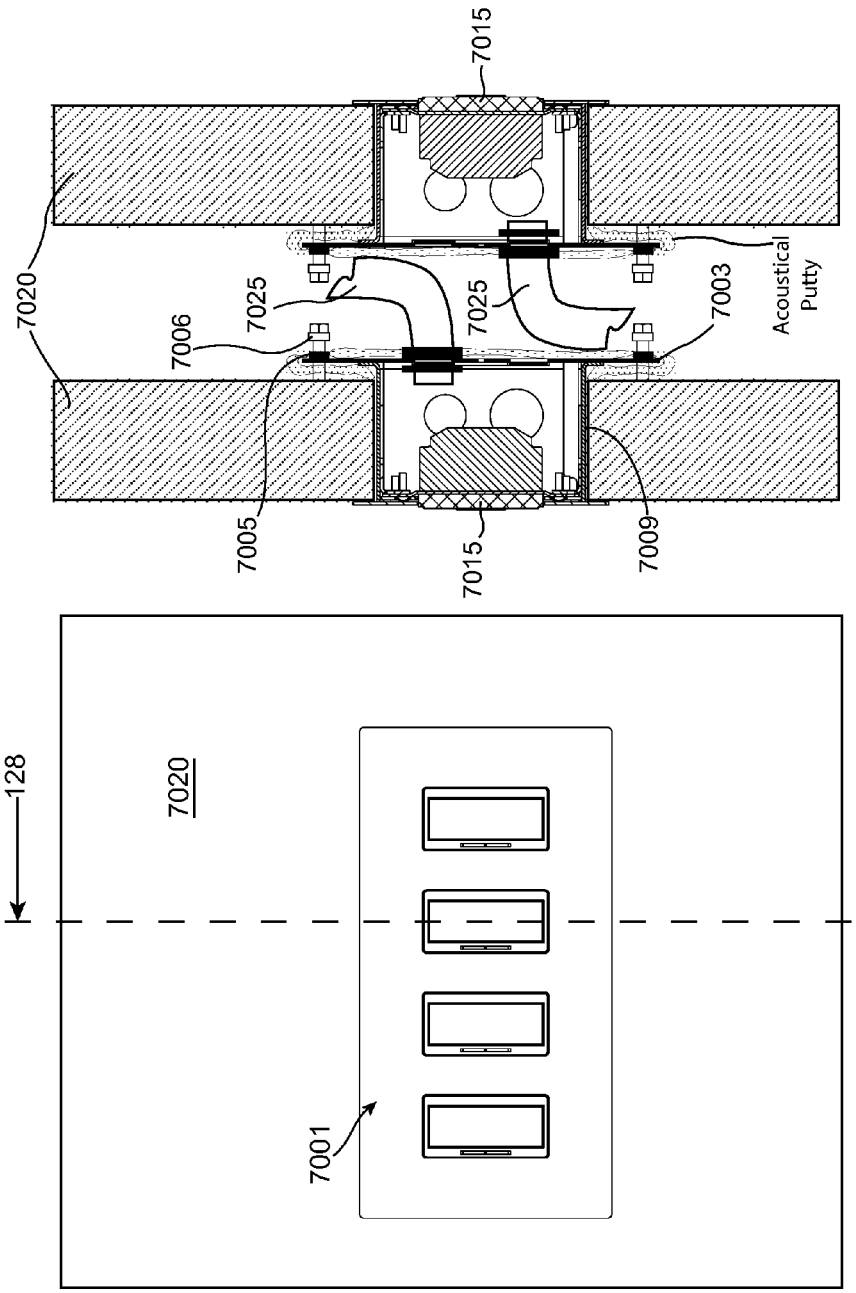

INTEGRATED ELECTRICAL ASSEMBLY, ENCLOSURE, MASTER TUB, MULTI-WIRE CONNECTOR, AND JUNCTION BOX

CROSS-REFERENCE TO RELATED APPLICATIONS

This application is based on U.S. Provisional Application No. 61/893,664 filed Oct. 21, 2013, U.S. Provisional Application No. 62/003,456 filed May 27, 2014 and U.S. Provisional Application No. 61/918,462 filed Dec. 19, 2013, all of which are hereby incorporated by reference in their entireties.

BACKGROUND

Conventional building techniques are well known, and generally require a significant involvement of skilled tradesman, laborers and technicians at specific locations and specific times in order to bring a particular building structure to completion that requires complex coordination. Every variety of building structure includes various components in order to allow for the building structure to be functional and/or habitable. These various components, include but are not limited to, electrical, mechanical, plumbing and waste water management, heating and cooling, informational, emergency and security systems. In conventional building techniques, many of these components must be installed and assembled at each building location, and final testing of the installed systems is costly and time consuming. Furthermore, many of these components may perform related functions, but require specialized personnel for the installation and assembly of such components. It may be desirable to provide a housing structure that is configured to reduce construction and/or installation time and/or cost associated with the components that may be contained in the housing structure, and to provide a housing structure that can be assembled and have the components contained therein interconnected and/or preconfigured in a controlled environment in order to provide for predictability in time and/or cost for installation of such components into the housing and/or building structure, and the ability to test components in a controlled environment prior to installation.

SUMMARY

Techniques are generally described that include apparatuses, methods and systems. An example integrated electrical assembly may include an enclosure that may include a frame, a mounting flange that may extend around a periphery of the frame, a swing door that may be coupled to the frame by a hinge, a first gasket that may be coupled to the frame, wherein the first gasket may engage a perimeter of the swing door when the swing door is in a closed position, and a second gasket that may be coupled to a perimeter of the mounting flange, and a master tub within the enclosure, wherein the master tub may include a plurality of coupled enclosures, wherein the enclosures may be configured to receive at least one electrical component.

An example junction box may include a body having four sides forming a perimeter, a back panel coupled to the body, wherein the back panel may include a plurality of openings, wherein the back panel may extend beyond the perimeter of the body, a plurality of threaded adjustment nuts, a plurality of adjustment posts coupled to the adjustment nuts, wherein the adjustment posts may pass through at least some of the plurality of openings, and an interior cover plate that may be configured to be reversibly coupled to the body.

An example multi-wire connector may include a terminal block that may include a plurality of set screws, wherein the plurality of set screws may be configured to be loosened and tightened relative to the terminal block, and a housing that may be configured to contain the terminal block, wherein the housing may include vents along an upper edge and along a lower edge, the vents may be configured to provide ventilation for the terminal block.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several examples in accordance with the disclosure and are, therefore, not to be considered limiting of its scope, the disclosure will be described with additional specificity and detail through use of the accompanying drawings, in which:

FIG. 1 is an exploded view of an example integrated electrical assembly;

FIG. 2 is an isometric view of the example integrated electrical assembly shown in FIG. 1 installed on an example wall;

FIG. 2A is an isometric view of the example integrated electrical assembly with an example door panel and wall panels installed on and around the integrated electrical assembly;

FIG. 3A is a front view of the example integrated electrical assembly with an example door panel and wall panels installed on and around the example integrated electrical assembly;

FIG. 4 is a cross-sectional view taken along line 4-4 in FIG. 3 of the example integrated electrical assembly installed on the example wall;

FIG. 4A expanded view of the Section from FIG. 4;

FIG. 5A is a right side view of the example integrated electrical assembly with a door panel and wall panels installed on and around the integrated electrical assembly;

FIG. 6A is a left side view of the example integrated electrical assembly with a door panel and wall panels installed on and around the integrated electrical assembly;

FIG. 6B is an expanded view of Section B from FIG. 6A;

FIG. 6C is an expanded view of Section C from FIG. 6A;

FIG. 9 is a front view of the example integrated electrical assembly installed on the example wall with a door of the integrated electrical assembly in an open position;

FIG. 10 is an isometric view of the example integrated electrical assembly installed on the example wall with the door of the integrated electrical assembly in an open position;

FIG. 11 is a right side view of the example integrated electrical assembly installed on the example wall with the door of the integrated electrical assembly in an open position;

FIG. 13 is a rear view of the example integrated electrical assembly installed on the example wall;

FIG. 13A is an expanded view of Section A from FIG. 13 of an example component of the example integrated electrical assembly installed on the example wall;

FIG. 13B is an exploded view of an example feed enclosure and template plate that may be used with the example integrated electrical assembly;

FIG. 14A is a reverse expanded view of Section A from FIG. 14 of an example component of the example integrated electrical assembly installed on the example wall;

FIG. 14B is an expanded view of Section B from FIG. 14 of an example component of the example integrated electrical assembly installed on the example wall;

FIG. 14C is a rear view of the example integrated electrical assembly installed on the example wall;

FIG. 14D is a reverse expanded view of FIG. 14C;

FIG. 14E is an isometric top view of the example integrated electrical assembly installed on the example wall;

FIG. 15 is an isometric front view of the example integrated electrical assembly installed on an example wall;

FIG. 16 is an isometric back view of the example integrated electrical assembly installed on the example wall;

FIG. 17 is a back view of the example integrated electrical assembly installed on the example wall;

FIG. 18 is a left side view of the example integrated electrical assembly installed on the example wall;

FIG. 19 is a front view of the example integrated electrical assembly installed on the example wall;

FIG. 20 is a front view of the example integrated electrical assembly configured for installation within a wall;

FIG. 21 is a left side view of the example integrated electrical assembly configured for installation within a wall;

FIG. 22 is a back view of the example integrated electrical assembly configured for installation within a wall;

FIG. 27 is a bottom view of the example master tub that may be used with an integrated electrical assembly;

FIG. 28 is a front view of the example master tub that may be used with an integrated electrical assembly;

FIG. 29 is a top view of the example master tub that may be used with an integrated electrical assembly;

FIG. 32 is a front view of the example master tub with example components installed therein;

FIG. 33 is a bottom view of the example master tub with example components installed therein;

FIG. 34 is a top plan view of the example master tub with example components installed therein;

FIG. 36 is a front view of an example low voltage power supply unit that may be used with an integrated electrical assembly;

FIG. 37 is a side view of the example low voltage power supply unit that may be used with an integrated electrical assembly;

FIG. 38 is a bottom plan view of the example low voltage power supply unit that may be used with an integrated electrical assembly;

FIG. 39 is a front isometric view of the example low voltage power supply unit that may be used with an integrated electrical assembly;

FIG. 40 is a top plan view of the example low voltage power supply unit that may be used with an integrated electrical assembly;

FIG. 41 is an exploded isometric view of the example low voltage power supply unit that may be used with an integrated electrical assembly;

FIG. 42 is a front view of the example low voltage power supply unit that may be used with an integrated electrical assembly with a front panel removed;

FIG. 44A is a top plan view of the example data-com component that may be used with an integrated electrical assembly;

FIG. 44B is a front view of the example data-com component that may be used with an integrated electrical assembly;

FIG. 44C is a bottom plan view of the example data-com component that may be used with an integrated electrical assembly;

FIG. 44D is a side view of the example data-com component that may be used with an integrated electrical assembly;

FIG. 48 is a front isometric view of an example alternative power unit that may be used with an integrated electrical assembly;

FIG. 49 is a bottom plan view of the example alternative power unit that may be used with an integrated electrical assembly;

FIG. 50A is a front view of the example alternative power unit that may be used with an integrated electrical assembly;

FIG. 51 is a side view of the example alternative power unit that may be used with an integrated electrical assembly;

FIG. 52 is a top isometric view of an example load center that may be used with an integrated electrical assembly;

FIG. 53 is a partially exploded front isometric view of the example load center that may be used with an integrated electrical assembly;

FIG. 55 is a cross-sectional view taken along line 55-55 in FIG. 52 of the example load center that may be used with an integrated electrical assembly;

FIG. 56 is a front view of the example load center that may be used with an integrated electrical assembly with a door in an open position;

FIG. 57 a front view of another example integrated electrical assembly;

FIG. 60 is a bottom plan view of the other example integrated electrical assembly;

FIG. 61 is a front view of the other example integrated electrical assembly with a front panel removed;

FIG. 62 is a top plan view of the other example integrated electrical assembly;

FIG. 63 is a front view of another example low voltage power supply unit that may be used with an integrated electrical assembly or may be provided as a standalone unit;

FIG. 64 is a front view of the other example low voltage power supply unit that may be used with an integrated electrical assembly with a front panel removed;

FIG. 65 is a side view of the other example low voltage power supply unit that may be used with an integrated electrical assembly or may be provided as a standalone unit;

FIG. 66 is a front isometric view of the other example low voltage power supply unit that may be used with an integrated electrical assembly or may be provided as a standalone unit;

FIG. 67 is a back isometric view of the other example low voltage power supply unit that may be used with an integrated electrical assembly or may be provided as a standalone unit;

FIG. 68 is a front view of yet another example low voltage power supply unit that may be used with an integrated electrical assembly with a front panel removed;

FIG. 69 is a side view of the other example low voltage power supply unit that may be used with an integrated electrical assembly or may be provided as a standalone unit;

FIG. 70 is a front isometric view of the other example low voltage power supply unit that may be used with an integrated electrical assembly or may be provided as a standalone unit;

FIG. 71 is a generalized schematic view of example electrical connections between an electrical service line and one or more integrated electrical assemblies;

FIG. 72 is a generalized schematic view of example electrical connections between example components of an integrated electrical assembly;

FIG. 73 is an isometric view of an example multi-wire connector that may be used with the integrated electrical assembly;

FIG. 74 is an exploded view of the example multi-wire connector that may be used with the integrated electrical assembly;

FIG. 75 is a front view of the example multi-wire connector that may be used with the integrated electrical assembly;

FIG. 75A is a front view of the example multi-wire connector without a base mount that may be used with the integrated electrical assembly;

FIG. 76 is a side view of the example multi-wire connector that may be used with the integrated electrical assembly;

FIG. 76A is a side view of the example multi-wire connector without a base mount that may be used with the integrated electrical assembly;

FIGS. 76B and 76C are a side view of the example multi-wire connector showing how the multi-wire connector may be installed on the base mount;

FIG. 77 is a top plan view of the example multi-wire connector that may be used with the integrated electrical assembly;

FIG. 77A is a top plan view of the example multi-wire connector without a base mount that may be used with the integrated electrical assembly;

FIG. 78 is an isometric front view of the example multi-wire connector that may be used with the integrated electrical assembly;

FIG. 78A is an isometric front view of the example multi-wire connector without a base mount that may be used with the integrated electrical assembly;

FIG. 79 is an isometric back view of the example multi-wire connector without a base mount that may be used with the integrated electrical assembly;

FIG. 79A is an isometric back view of the example multi-wire connector without a base mount that may be used with the integrated electrical assembly;

FIG. 80 is a front view of the example multi-wire connector that may be used with the integrated electrical assembly mounted to an example surface;

FIG. 80A is a front view of the example multi-wire connector without a base mount that may be used with the integrated electrical assembly mounted to an example surface;

FIG. 81 is a side view of the example multi-wire connector that may be used with the integrated electrical assembly mounted to an example surface;

FIG. 81A is a side view of the example multi-wire connector without a base mount that may be used with the integrated electrical assembly mounted to an example surface;

FIG. 82 is a top plan view of the example multi-wire connector that may be used with the integrated electrical assembly;

FIG. 83 is a cross-sectional view taken along line 83-83 in FIG. 82 of the example multi-wire connector that may be used with the integrated electrical assembly;

FIG. 84 is a top view of the example multi-wire connector that may be used with the integrated electrical assembly;

FIG. 85 is a cross-sectional view taken along line 85-85 in FIG. 84 of the example multi-wire connector that may be used with the integrated electrical assembly;

FIG. 86 generalized schematic view of data-com connections between a data-com distribution panel and one or more integrated electrical assemblies;

FIG. 87 is a front isometric view of an example junction box that may be configured for connection to the integrated electrical assembly;

FIG. 87A is a front isometric view of the example junction box without a decorative panel that may be configured for connection to the integrated electrical assembly;

FIG. 88 is an isometric back view of the example junction box that may be configured for connection to the integrated electrical assembly;

FIG. 89 is a front view of the example junction box that may be configured for connection to the integrated electrical assembly;

FIG. 89A is a front view of the example junction box without a decorative panel that may be configured for connection to the integrated electrical assembly;

FIG. 90 is a bottom plan view of the example junction box that may be configured for connection to the integrated electrical assembly;

FIG. 90A is a bottom plan view of the example junction box without a decorative panel that may be configured for connection to the integrated electrical assembly;

FIG. 91 is a side view of the example junction box that may be configured for connection to the integrated electrical assembly;

FIG. 91A is a side view of the example junction box without a decorative panel that may be configured for connection to the integrated electrical assembly;

FIG. 92 is an isometric view of the example junction box for installation in an example wall;

FIG. 93 is a front view of the example junction box installed in the example wall;

FIG. 94 is a cross-sectional view taken along line 94-94 in FIG. 93 of the example junction box installed in the example wall;

FIG. 95 is an exploded view of the example junction box that may be configured for connection to the integrated electrical assembly;

Figure 96A:
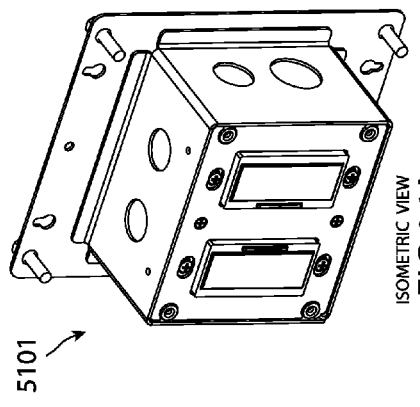
Figure 97A:
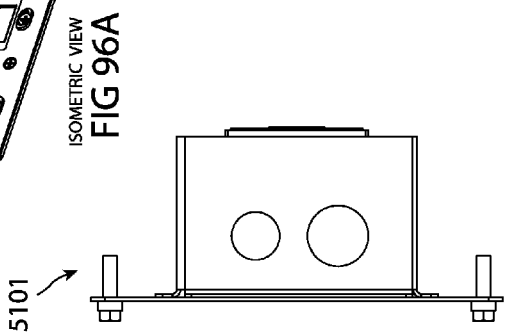
Figure 99A:
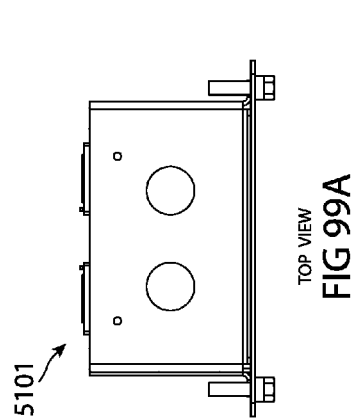
Figure 98A:
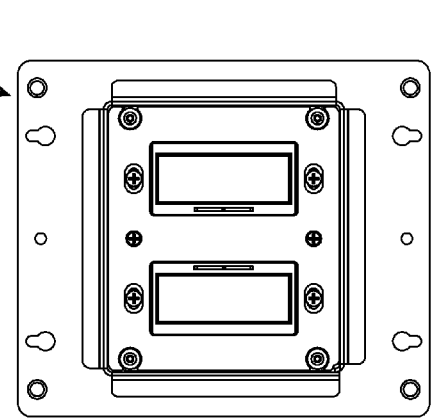
Figure 110:
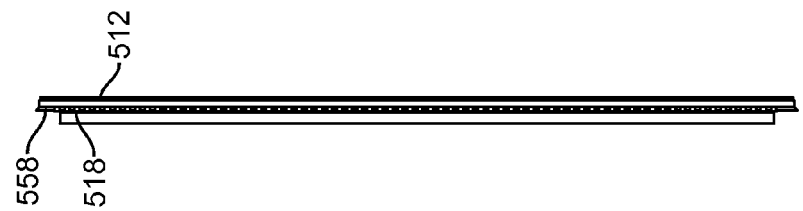
Figure 109:
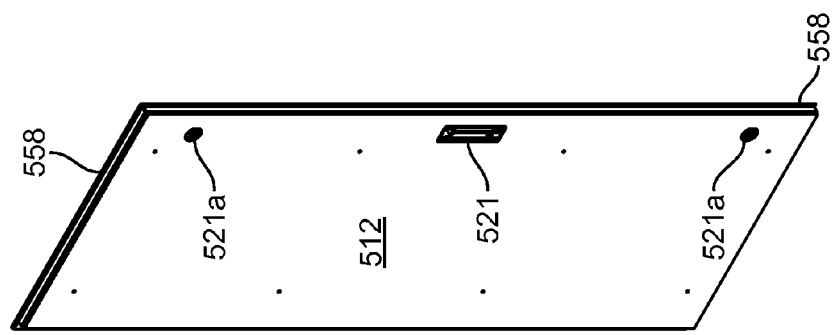
Figure 108:
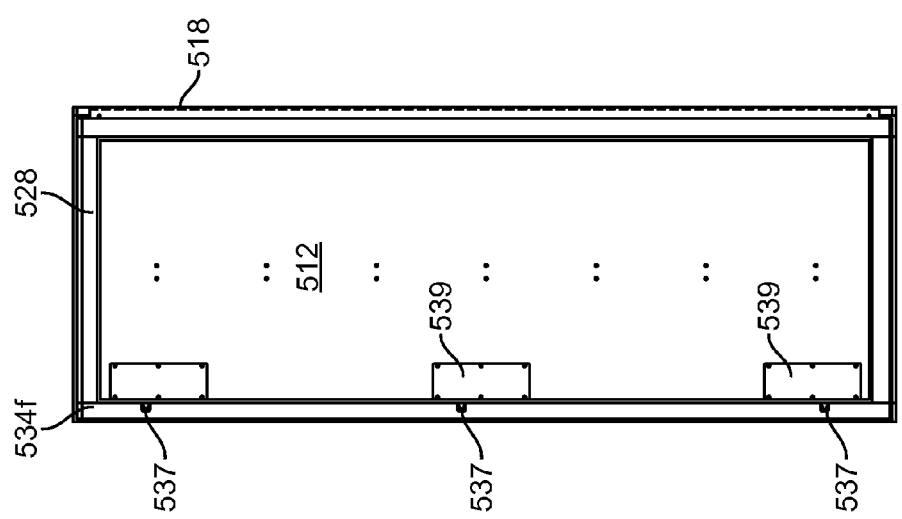
Figure 120A:
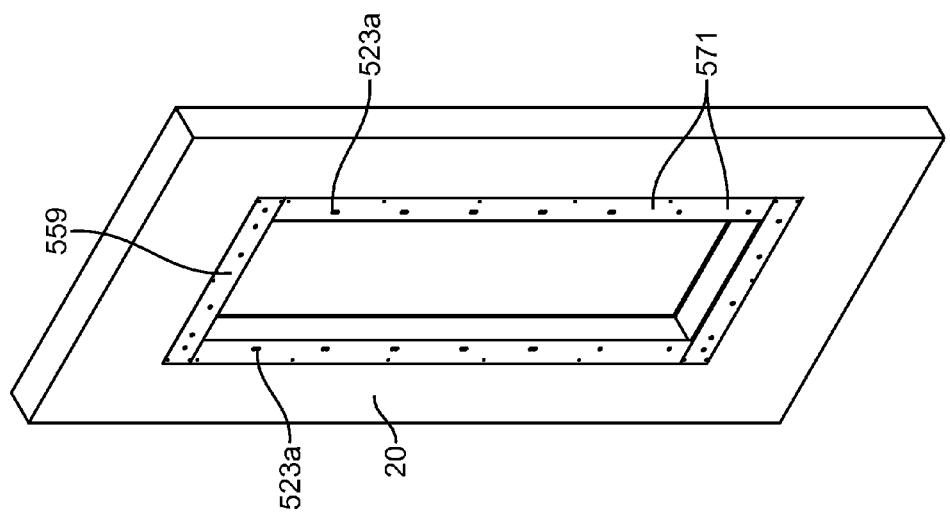
Figure 120:
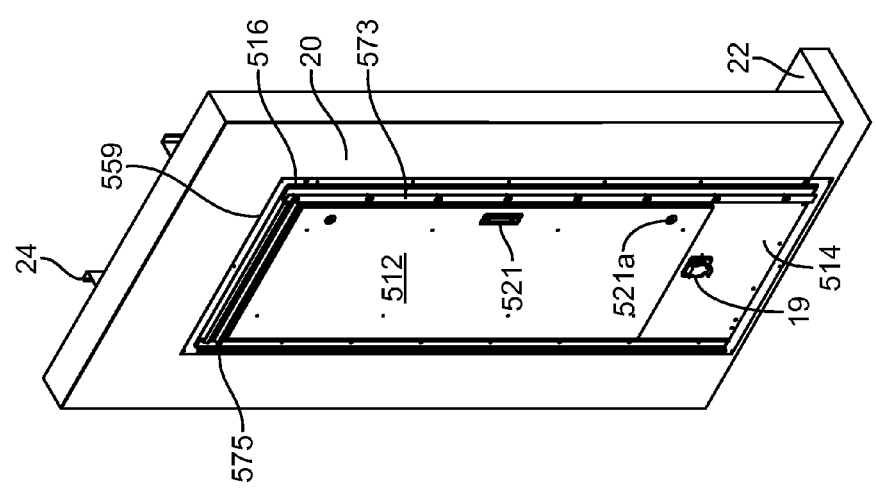
Figure 123:
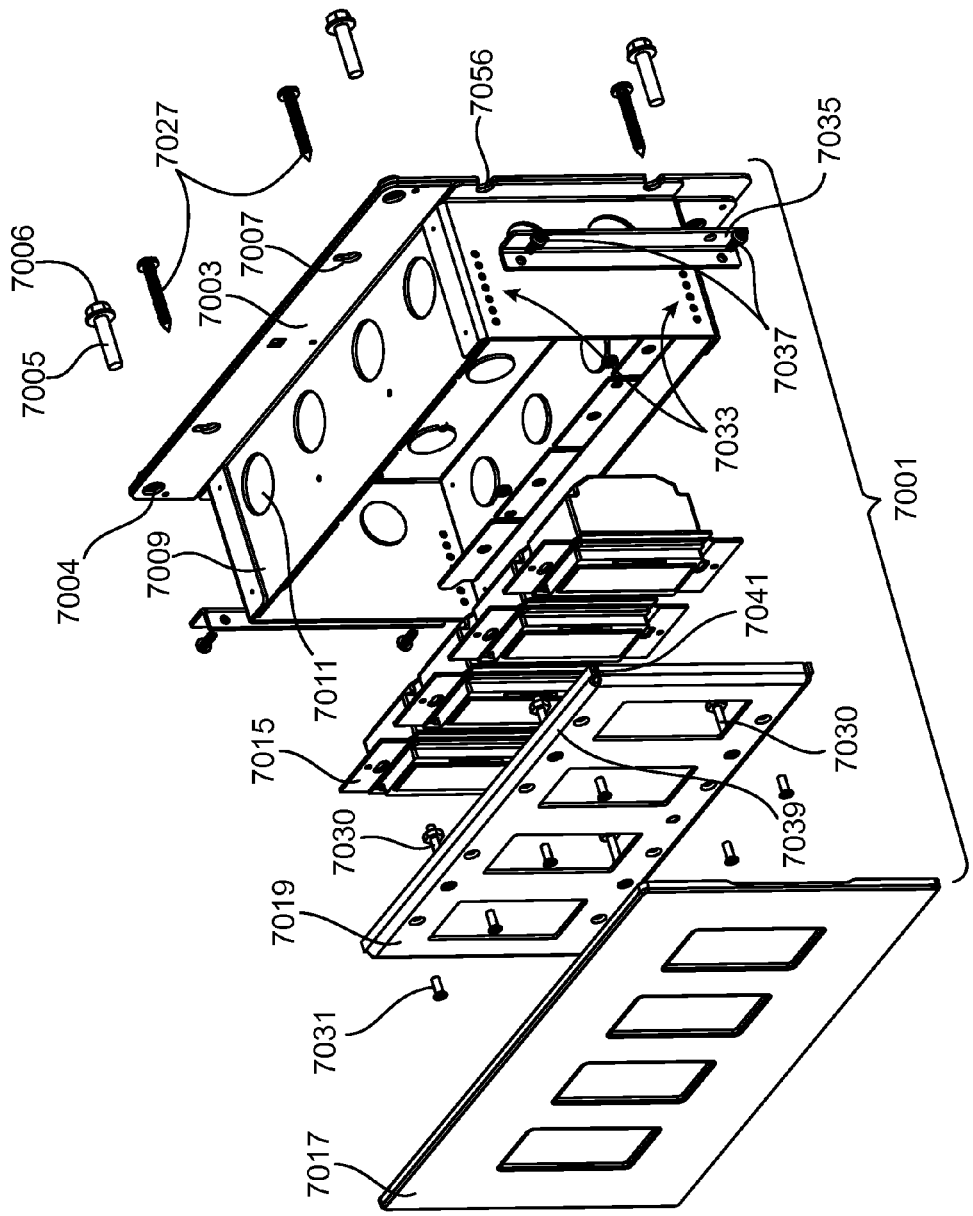
Figure 124:
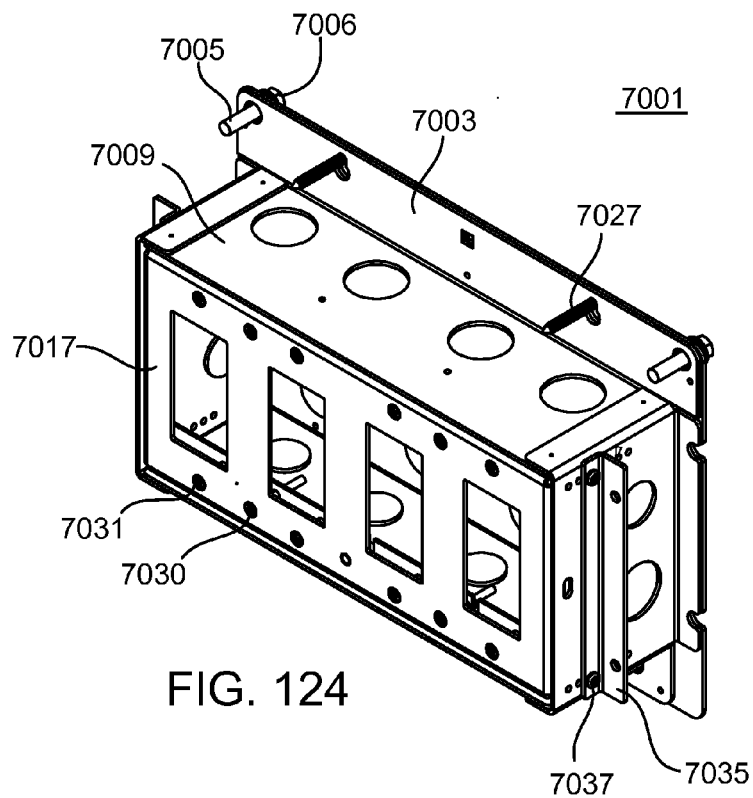
Figure 125:
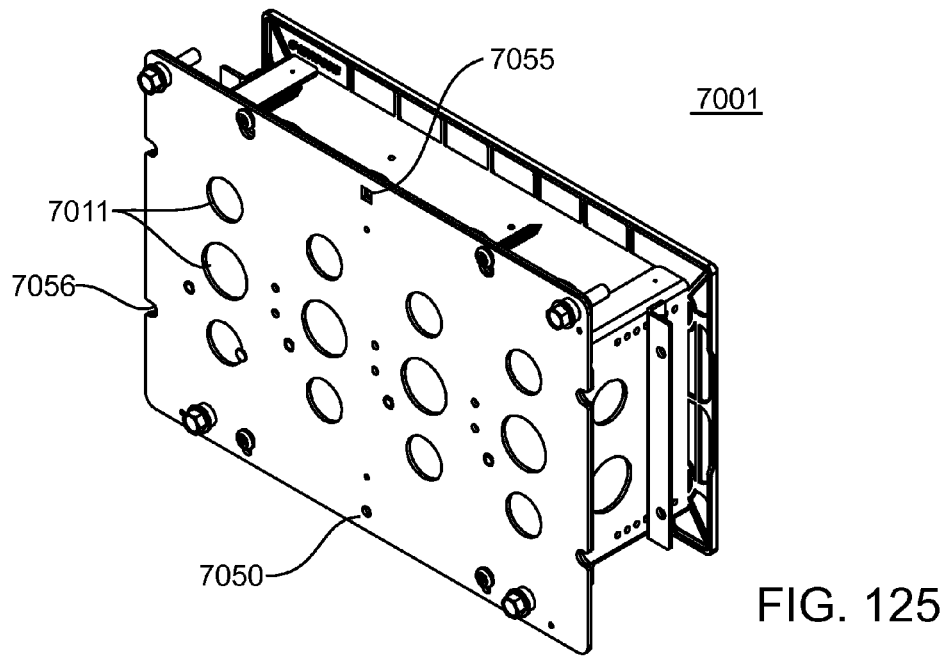
Figure 126:
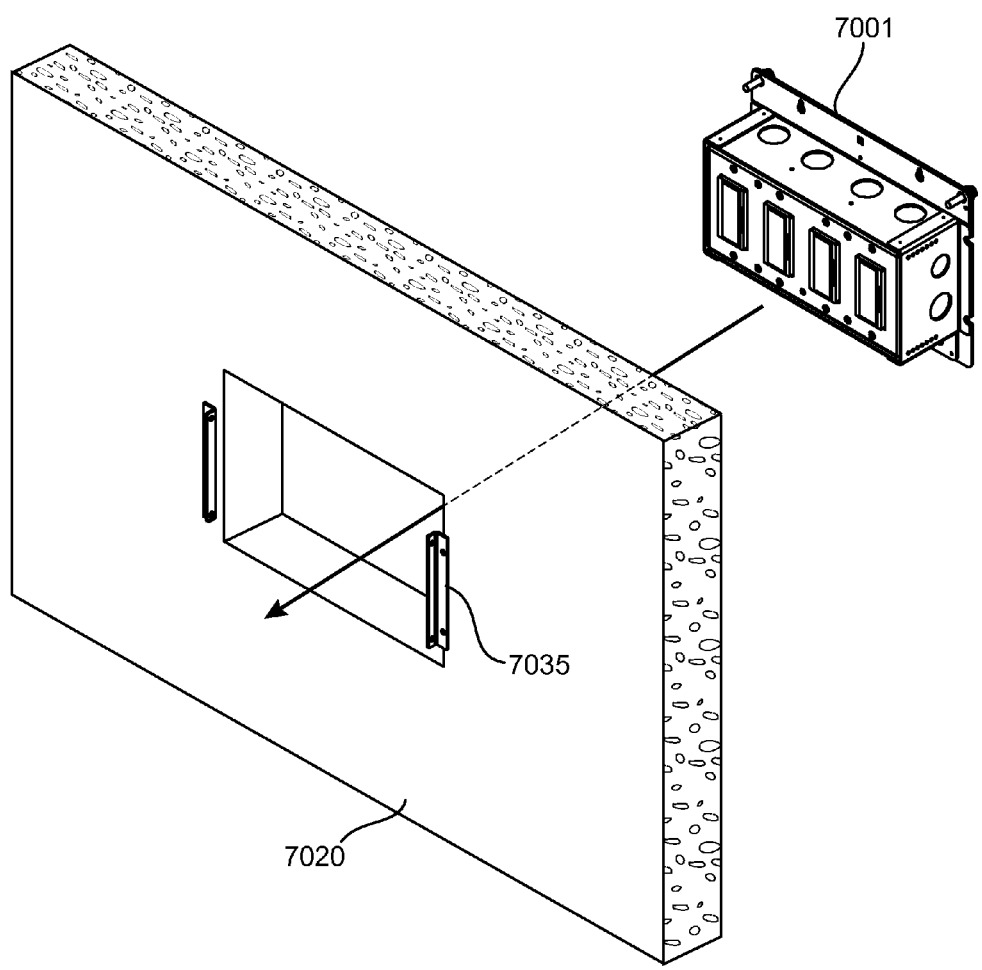
Figure 129:
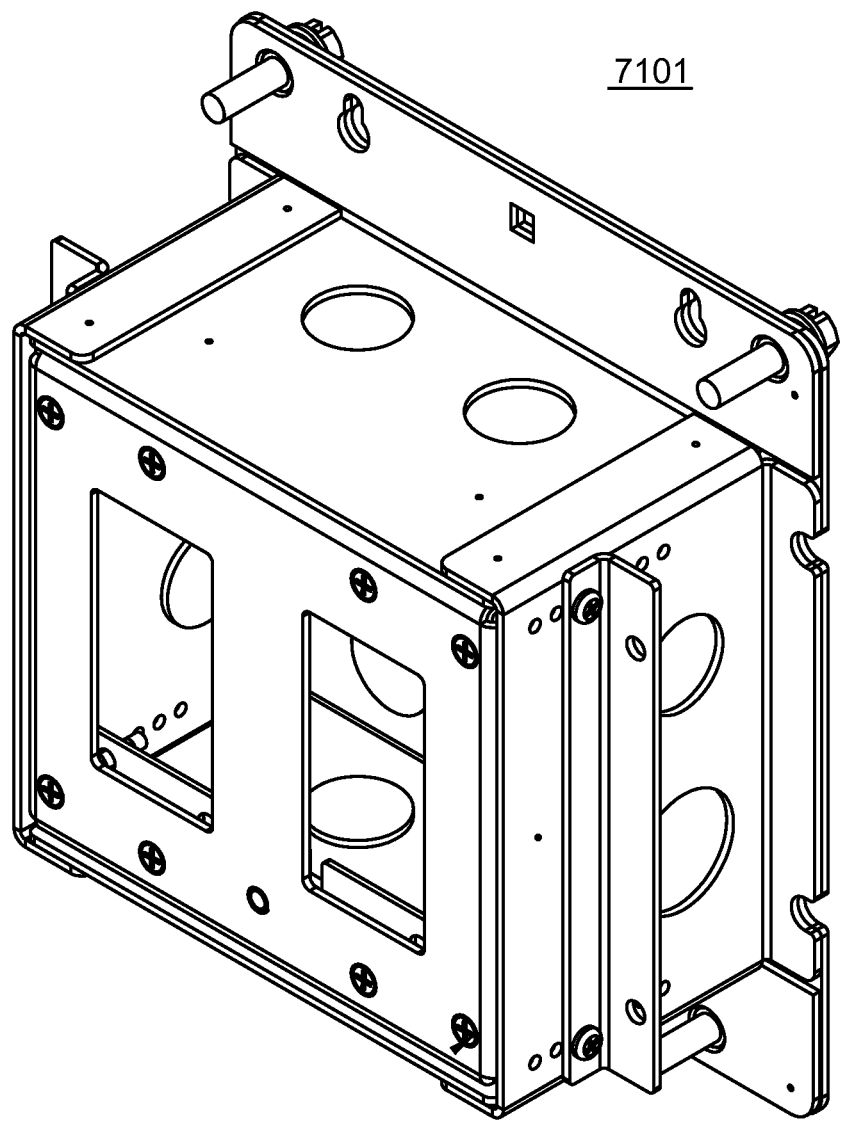
Figure 130:
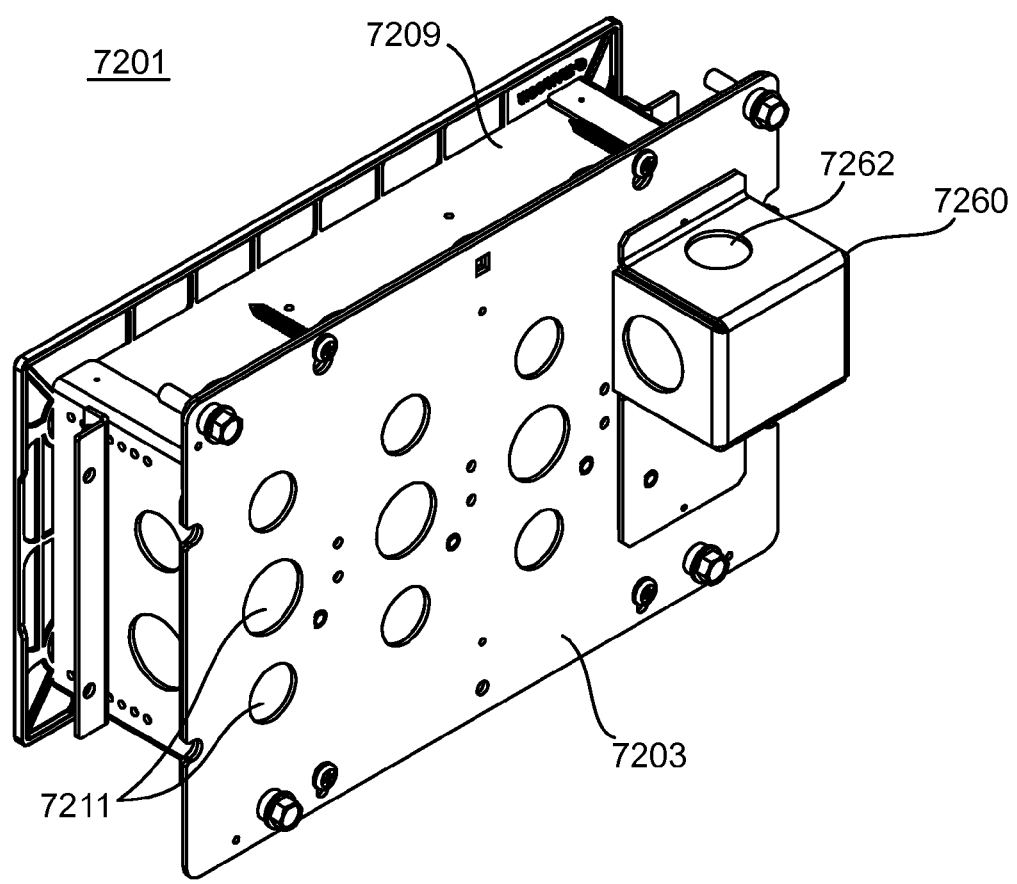
Figure 131:
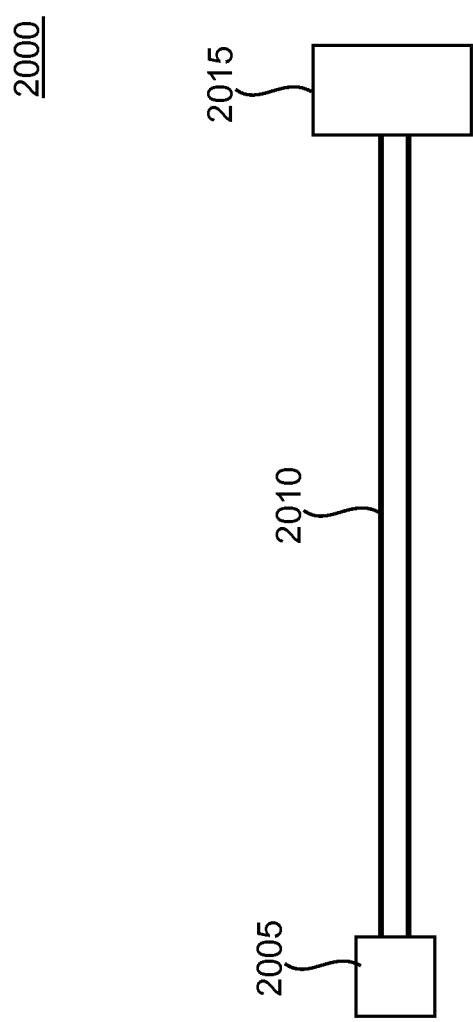
Figure 132:
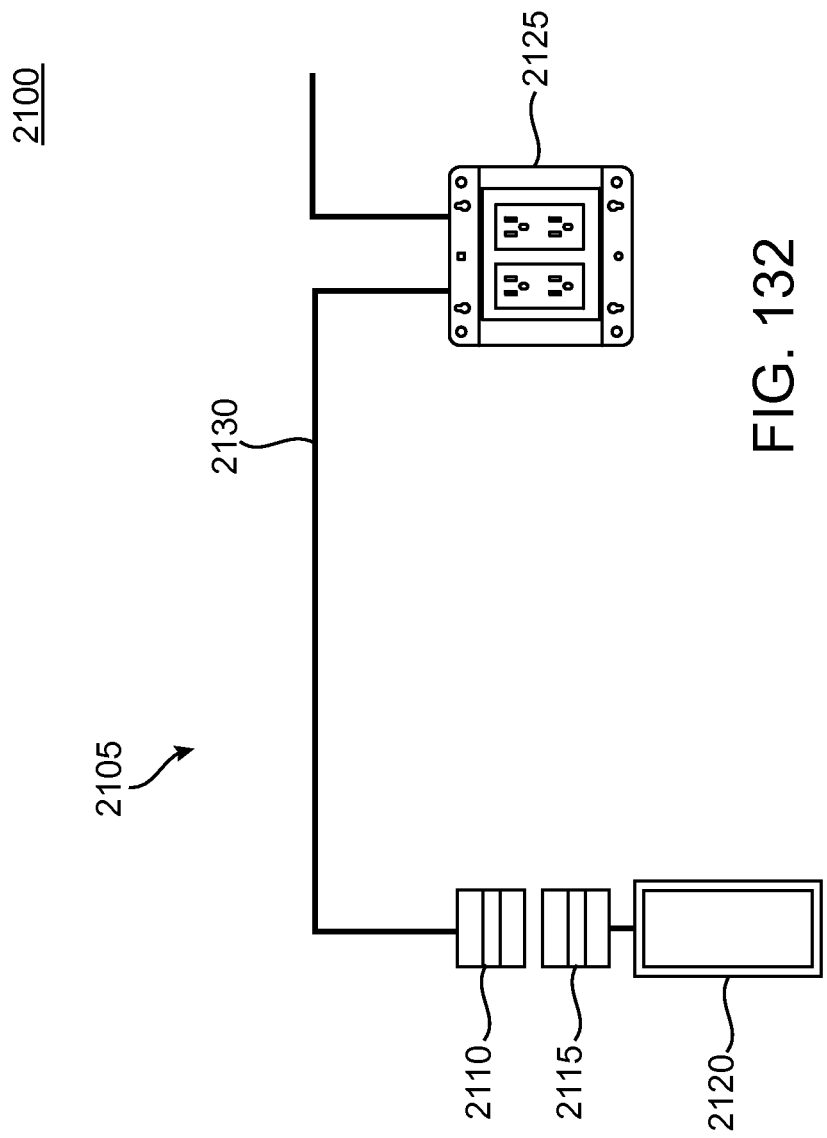
Figure 133:
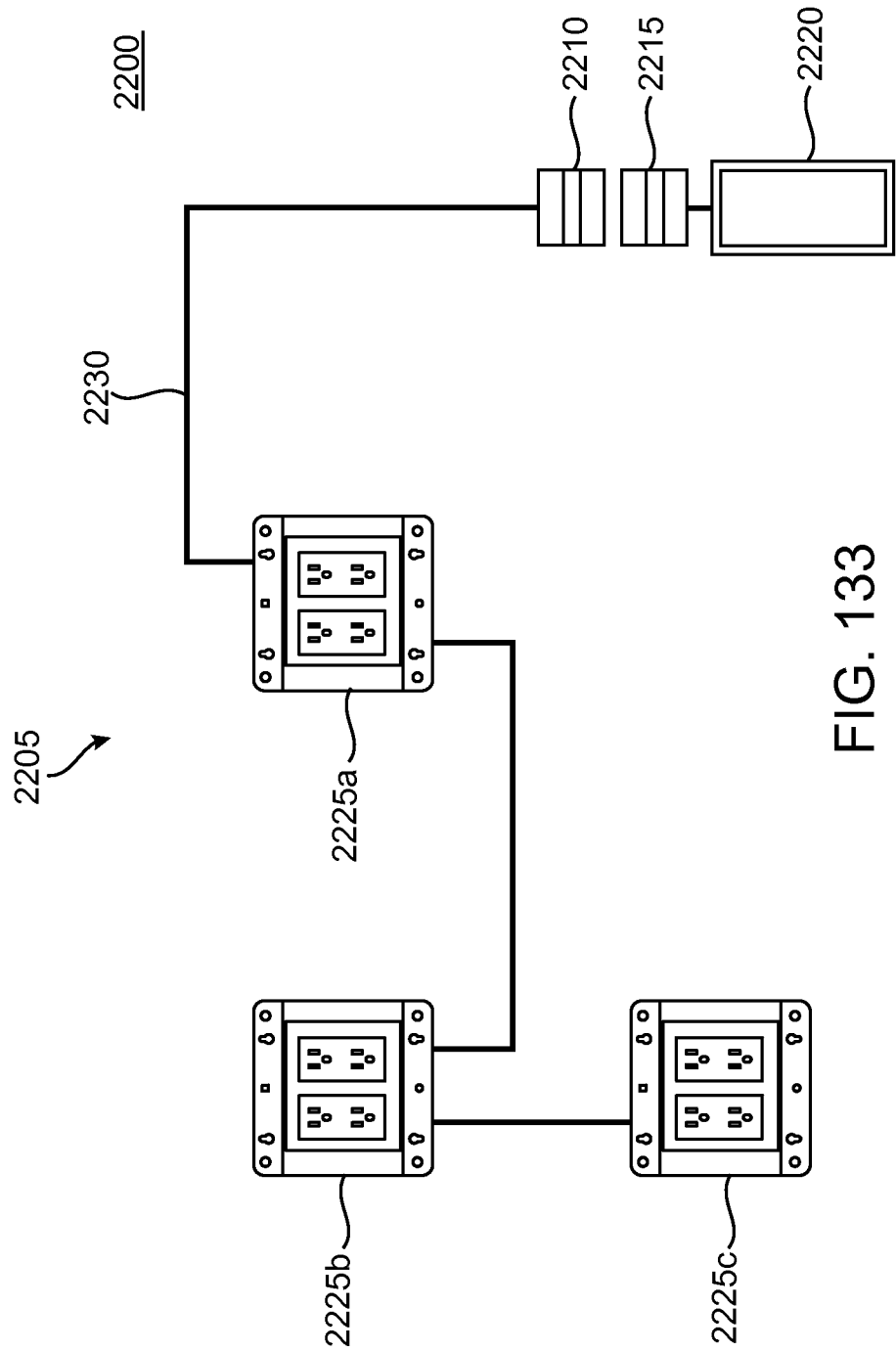
Figure 134:
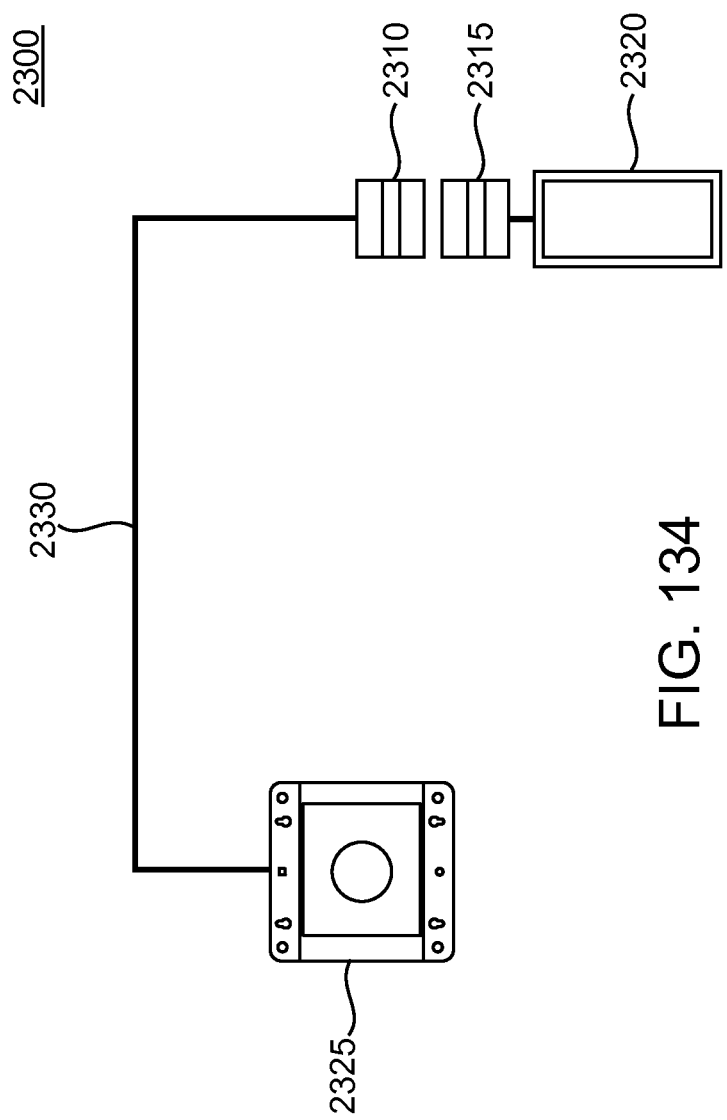

FIG. 96 is an isometric front view of another example junction box that may be configured for connection to the integrated electrical assembly;

FIG. 96A is an isometric view of the other example junction box without a decorative panel that may be configured for connection to the integrated electrical assembly;

FIG. 97 is a side view of the other example junction box that may be configured for connection to the integrated electrical assembly;

FIG. 97A is a side view of the other example junction box without a decorative panel that may be configured for connection to the integrated electrical assembly;

FIG. 98 is a front view of the other example junction box that may be configured for connection to the integrated electrical assembly;

FIG. 98A is a front plan view of the other example junction box without a decorative panel that may be configured for connection to the integrated electrical assembly;

FIG. 99 is a top plan view of the other example junction box that may be configured for connection to the integrated electrical assembly;

FIG. 99A is a top plan view of the other example junction box without a decorative panel that may be configured for connection to the integrated electrical assembly;

FIG. 100 is an isometric view of the other example junction box showing surface mounted installation of the example junction box;

FIG. 101 is a front view of another example an integrated electrical assembly;

FIG. 102 is a side view of the other example integrated electrical assembly;

FIG. 103 is a back view of the other example integrated electrical assembly;

FIG. 103A an expanded view from Section A of FIG. 103;

FIG. 104 is a front view of an example swing door from the other example integrated electrical assembly;

FIG. 105 is a cross-sectional view of the example swing door from the other example integrated electrical assembly taken along line 105-105 in FIG. 104;

FIG. 106 is a cross-sectional view of the example swing door from the other example integrated electrical assembly taken along line 106-106 in FIG. 104;

FIG. 107 is a cross-sectional view of the example swing door from the other example integrated electrical assembly taken along line 107-107 in FIG. 104;

FIG. 107A is an expanded view from Section A of FIG. 107;

FIG. 108 is a back view of the example swing door from the other example integrated electrical assembly;

FIG. 109 is an isometric view of the example swing door from the other example integrated electrical assembly;

FIG. 110 is a side view of the example swing door from the other example integrated electrical assembly;

FIG. 111 is a top plan view of the example swing door from the other example integrated electrical assembly;

FIG. 112 is a rear isometric view of the example swing door with a back panel removed from the other example integrated electrical assembly;

FIG. 113 is a rear view of the example swing door with the back panel removed from the other example integrated electrical assembly;

FIG. 114 is a front view of the other example integrated electrical assembly installed on an example wall;

FIG. 114A is a front view of an example metallic wall plate for use with the example integrated electrical assembly installed on the example wall;

FIG. 115 is a cross-sectional view of the other example integrated electrical assembly taken along line 115-115 from FIG. 114;

FIG. 115A is an expanded view from Section A of FIG. 115;

FIG. 115B is an expanded view from Section B of FIG. 115;

FIG. 116 is a cross-sectional view of the other example integrated electrical assembly taken along line 116-116 from FIG. 114;

FIG. 116A is an expanded view from Section A of FIG. 116;

FIG. 116B is an expanded view from Section B of FIG. 116;

FIG. 117 is a side view of the other example integrated electrical assembly installed on the example wall;

FIG. 118 is a front view of the other example integrated electrical assembly installed on an example wall and floor;

FIG. 118A is a front view of an example metallic wall plate for use with the example integrated electrical assembly installed on the example wall and floor;

FIG. 119 is an isometric view of the other example integrated electrical assembly installed on the example wall and floor;

FIG. 119A is an isometric view of an example metallic wall plate for use with the example integrated electrical assembly installed on the example wall and floor;

FIG. 120 is an isometric view of the other example integrated electrical assembly installed on the example wall;

FIG. 120A is an isometric view of an example metallic wall plate for use with the integrated electrical assembly installed on the example wall;

FIG. 121 is a front view of the other example integrated electrical assembly with the swing door removed;

FIG. 122 is an isometric view of the other example integrated electrical assembly;

FIG. 122A is an expanded view of Section A from FIG. 122;

FIG. 122B is an expanded view of Section B from FIG. 122;

FIG. 123 is a schematic illustration of an exploded view of another example junction box;

FIG. 124 is an isometric front view of the example junction box;

FIG. 125 is an isometric back view of the example junction box;

FIG. 126 is an isometric view of the example junction box for installation in an example wall;

FIG. 127 is a front view of the example junction box installed in the example wall;

FIG. 128 is a cross-sectional view taken along line 128-128 in FIG. 127 of the example junction box installed in the example wall;

FIG. 129 is an isometric view of a further example junction box;

FIG. 130 is an isometric view of another example junction box;

FIG. 131 is a schematic illustration of a manufactured wire assembly;

FIG. 132 is a schematic illustration of an example circuit including a manufactured wire assembly;

FIG. 133 is a schematic illustration of another example circuit including a manufactured wire assembly; and FIG. 134 is a schematic illustration of a further example circuit including a manufactured wire assembly;

all arranged in accordance with at least some embodiments of the present disclosure.

DETAILED DESCRIPTION

In the following detailed description, reference is made to the accompanying drawings, which form a part hereof. In the drawings, similar symbols typically identify similar components, unless context dictates otherwise. The illustrative examples described in the detailed description, drawings, and claims are not meant to be limiting. Other examples may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are implicitly contemplated herein.

This disclosure is drawn, inter alia, to methods, systems, products, devices, and/or apparatus generally related to an integrated electrical assembly that may include an enclosure, which may include a frame, a mounting flange extending around a periphery of the frame, a swing door coupled to the frame by a hinge, a first gasket coupled to the frame, wherein the first gasket may engage a perimeter of the swing door when the swing door is in a closed position; and a second gasket coupled to a perimeter of the mounting flange, and a master tub within the enclosure, wherein the master tub may include a plurality of coupled enclosures, wherein the enclosures are configured to receive at least one electrical component.

An integrated electrical assembly may include a secure, weather-resistant enclosure for one or more electrical components for use in a building structure and/or subspace of a building structure. Electrical components may include, but are not limited to, breaker boxes, LED drivers, emergency power supplies, dimmers, capacitors, transformers, and internet routers. The electrical components may vary depending on the desired electrical and data-com capabilities of the building structure and/or subspace. The enclosure of the integrated electrical assembly may include an enclosure that may include a door to access the electrical components. The door may include insulation, gaskets, and/or other seals to provide weather-resistance when closed. The door may also include a lock for security. The integrated electrical assembly may allow all or some of a building structure's electrical components to be installed and wired off-site. For example, the integrated electrical assembly may be installed in a pre-fabricated wall that is then delivered to a construction site. The integrated assembly may provide at least partial protection for the components during transport and after installation of the wall in a building structure. The integrated electrical assembly may also provide a modular system of master and slave distribution nodes for distributing electrical power through a building structure and/or subspace of the building structure. This may allow for faster coupling of wiring connections during construction.

A master tub may provide individual enclosures for one or more electrical components. The enclosures may include metal shelves and may also include metal covers. The master tub may allow all of the components to have a common ground. This may allow the use of separate, modular components. The use of separate, modular components may allow for some or all wiring to be performed off-site in a controlled environment. It may also allow for the replacement of individual components rather than the entire collection of components for repairs and upgrades.

In some embodiments, the master tub may be used with the integrated electrical assembly. This may provide a weather-resistant, grounded, and organized distribution of electrical components for a building structure and/or a subspace of a building structure. The organization of components in a contained unit, such as the master tub, may allow for easier coupling of connections. For example, wires to be coupled from a subspace, such as an apartment unit, may be color coded to be coupled to a corresponding color coded component installed in the master tub.

A multi-wire connector or a plurality of multi-wire connectors may include a terminal block in which wires are inserted. The wires may be secured by one or more set screws. The terminal block may be contained in a housing that protects the terminal block and allows it to be more easily mounted to a surface. The housing may be ventilated to provide air cooling of the terminal block during operation. The multi-wire connector may provide a simplified method of connecting wires from one or more circuits. In some embodiments, a plurality of multi-wire connectors may be mounted in the master tub for organized coupling of electrical systems.

A junction box may be prewired with outlets, switches, and/or other components and installed in a component of a building structure. For example, the junction box may be installed in a pre-fabricated wall in a factory environment that is then shipped to a construction site for installation in a building structure. The junction box may include macro and micro adjustments for precision installation. When the junction box is installed, for example, in a wall, macro adjustments may be made by adjusting lugs on a back panel of the junction box. The junction box may also be macro adjusted by the placement of L-brackets along the body of the junction box. The L-brackets and lugs may secure the junction box to the wall by pressing on opposite sides of the wall. Micro adjustment may be provided by a plurality of screws that extend from an interior cover into the body of the junction box. The screws may allow the interior cover to move up, down, forward, and back in relation to the body of the junction box. Micro adjustments to the junction box interior cover may allow for the decorative cover to be aligned as desired with the wall.

Any reference herein to "metal" includes any construction grade metals or metal alloys as may be suitable for fabrication and/or construction of the utility panel and components described herein. Any reference to "wood" includes wood, wood laminated products, wood pressed products, wood polymer composites (WPCs), bamboo or bamboo related products, lignin products and any plant derived product, whether chemically treated, refined, processed or simply harvested from a plant. Any reference herein to "concrete" includes any construction grade curable composite that includes cement, water, and a granular aggregate. Granular aggregates may include sand, gravel, polymers, ash and/or other minerals.

In some embodiments, the material composition of the integrated electrical assembly, master tub, and/or junction box may be predominantly steel. In some embodiments it may be predominately aluminum. In still other embodiments, the integrated electrical assembly, master tub, and/or junction box components may be made from a variety of building suitable materials ranging from metals and/or metal alloys, to wood and wood polymer composites (WPC), wood based products (lignin), other organic building materials (bamboo) to organic polymers (plastics), to hybrid materials, or earthen materials such as ceramics. In some embodiments cement or other pourable or moldable building materials may also be used. In some embodiments, any combination of suitable materials may be combined by using one material for some elements of integrated electrical assembly and other materials for other elements of integrated electrical assembly. Selection of any material may be made from a reference of material options (such as those provided for in the International Building Code and/or UL approved components), or selected based on the knowledge of those of ordinary skill in the art when determining electrical connectivity and insulation requirements of elements. Adjustments in materials to accommodate size of structure, load and environmental stresses can determine optimal economical choices of materials used for all components in the integrated electrical assembly described herein. Availability of various materials in different parts of the world may also affect selection of materials for building the elements described herein. Adoption of the International Building Code or similar code may also affect choice of materials.

Figure 2B:
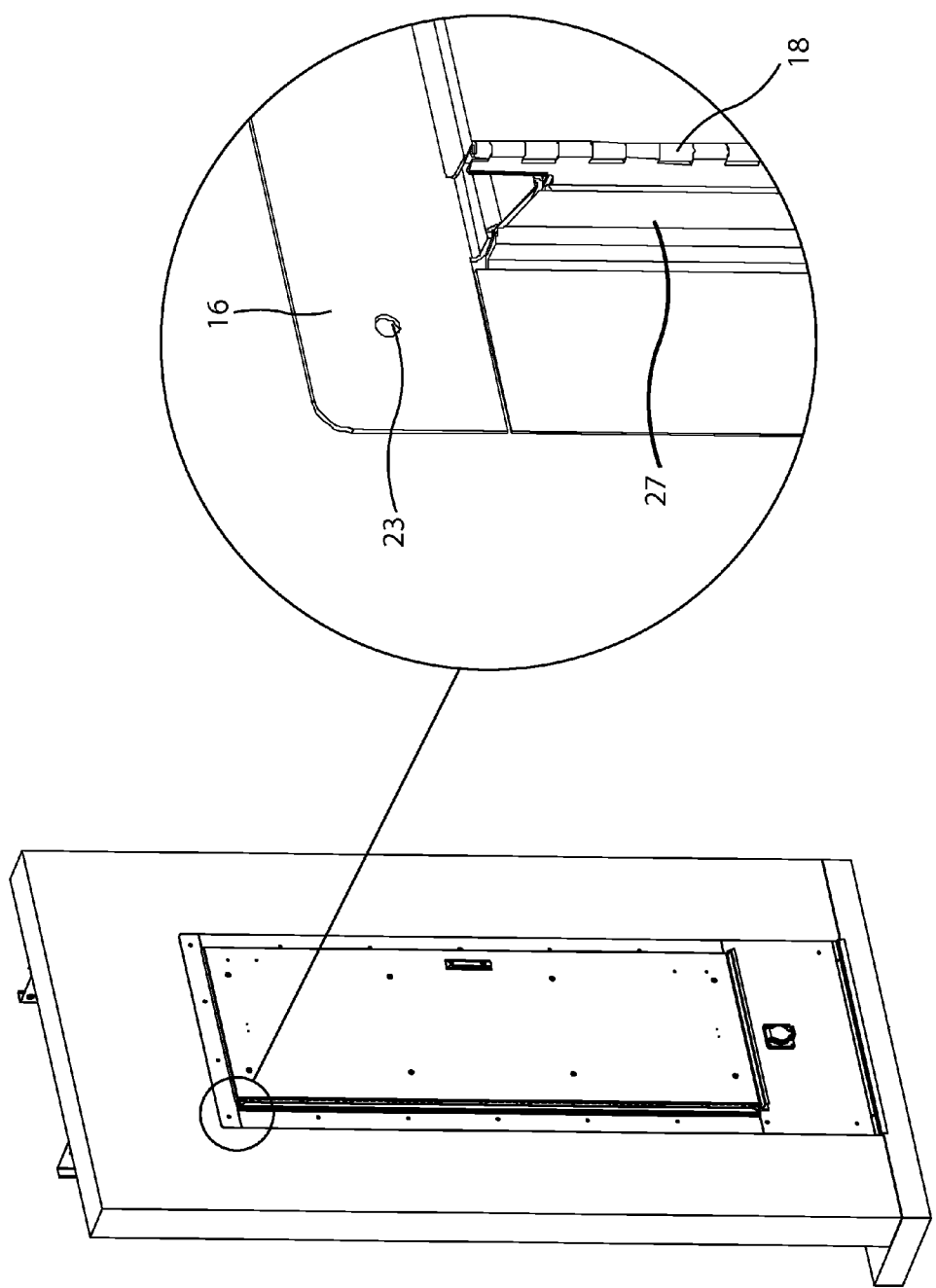
FIG. 2B is an expanded view of an example hinge section of the example integrated electrical assembly shown in FIG. 2.
Figure 5:
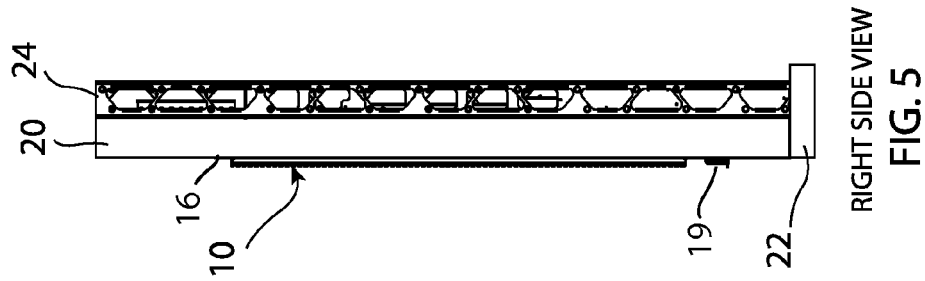
FIG. 5 is a right side view of the example integrated electrical assembly installed on the example wall.
Figure 3:
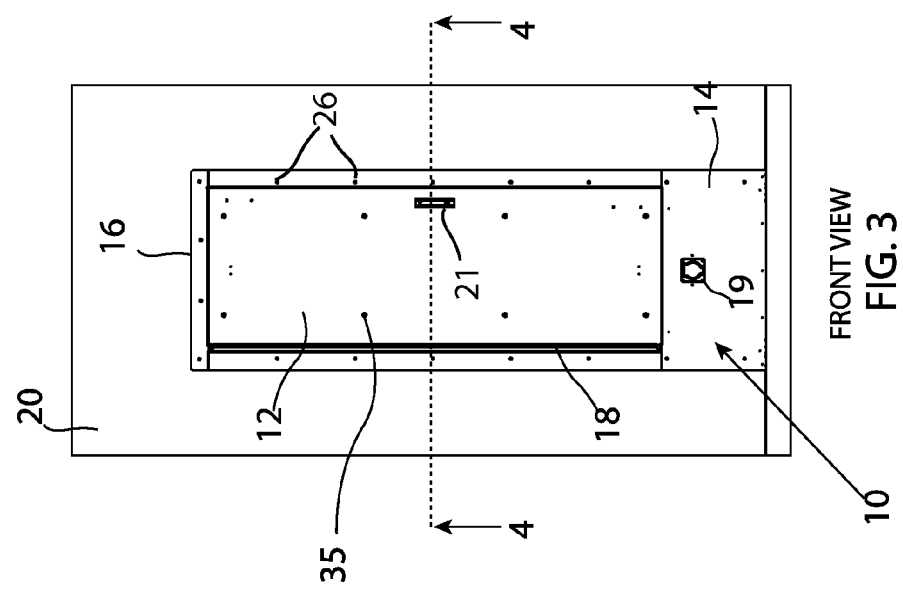
FIG. 3 is a front view of the example integrated electrical assembly installed on the example wall shown in FIG. 2.
Figure 6:
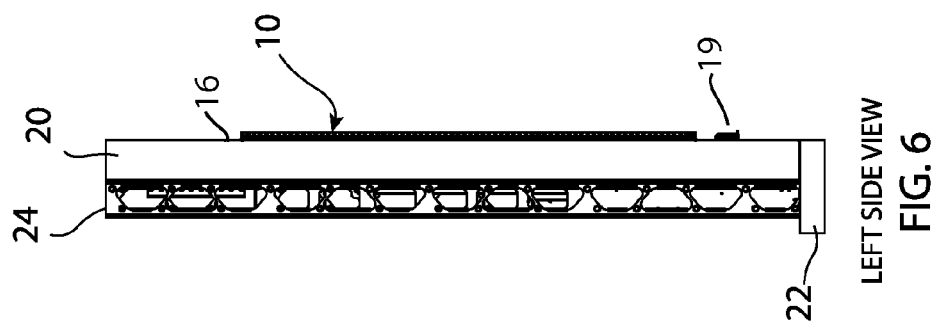
FIG. 6 is a left side view of the example integrated electrical assembly installed on the example wall.
Figure 7:
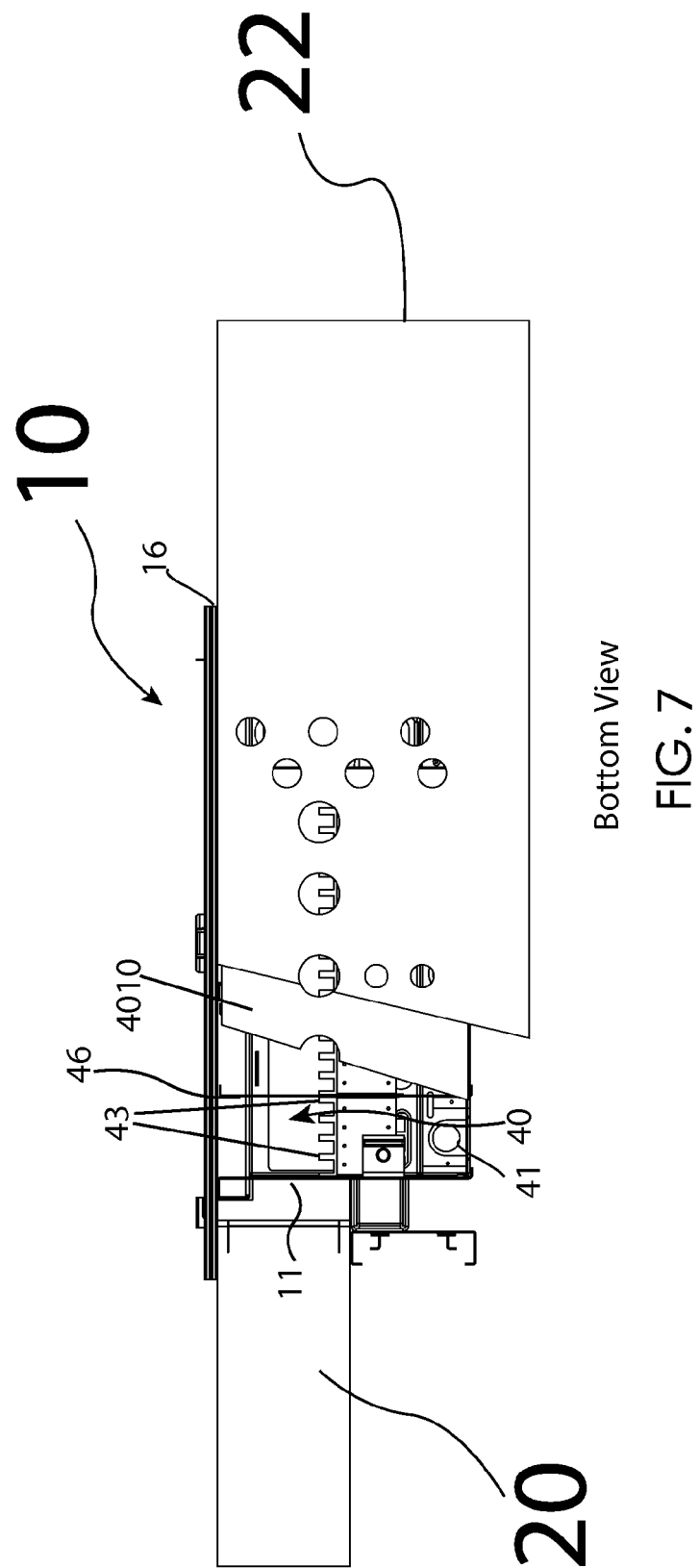
FIG. 7 is a bottom plan view of the example integrated electrical assembly installed on the example wall.
Figure 8:
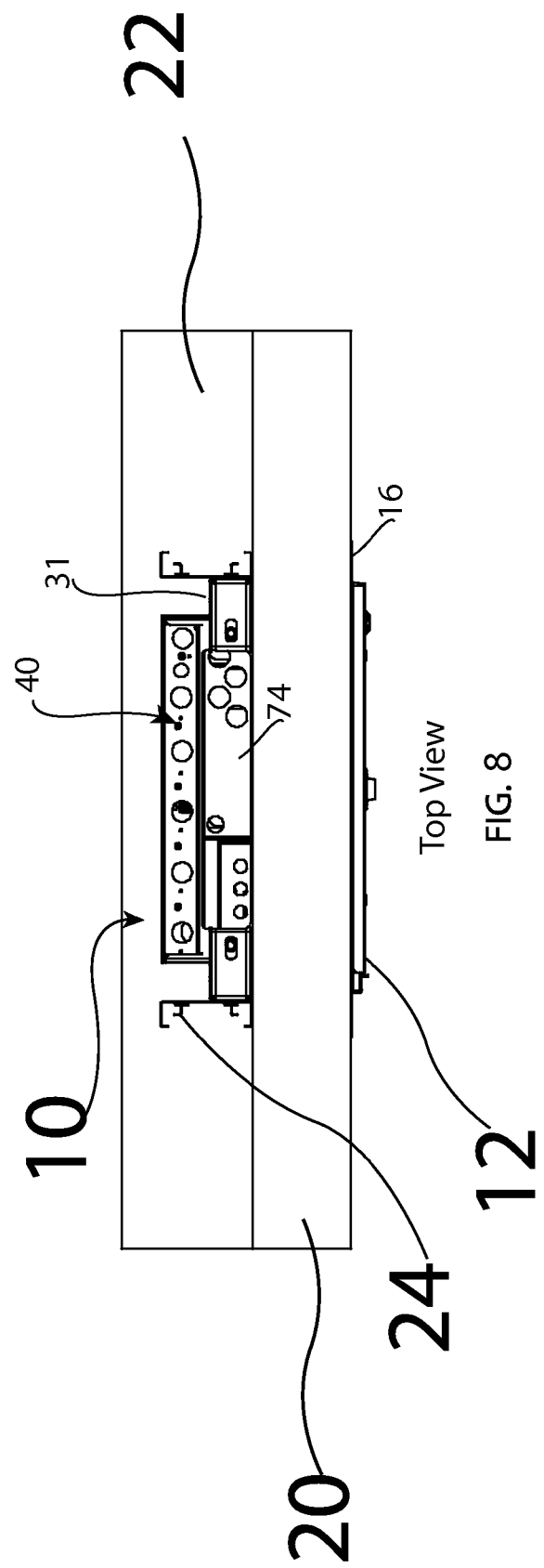
FIG. 8 is a top plan view of the example integrated electrical assembly installed on the example wall.
Figure 12:
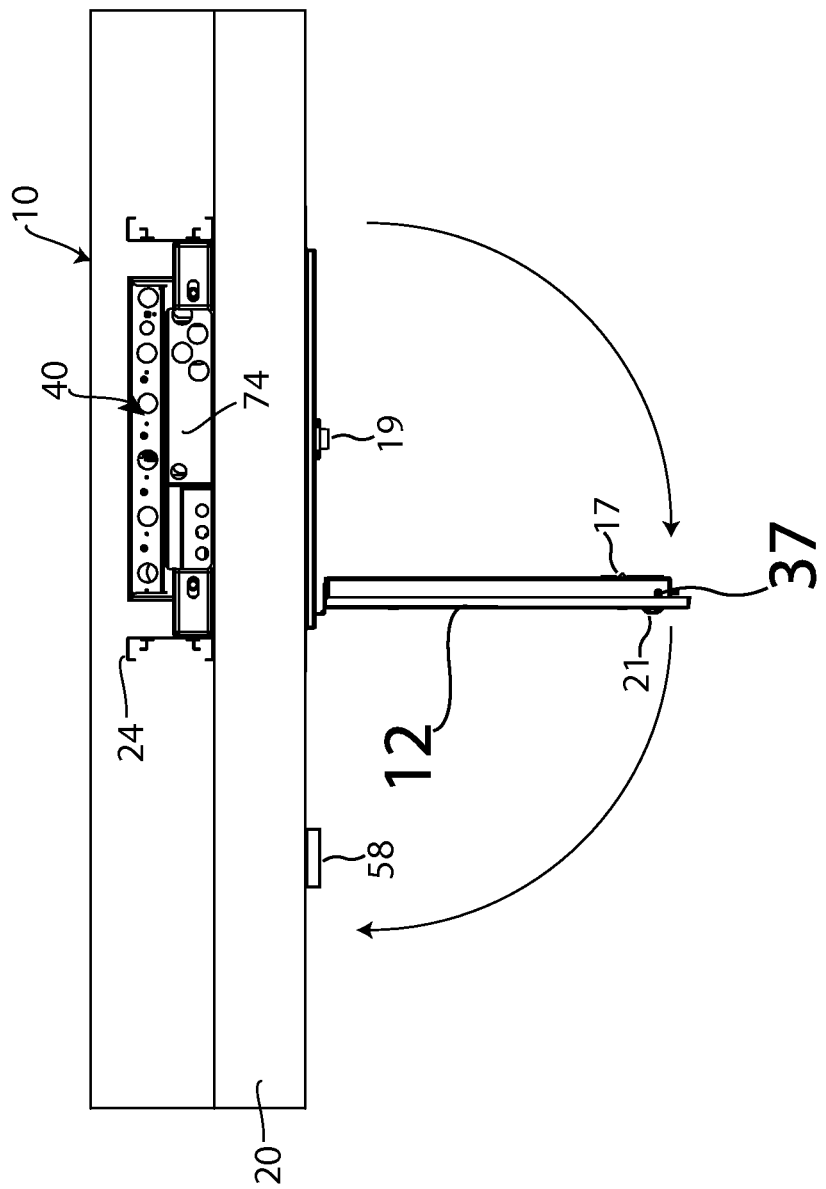
FIG. 12 is a top view of the example integrated electrical assembly installed on the example wall showing the range of motion of the door of the integrated electrical assembly.

FIG. 1 is an exploded view of an example integrated electrical assembly 10 arranged in accordance with at least some embodiments described herein. FIGS. 2, 2B, 3, 4, 5, 6-13, 13A, 14 and 14A-14E are additional views of the example integrated electrical assembly 10 arranged in accordance with at least some embodiments described herein. The various components described in FIGS. 1-2, 2B, 3, 4, 5, 6-13, 13A, 14 and 14A-14E are merely examples, and other variations, including eliminating components, combining components, and substituting components are all contemplated. In some embodiments, the integrated electrical assembly 10 may include an enclosure that includes a frame 11, a swing door 12 attached to the frame 11 by a hinge 18 and a mounting flange 16 extending around the periphery of the frame 11. In some embodiments, the hinge 18 may be constructed so that it extends over a housing lip 27, as shown in greater detail in FIG. 2B. In some embodiments, the hinge 18 may be a continuous plano hinge that may be formed from a non-corrosive or corrosion resistive metal, such as stainless steel. The hinge 18 may be configured to support a heavy durable door and may provide pressure relief and/or reduction from high pressure water sprays/jet, for example from power washings of the building structure. In some embodiments, this may allow the enclosure of the integrated electrical assembly 10 to obtain at least a NEMA 4 listing. The enclosure of the integrated electrical assembly 10 may also include a bottom panel 14 that may contain an outlet 19 with a watertight/water proof cover in some embodiments. For example, the outlet may be a watertight twist lock receptacle, and may be a NEMA 4 rated watertight twist lock receptacle. The swing door 12 of the integrated electrical assembly 10 may contain a door handle 21 for permitting access to and closing of the swing door 12. In some embodiments, the door handle 21 may contain a locking mechanism, such as a keyed tumbler, which may allow for restricting access to the integrated electrical assembly 10.

In some embodiments, the integrated electrical assembly 10 may be master electrical distribution node for a building structure and/or a subspace within a building structure. Examples of subspaces include, but are not limited to, one or more living units, hospital rooms, retail spaces, flex warehousing and the like, that may integrate one or more electrical, lighting and/or data-com systems together. In some embodiments, the integrated electrical assembly 10 may be configured as a slave integrated electrical assembly 10 that may receive wiring from a master electrical distribution node.

In some embodiments, the integrated electrical assembly 10 may be configured for installation in an example wall 20, which may be an exterior wall in some embodiments. The integrated electrical assembly 10 may be positioned in an opening formed in the wall 20 that may be flanked by one or more wall supports 24 and a floor surface 22 on the bottom of the opening. In some embodiments, a template plate 4010 may be placed on the floor surface 22 on the bottom of the opening. The template plate 4010 may provide a guide for cables and/or conduits running into the integrated electrical assembly 10. The wall support 24 may be an industry standard steel stud or a formed metal stud, for example a roll formed and stamped steel stud such as a DELTASTUD available from Steelform Building Products Inc. The floor surface 22 may be any suitable building flooring surface and/or structure. Example floor surfaces include, but are not limited to, concrete and plywood. In some embodiments, the opening may be slightly larger than the size of the frame 11 of the integrated electrical assembly 10, but smaller than the size of the mounting flange 16 extending around the integrated electrical assembly 10. A bead of a sealant (not shown), such as silicon, polyurethane, acrylic, adhesive, epoxy, may be placed between the mounting flange 16 and the wall 20. The sealant may provide a water tight seal between the mounting flange 16 and the wall 20. In some embodiments, a gasket (not shown) may be provided on the mounting flange 16. The gasket may seal the mounting flange 16 to the wall 20. The gasket may include rubber, a flexible polymer, silicon, and/or other water-resistant material. In some embodiments, the mounting flange 16 of the integrated electrical assembly 10 may include one or more mounting holes 23 to allow one or more fasteners 26, such as nails, screws, bolts, lag screws, lag bolts to secure the mounting flange 16 to the wall 20. A second sealant (not shown) may be placed over the mounting flange 16 and the fasteners 26, and extend at least partially onto the wall 20. The second sealant may further seal the mounting flange 16 to the wall 20 and may prevent water or moisture penetrating between the mounting flange 16 and the wall 20 and entering the integrated electrical assembly 10.

Referring to FIGS. 4 and 9-12, in some embodiments, the enclosure of the integrated electrical assembly 10 may also include the housing lip 27 extending around the inside perimeter of the mounting flange 16, and a corresponding door lip 28 formed in the swing door 12 that may be configured to cover the housing lip 27 when the swing door 12 is in a closed position, as shown in FIG. 4. The door lip 28 may extend around three sides of the swing door 12 so that when the swing door 12 is in a closed position, the door lip 28 may extend over and around the housing lip 27. This may provide pressure relief and/or reduction from high pressure water sprays/jet and may allow the integrated electrical assembly 10 to obtain at least a NEMA 4 listing. In some embodiments, a door gasket 34*a* may be placed around the periphery of where the swing door 12 contacts the frame 11. The gasket may include rubber, a flexible polymer, silicon, and/or other water-resistant material. This may provide a watertight seal between the swing door 12 and the frame 11. As shown in FIG. 4A, additional door gaskets 34*b*, 34*c*, 34*d* may also be placed on or around the housing lip 27. This may provide additional seals with the door lip 28 when the swing door 12 in a closed position on three sides. Other combination of door gaskets 34*a*, 34*b*, 34*c*, 34*d* may be used. In some embodiments, a configuration of the door lip 28, the housing lip 27 when the swing door 12 is in a closed position in combination with the hinge 18 on the side of the swing door 12, a configuration that does not include the door lip 28 and the one or more of the gaskets 34*a*, 34*b*, 34*c*, 34*d* may be capable of producing a watertight seal for the enclosure of the integrated electrical assembly 10. This may allow at least a NEMA 4 listing.

The swing door 12 may also include at least one I-beam 29, or other structural member formed or fabricated within the swing door 12. The I-beam 29 or other structural member may provide structural rigidity to the swing door 12, and may prevent heat warping of the swing door 12. A space within the swing door 12 may be at least partially filled with insulation 55. This may allow the integrated electrical assembly 10 to be resistive to heat and/or cold transfer from outside the integrated electrical assembly 10 to the components within the integrated electrical assembly 10. In some embodiments, the swing door 12 of the integrated electrical assembly 10 may also include one or more threaded plugs 35 that are configured to threadly engage with a threaded fastener (not shown). This may allow items, such as rain and/or decorative door panels 15 (as shown in FIGS. 2A, 3A, 5A and 6A-6B) to be secured to the swing door 12 and/or the integrated electrical assembly 10. The threaded plugs 35 may be configured such that the threaded plugs 35 may be compressed when the threaded fastener is tightened onto the threaded plugs 35. This may seal the threaded plugs 35 against the swing door 12. In some embodiments, the swing door 12 of the integrated electrical assembly 10 may also include a low voltage lighting strip 17, for example an LED strip or similar, that may provide illumination to the integrated electrical assembly 10 when the swing door 12 of the integrated electrical assembly 10 is in an open position.

In some embodiments, the swing door 12 of the integrated electrical assembly 10 may also include one or more latching mechanisms 37, for example a rod, connected to and actuated by the door handle 21, which may be configured to secure the swing door 12 to the frame 11 when the swing door 12 is in a closed position. The latching mechanisms 37 may be configured to provide for a three-point closure, in which there may be at least one latching mechanism 37 on the top and bottom and at least one side of the swing door 12. The latching mechanisms 37 may engage with corresponding openings 38 in the frame 11 of the integrated electrical assembly 10. Other latching mechanisms 37 may be used. The swing door 12 may also include a removable panel 39 which may permit access to the one or more latching mechanisms 37 and interior components of the door handle 21 for maintenance and/or repair when the swing door 12 is in an open position. In some embodiments, the swing door 12 may be configured to be opened to 180°, and in some embodiments, the swing door 12 may include mechanisms (not shown) that may allow the swing door 12 to only open a certain amount which may prevent accidental damage to nearby objects and/or persons. In some embodiments, the swing door 12 may include fixed and/or adjustable stops (not shown) that may be configured to hold the swing door 12 open at a particular open position, for example at 90°. In some embodiments, a magnet 58 may also be positioned on the wall 20 which may secure the swing door 12 in an approximately 180 degree open position.

FIG. 2A is an isometric view of the example integrated electrical assembly with an example door panel and wall panels installed on and around the integrated electrical assembly arranged in accordance with at least some embodiments described herein. FIGS. 3A, 5A, and 6A-6C are additional views of the example integrated electrical assembly with an example door panel and wall panels installed on and around the integrated electrical assembly arranged in accordance with at least some embodiments described herein. In some embodiments, the swing door 12 of the integrated electrical assembly 10 may include a rain and/or decorative door panel 15 installed thereon as discussed above. The various components described in FIGS. 2A, 3A, 5A and 6A-6C are merely examples, and other variations, including eliminating components, combining components, and substituting components are all contemplated. The wall 20 on which the integrated electrical assembly 10 has been installed may also include one or more rain and/or decorative wall panels 9 installed thereon. A top rain shield drip edge 47 may be installed on the top edge of the integrated electrical assembly 10 which may prevent and/or reduce moisture, such as rain, from running down the wall 20 and/or wall panel 9 directly onto the integrated electrical assembly 10. The top rain shield drip edge 47 may be installed regardless of whether the door panel 15 and/or wall panels 9 have been installed. In some embodiments, a middle rain shield drip edge 48 may also be installed between the swing door 12 and the outlet 19 which may prevent and/or reduce moisture, such as rain, from running down the wall 20 and/or wall panel 9 directly onto the outlet 19. The middle rain shield drip edge 48 may be installed regardless of whether the door panel 15 and/or wall panels 9 have been installed. Furthermore, a bottom rain shield drip edge 49 may be installed below the outlet 19 which may remove any moisture that may be between the wall 20 and wall panels 9. The bottom rain shield drip edge 49 may be installed regardless of whether the door panel 15 and/or wall panels 9 have been installed. In some embodiments, the rain shields may be steel or aluminum strips.

FIG. 13 is a rear view of the example integrated electrical assembly installed on the example wall, arranged in accordance with at least some embodiments described herein. FIG. 13A is an additional view of the example integrated electrical assembly installed on the example wall, arranged in accordance with at least some embodiments described herein. FIG. 13B is an exploded view of an example feed enclosure and template plate that may be used with the example integrated electrical assembly arranged in accordance with at least some embodiments described herein. In some embodiments, the integrated electrical assembly 10 may also include a master feed enclosure 40 that may be positioned behind a bottom panel 14 and under a master tub 50 of the integrated electrical assembly 10. The various components described in FIGS. 13, 13A and 13B are merely examples, and other variations, including eliminating components, combining components, and substituting components are all contemplated. For example, as will be described in more detail below, in some embodiments, the master tub 50 may be used as a stand-alone unit separate from the integrated electrical assembly 10. In some embodiments, the integrated electrical assembly 10 may include alternative components other than the master feed enclosure 40 and/or master tub 50.

The master feed enclosure 40 may include one or more high-voltage junction compartments 41, which may be each separated by a barrier plate 46. The high-voltage junction compartments 41 may be configured to receive wiring (not shown) from an electric service and/or from an electric meter in an electrical room of the building structure through one or more holes/knock-outs 42 that may be positioned on the bottom of the master feed enclosure 40. Each high-voltage junction compartment 41 may receive a separate multi-conductor feed from each electric meter, which may then be further distributed onto additional integrated electrical assemblies 10 as discussed further below. The wiring (not shown) from the electric service may be connected to high voltage distribution cables (not shown), which may be for example 208-240V or the like, such as four copper conductor cables, extending to one or more power distribution blocks 43 within each high-voltage junction compartment 41. The master feed enclosure 40 may also include a data-com junction compartment 45, in which the data-com conduit and/or wiring from a data-com source may be fed into and/or through the integrated electrical assembly 10.

Referring again to FIGS. 14C, 14D and 14E, the master feed enclosure 40 may include an access cover 4005 that may be removably attached to the master feed enclosure 40 which may allow access to the master feed enclosure 40 and the high-voltage junction compartments 41 and data-com junction compartment 45 contained therein in some embodiments. One or more high voltage risers 56 may extend from the master feed enclosure 40 and may be configured to connect to another integrated electrical assembly 10 within the building structure. In some embodiments, the high voltage risers 56 may be made from flexible, e.g. MC cable, and/or rigid electrical conduit.

FIG. 71 is a generalized schematic view of example electrical connections between an electrical service line and one or more integrated electrical assemblies arranged in accordance with at least some embodiments described herein. As shown in FIG. 71, in some embodiments, the integrated electrical assembly 10 may be pre-wired to allow for efficient connection between one or more main breakers (MB) for separate service feeds coming from the electrical room of the building structure. In some embodiments, the integrated electrical assembly 10 that is acting as the master electrical distribution node for one or more slave integrated electrical assemblies 10 of the building structure may be connected for its power to an electrical feed line 7101 from a main breaker (MB) by an electrical assembly power distribution block 83 in a main electrical feed unit 80 of the integrated electrical assembly 10. In some embodiments, electrical feed lines 7102, 7103, 7104, 7105, 7106 may run from each main breaker (MB) and may be connected to separate power distribution blocks 43 within the master feed enclosure 40 of the integrated electrical assembly 10 acting as the electrical distribution node. In some embodiments, each power distribution block 43 may have been pre-wired to appropriate wiring in a corresponding high voltage riser 56 so the connection may be made from the corresponding electrical feed line 7102, 7103, 7104, 7105, 7106 to the appropriate power distribution block 43. Since the integrated electrical assembly 10 may be prewired for high voltage electrical distribution by connection of wiring in the high voltage risers 56 to the power distribution blocks 43, the integrated electrical assembly 10 may act as a connection point between the electrical service and additional integrated electrical assemblies 10. In the example illustrated in FIG. 71, the electrical service for floors 2-6 may be connected to the integrated electrical assembly 10 and then onto the integrated electrical assemblies 10 for the corresponding floors. In some embodiments, this process may be repeated to complete the wiring of a building structure or subspace of a building structure. In some embodiments, another integrated electrical assembly 10 may be used as another electrical distribution node for additional integrated electrical assemblies 10 on additional floors of a building structure. In this manner, the amount of time required for installation of wiring and/or runs may be reduced since the integrated electrical assembly 10 may provide for a connection node for the high voltage electrical system within the building structure between individual units. This may allow for the wiring to be installed in a controlled factory environment, tested and certified.

Still referring to FIG. 71, the power distribution blocks 43 may act as connections between the electrical service and additional integrated electrical assemblies 10. The distribution block 43 may provide power to one or more integrated electrical assembly power distribution blocks 83. The power distribution block 83 may provide power from the electrical service to the load center 90. The load center 90 may include supplemental or primary main disconnect, breakers, surge protection devices, grounding bars, and/or neutral bars. In some embodiments, the load center 90 may provide distribution of power from the power distribution block 83 to a subspace of a building structure, for example, a single apartment unit. This may allow power to one or more of the circuits of the subspace to be disconnected from the electrical service without affecting the power to circuits of other subspaces of the building structure. This may allow power to all of the circuits of the subspace to be disconnected from the electrical service without having to access the electrical room of the building structure. In some embodiments, each subspace may have its own load center 90.

Figure 14:
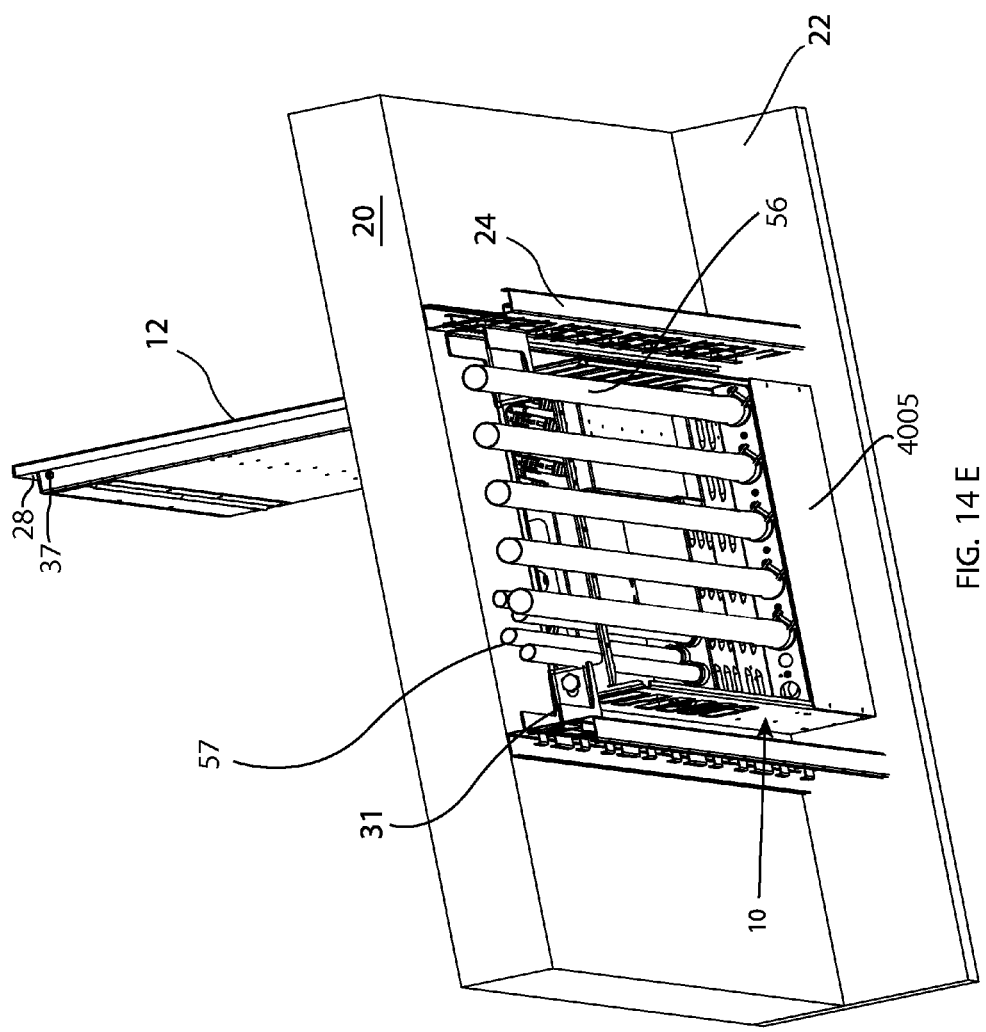
FIG. 14 is a rear view of the example integrated electrical assembly installed on the example wall with riser pipes removed for clarity.
Figure 24:
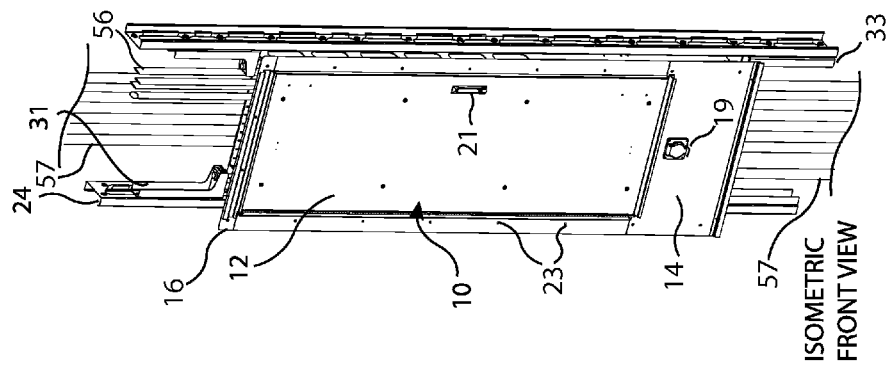
FIG. 24 is an isometric front view of the example integrated electrical assembly configured for installation within a wall.
Figure 23A:
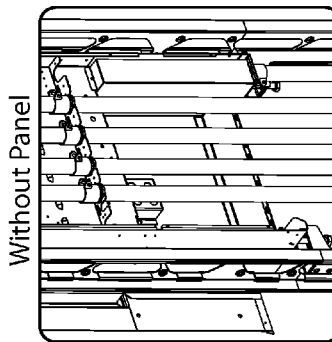
FIG. 23A is an expanded view of the example integrated electrical assembly of FIG. 23 without a back panel.
Figure 23:
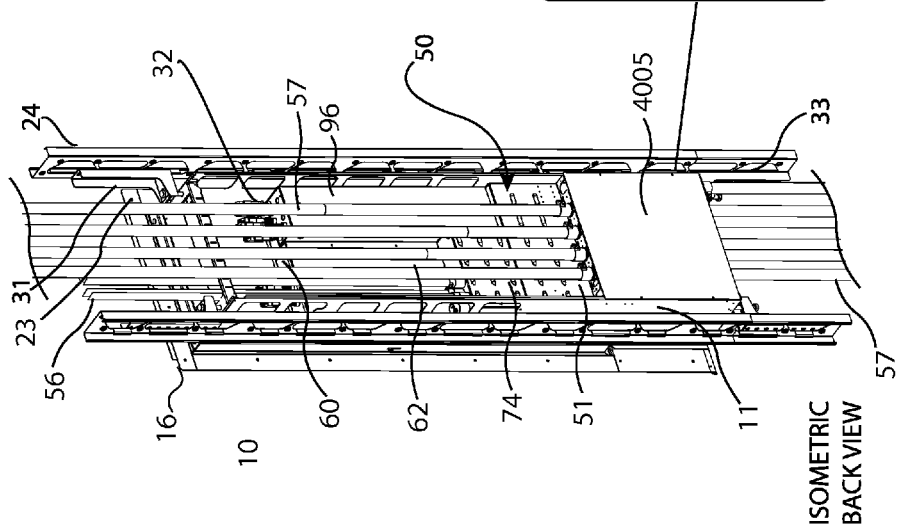
FIG. 23 is an isometric back view of the example integrated electrical assembly configured for installation within a wall.

Referring again to FIGS. 13, 14, 14A and 14B, the integrated electrical assembly 10 may also include a master tub 50 which may be positioned therein for containing one or more components that may be located and/or secured in the integrated electrical assembly 10. The integrated electrical assembly 10 may also include an access panel 30 that provides for access to an area located above the master tub 50 which may permit connections between wiring coming from the integrated electrical assembly 10 to the individual unit to be made. In some embodiments, one or more cable connectors 32, as shown in FIGS. 14, 14A and 14B, may be positioned in the area accessible through the access panel 30 which may allow for the appropriate connections to be made. The one or more cable connectors 32 may be pre-wired whip connectors and/or color coded MC cable connectors.

FIG. 72 is a generalized schematic view of example electrical connections between example components of an integrated electrical assembly arranged in accordance with at least some embodiments described herein. Example connections between one or more cable connectors 32 connected to one or more components, for example a low voltage power supply unit 60 and load center 90, and loads within the individual unit of the integrated electrical assembly 10 are shown. In some embodiments, since the cable connectors 32 may be used to make the wiring connections between the components of the integrated electrical assembly 10 and loads of the individual unit, for example outlets, lighting, appliances, etc., the wiring from the components of the integrated electrical assembly 10 to the loads of the individual unit may be efficiently made. The one or more components of the integrated electrical assembly 10 may be easily removed and/or replaced for upgrade and/or repair since the components may be pre-wired and connected to the loads of the individual unit through the cable connectors 32. This may reduce the amount of labor time required to install the integrated electrical assembly 10, because the connections may be made to prewired loads within the individual unit. In some embodiments, the prewired loads of the individual unit may be contained in one or more junction boxes 5001 throughout the individual unit, and the junction boxes and related wiring may be prewired into the walls of the individual unit prior to construction of the individual unit within the building structure. The various components described in FIG. 72 are merely examples, and other variations, including eliminating components, combining components, and substituting components are all contemplated.

Referring back to FIGS. 13, 14, and 14B, in some embodiments, the integrated electrical assembly 10 may be secured to the wall supports 24 by one or more support brackets 31. In some embodiments, the support brackets 31 may be configured so as to be able to be adjustably secured to the wall supports 24 in a manner that allows for adjustment at both the wall support 24 and/or the integrated electrical assembly 10 through use of one or more support fasteners 44 that may be configured to connect the support brackets 31 to the integrated electrical assembly 10. In some embodiments, the support brackets 31 and connections between the support brackets 31, integrated electrical assembly 10 and wall supports 24 may be configured so that the loading and stress of the integrated electrical assembly 10 may be shared between the wall 22 and the wall supports 24. In some embodiments, the integrated electrical assembly 10 may be preinstalled on a wall 22, and then the wall 22 may be transported to the building structure site and installed in the building structure with the integrated electrical assembly 10 secured to the wall during transport and installation. In some embodiments, the integrated electrical assembly may be 300-700 lbs.

Figure 25:
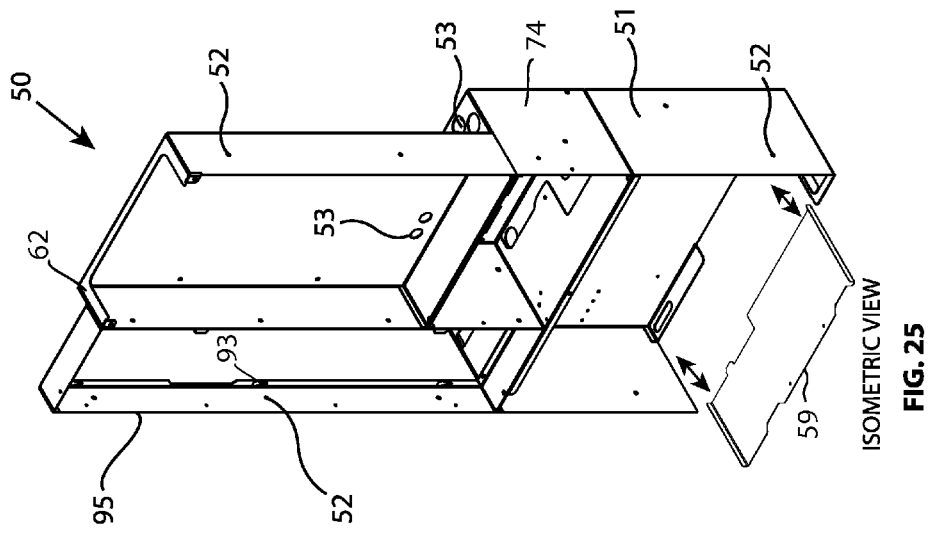
FIG. 25 is an isometric front view of an example master tub that may be used with an integrated electrical assembly.
Figure 26:
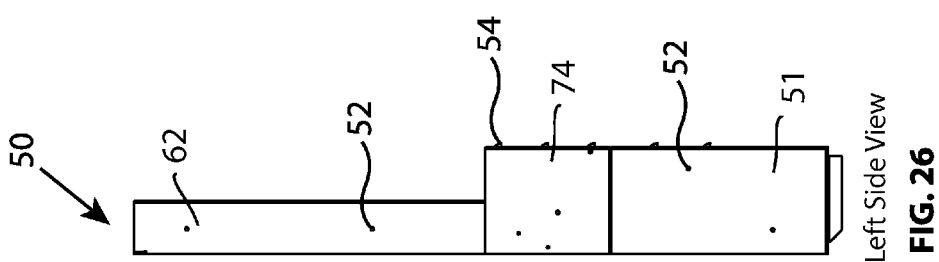
FIG. 26 is a left side view of the example master tub that may be used with an integrated electrical assembly.

FIG. 25 is an isometric front view of an example master tub that may be used with an integrated electrical assembly arranged in accordance with at least some embodiments described herein. FIGS. 26-29 show additional views of the example master tub that may be used with an integrated electrical assembly arranged in accordance with at least some embodiments described herein. In some embodiments, the master tub 50 may contain one or more enclosures 51, 62, 74 that are configured and positioned to each contain one or more components that may be used in the integrated electrical assembly 10. In some embodiments, the master tub 50 may be used as a stand-alone unit. For example, in a dry, indoor location, the mater tub 50 may be installed alone in a wall or on a wall. In some embodiments, the master tub 50 may include one or more components when used as a stand-alone unit. In some embodiments, the master tub 50 may also include a load center housing collar 95 that may be configured to secure a load center to the master tub 50, as discussed further below. The various components described in FIGS. 25-29 are merely examples, and other variations, including eliminating components, combining components, and substituting components are all contemplated. For example, the enclosures 51, 62, 74 may be different dimensions or arranged in a different orientation. In some embodiments, the master tub 50 may include more or less enclosures. The dimensions, orientation, and number of enclosures may be selected based, at least in part, on the space and/or power requirements of the building structure and/or subspace of the building structure.

In some embodiments, enclosures 51, 62, 74 and/or load center housing collar 95 of the master tub 50 may be secured to each other by suitable means, such as by welding, bolting or riveting the enclosures 51, 62, 74 and load center housing collar 95 together in order to form the master tub 50. In some embodiments, the enclosures 51, 62, 74, and load center housing collar 95 may be made from a metal, such as cold rolled steel, galvanized steel, galvanealed steel, or stainless steel. The enclosures 51, 62, 74, and load center housing collar 95 may be tack welded together and then painted. Tack welding prior to painting may allow the enclosures 51, 62, 74, and load center housing collar 95 to be electrically connected. This may allow enclosures 51, 62, 74, and load center housing collar 95 to be grounded.

In some embodiments, the one or more enclosures of the master tub 50 may include a main electrical feed enclosure 51, a low voltage enclosure 62 and/or a data-com enclosure 74. In some embodiments, each of the enclosures 51, 62, 74 and the load center housing collar 95 may include one or more securing holes 52 that may be used to secure the master tub 50 to the integrated electrical assembly 10 at one or more locations by suitable fastening devices (not shown), such as screws, bolts, pins or rivets. In some embodiments, each enclosure 51, 62, 74 may also include one or more opening/knock-out 53 in order to allow wiring and other connections to be made to the components contained within the master tub 50. The enclosures 51, 62, 74 may also include ventilation ports 54 in order to provide air cooling and/or circulation for the components that may be installed in each enclosure 51, 62, 74 in some embodiments. In some embodiments, the master tub 50 may provide for separate enclosures 51, 62, 74 and the load center housing collar 95 for the various components that may be included in the integrated electrical assembly 10 which may allow for separate National Recognized Testing Laboratory (NRTL) or foreign equivalent listings for each enclosure. In some embodiments, the separate enclosures 51, 62, 74 and the load center housing collar 95 may not share walls. In some embodiments each enclosure 51, 62, 74 may be individually sealed. In some embodiments, the master tub 50 may be environmentally sealed. In some embodiments, the integrated electrical assembly 10 may be configured with the master tub 50 so as to provide an inherently protected type NRTL listing that requires zero clearance to combustible materials for installation in wood stud wall and clothing closets with clothes in direct contact with such enclosures 51, 62, 74. In some embodiments, the master tub 50 may also include a removable access panel 59 that may be removable from the main electrical feed enclosure 51. The removable access panel 59 may be configured to provide access to the power distribution blocks 43 of the master feed enclosure 40 which may allow for installation of electrical feeds to the power distribution blocks 43 in the master integrated electrical assembly 10. In some embodiments, the removable access panel 59 may also provide for access to the power distribution blocks 43 which may allow for maintenance, such as tightening of connections made by the power distribution blocks 43.

Figure 30:
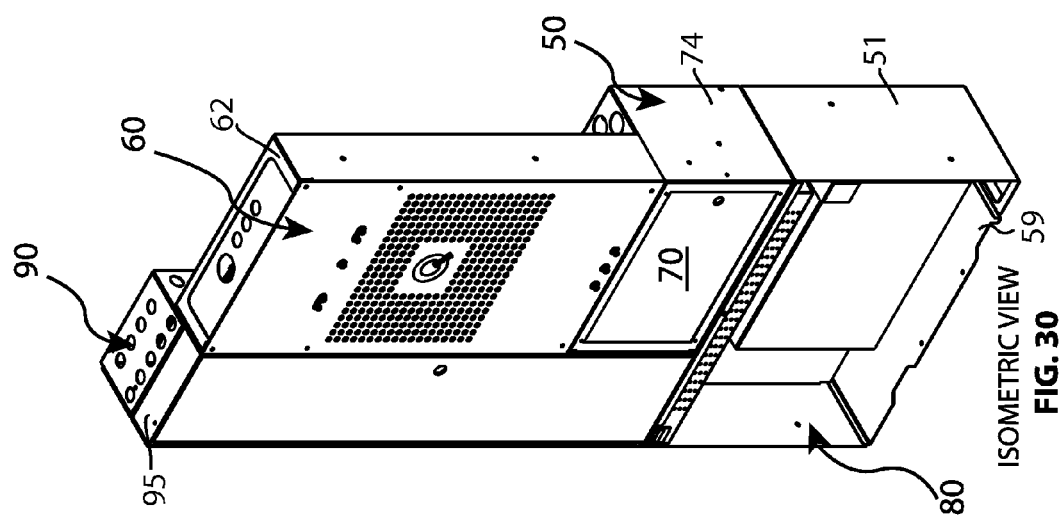
FIG. 30 is an isometric front view of the example master tub with example components installed therein.
Figure 31:
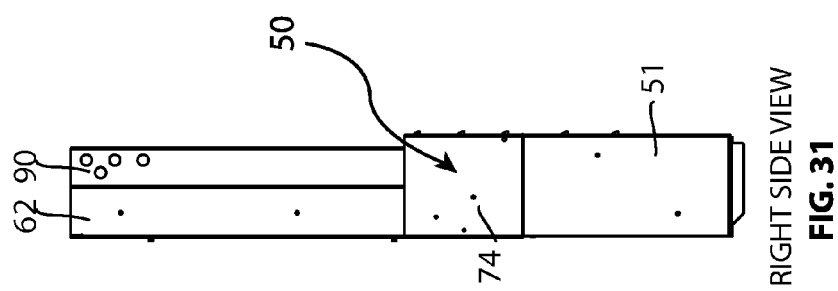
FIG. 31 is a right side view of the example master tub with example components installed therein.
Figure 35:
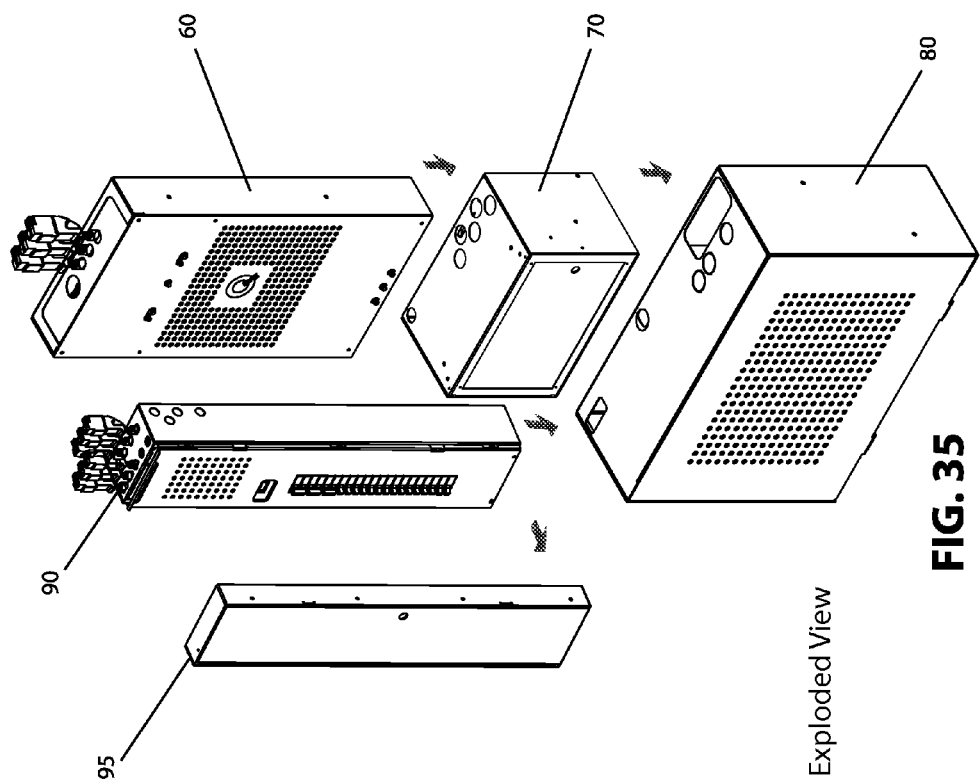
FIG. 35 is an exploded view isometric view of how the example components may be arranged within the example master tub.
Figure 43A:
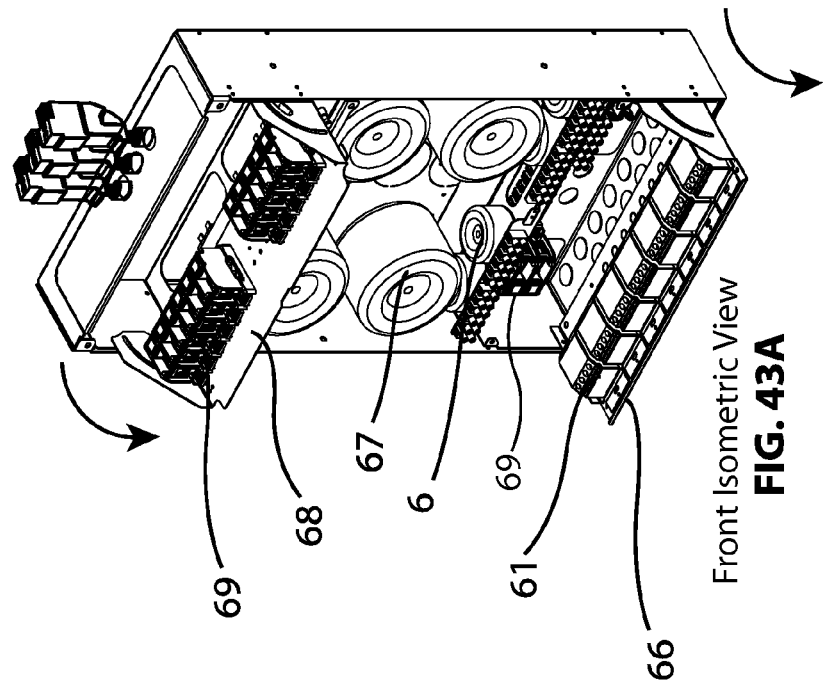
FIG. 43A is a front isometric view of another example low voltage power supply unit that may be used with an integrated electrical assembly with its control compartment and connection compartment in open positions.
Figure 43:
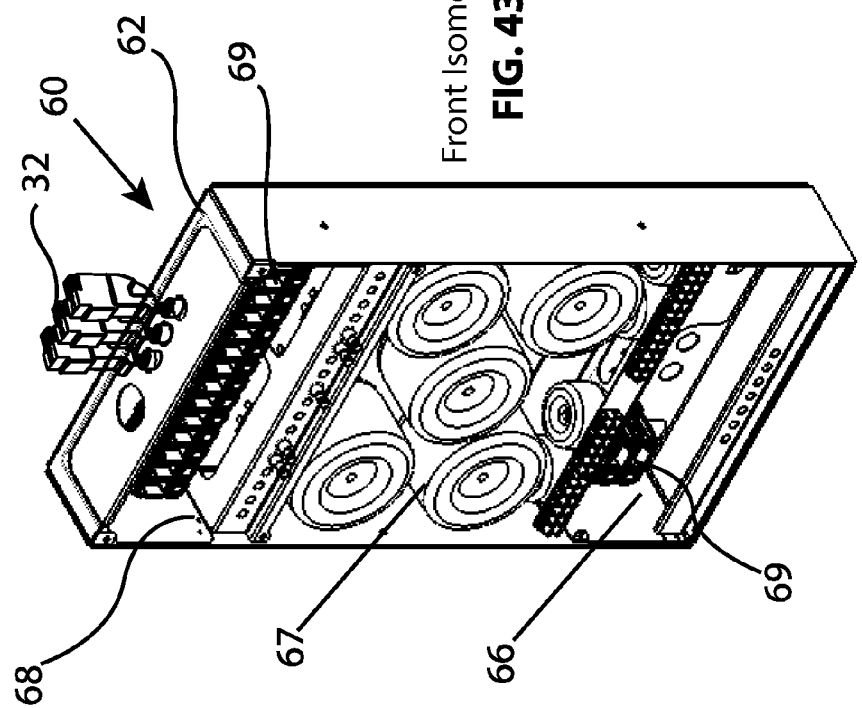
FIG. 43 is a front isometric view of the example low voltage power supply unit that may be used with an integrated electrical assembly with the front panel removed.
Figure 46:
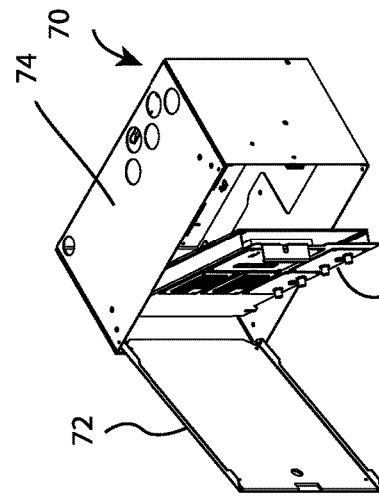
FIG. 46 is a front isometric view of the example data-com component that may be used with an integrated electrical assembly with the door open and a panel partially removed.
Figure 47:
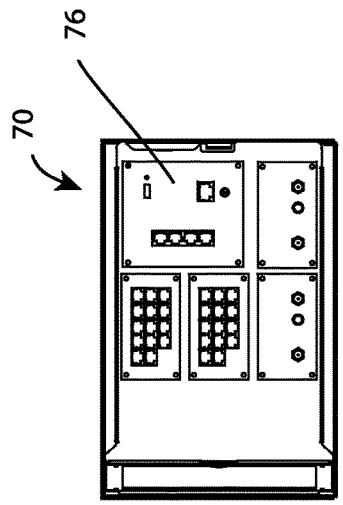
FIG. 47 is a front view of the example data-com component that may be used with an integrated electrical assembly with the door open.
Figure 45:
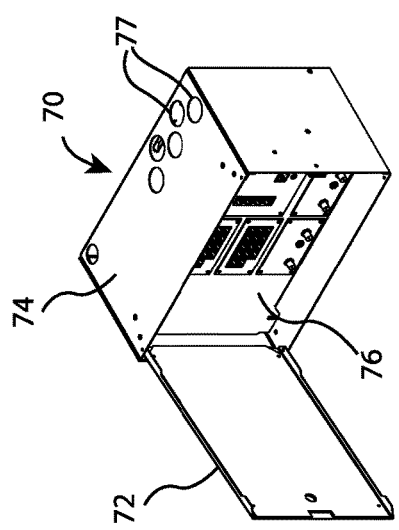
FIG. 45 a front isometric view of the example data-com component that may be used with an integrated electrical assembly with a door open.

FIG. 30 is an isometric front view of the example master tub with example components installed therein arranged in accordance with at least some embodiments described herein. FIGS. 31-35 show additional views of the example master tub with example components installed therein arranged in accordance with at least some embodiments described herein. In some embodiments, the example components may include a low voltage power supply unit 60, a data-com component 70, a main electrical feed unit 80 and/or a load center 90. Each one of these components may be configured to obtain a separate NEMA 1 or equivalent NRLT listing for dry environments. It is understood that the present invention is not limited to any particular type of component or number of components that may be included in the master tub 50 and/or the integrated electrical assembly 10. It is contemplated that a variety of types of components, configuration of components and number of components may be used in various aspects of the present invention, and it is understood that the components and component configurations herein discussed and shown are merely example. The various components described in FIGS. 30-35 are merely examples, and other variations, including eliminating components, combining components, and substituting components are all contemplated.

Referring now to FIGS. 36-43 and 43A, various views of an example low voltage power supply unit 60 that may be installed in the integrated electrical assembly 10 or used as a stand-alone unit is shown arranged in accordance with at least some embodiments described herein. In some embodiments, low voltage power supply unit 60 may be installed in the low voltage enclosure 62 of the master tub 50 or include a separate low voltage enclosure 62. By providing the low voltage power supply unit 60 with the capability of being installed in the low voltage enclosure 62 of the master tub 50, a power tray 64 of the low voltage power supply unit 60 may be pre-wired and pre-fabricated, and then may be attached to the low voltage enclosure 62 of the master tub 50 of the integrated electrical assembly 10. In some embodiments, in the event that the low voltage power supply unit 60 needs to be replaced for upgrade and/or repair the power tray 64 of the low voltage power supply unit 60 may be easily removed and replaced. The low voltage power supply unit 60 may also be provided with a low voltage cover 63 for installation over the power tray 64 position within the low voltage enclosure 62. The various components described in FIGS. 36-43 and 43A are merely examples, and other variations, including eliminating components, combining components, and substituting components are all contemplated.

Still referring to FIGS. 36-43 and 43A, the power tray 64 may be configured to contain one or more components of the low voltage power supply unit 60. In some embodiments, the power tray 64 may include a line voltage control compartment 66 with a fold-out door for accessibility to the line voltage control compartment 66, and a low voltage connection compartment 68 that may also include a fold-out door for accessibility to the low voltage connection compartment 68. In some embodiments, the line voltage control compartment 66 and the low voltage connection compartment 68 may also not be provided with a fold-out door, as shown for example in FIG. 43, and in this configuration the components within the compartments may be secured directly to the compartments. In some embodiments, separating the line voltage from the low voltage components may provide for additional electronic shock safety. The low voltage connection compartment 68 may be configured for making appropriate low voltage connections between the low voltage power supply unit 60 and low voltage devices of a building structure, subspace of the building structure and/or individual units of the building structure. In some embodiments, the line voltage control compartment 66 may include one or more control devices 61, for example dimmers, timers and/or switches that may be manually, wired or wirelessly controlled, for example by RF control. In some embodiments, the line voltage control compartment 66 may also include one or more multi-wire connectors 69. In some embodiments, the low voltage connection compartment 68 may also include one or more multi-wire connectors 69 that may be configured to connect wiring from the one or more cable connectors 32 that may be installed on the low voltage power supply unit 60.

FIG. 73 is an isometric view of an example multi-wire connector that may be used with the integrated electrical assembly arranged in accordance with at least some embodiments described herein. FIGS. 74-85 and 75A-81A show additional views of the example multi-wire connector that may be used with the integrated electrical assembly arranged in accordance with at least some embodiments described herein. In some embodiments, the example multi-wire connector 69 may be used with the low voltage power supply unit 60. In some embodiments, the multi-wire connector 69 may include a terminal block 6922 that may contain two or more set screws 6912 that may be loosened and tightened relative to the terminal block 6922. In some embodiments, the terminal block 6922 may be made from tin or nickel plated copper or copper alloy, and the set screws 6912 may be made from a stainless steel. In some embodiments, the terminal block 6922 may have one or more grooves 6924 formed in a bottom surface of the terminal block 6922. The grooves 6924 may be configured and positioned within the terminal block 6922 so as to provide an improved frictional surface for the capture of wires installed in the terminal block 6922.

In some embodiments, the multi-wire connector 69 may also include a housing 6910 that may be dimensioned to receive and contain the terminal block 6922, but may allow for ventilation space 6935 between the housing 6910 and the terminal block 6922. The ventilation space 6935 may be configured for dissipation of heat that may be generated by the terminal block 6922 while in use, and may reduce the amount of heat that may be retained by the housing 6910 of the multi-wire connector. The volume of the ventilation space 6935 may be determined, at least in part, by the heat dissipation desired for the application. Since ampacity is determined by temperature rise, the ventilation space 6935 may allow higher ampacity ratings for multi-wire connector 69, lower operating temperatures and an increased level of safety. In some embodiments, the housing 6910 may be made from a polycarbonate resin thermoplastic, and may be transparent and/or clear, which may facilitate installation and inspection by allowing increased visualization of the components of the multi-wire connector 69. In some embodiments, the housing 6910 may be implemented using another flame resistant, nonconductive material. In some embodiments, the housing 6910 may include a strip length guide 6926 which may facilitate proper installation of wiring into the multi-wire connector 69. In some embodiments, the housing 6910 of the multi-wire connector 69 may also include a set screw cover 6914 positioned over one or more of the set screws 6912 and may be configured for movement between an open (e.g FIG. 73) and a closed position (e.g. FIG. 78). In some embodiments, the set screw cover 6914 may also contain an indication (not shown) that may provide information regarding the multi-wire connector 69. In some embodiments, the set screw cover 6914 may also provide an openable cover which may prevent an installer from adjusting and/or loosening of a set screw 6912 that may connect to wiring that has been pre-wired prior to installation of the multi-wire connector 69. In some embodiments, a color coded plug in (not shown) may also be inserted into the set screw 6912 that may provide additional visual indications.

In some embodiments, the housing 6910 of the multi-wire connector 69 may also include mounting tabs 6928, 6930 that may be configured to secure the housing 6910 to a base mount 6916 that may also be included in the multi-wire connector 69. In some embodiments, the base mount 6916 may include a housing lock and release tab 6920, the operation and function of which will be discussed further below. The base mount 6916 may be made from polycarbonate resin thermoplastic. The various components described in FIGS. 73-85 and 75A-81A are merely examples, and other variations, including eliminating components, combining components, and substituting components are all contemplated.

Referring to FIGS. 73-83, which show the housing 6910 of the multi-wire connector 69 attached to the base mount 6916, one of the mounting tabs 6930 may slide into the base mount 6916, and then the housing 6910 pressed towards the base mount 6916 which may cause the other mounting tab 6928 to be secured by the housing lock and release tab 6920 in some embodiments. The housing lock and release tab 6920 may be configured to snap onto the mounting tab 6928 which may removably secure the housing 6910 to the base mount 6916, as shown for example in FIGS. 76B and 76C. In some embodiments, base mount 6916 may allow for inspection during installation, facilitate maintenance and shorten installation time. In some embodiments, one or more base mounts 6916 may be molded together which may provide a bank of base mounts 6916 for one or more housings 6910 to be secured to.

Referring now to FIGS. 80-81, the multi-wire connector 69 may be secured to a surface by one or more mounting fasteners 6918 secured to the base mount 6916 and the surface in some embodiments. In this configuration, the multi-wire connector 69 may be removed from the base mount 6916 which may facilitate wiring connections made with the multi-wire connector 69. In some embodiments, as shown in FIGS. 80A-81A, the multi-wire connector 69 may be secured directly to a surface by one or more mounting fasteners 6918 through the mounting tabs 6928, 6930. The mounting fasteners 6918 may be any known fasteners, such as screws or bolts. The various components described in FIGS. 80-81 are merely examples, and other variations, including eliminating components, combining components, and substituting components are all contemplated.

In some embodiments, the multi-wire connector 69 may be configured to secure one or more wire to the terminal block 6922 by one of the set screws 6912, and then one or more other wire to the terminal block 6922 by the other set screws 6912. In some embodiments, two set screws 6912 may be used to secure more than one wire to the terminal block 6922. For example, the multi-wire connector 69 may be configured to accommodate any combination of wire types and sizes. The wire type, sizes, and quantity of wires that may be accommodated by the terminal block 6922 may be determined by the cross-sectional area of the opening of the terminal block 6922. The cross-sectional area of the opening of the terminal block 6922 may be configured to accommodate a desired combination of wires. The multi-wire connector 69 may be configured to be Underwriters Laboratories (UL) listed as a recognized component that may accommodate any wire size from No. 18 AWG to No. 1/0, and may be configured to accommodate at least 1-2 No. 4 AWG, 1-4 No. 6 AWG, 1-6 No. 8 AWG, 1-10 No. 10 AWG, 1-16 No. 12 AWG, 1-25 No. 14 AWG, 1-40 No. 16 AWG and/or 1-65 No. 18 AWG. In some embodiments, the multi-wire connector 69 may also be configured for voltages up to and including 600V, and amperage up to and including 150 amps. In some embodiments, the amperage may be increased by increasing the thickness of the walls of the terminal block 6922. In some embodiments, the multi-wire connector 69 may also be configured to obtain UG ratings of B, C and/or D. In some embodiments, a multi-wire connector terminal block may improve the quality of installation, shorten installation time, and may thereby lower labor related costs.

Referring now to FIG. 72, an example use of the multi-wire connector 69 for the integrated electrical assembly 10 is shown. In some embodiments, the multi-wire connector 69 may be used to connect one or more wires coming from the load center 90 to the low voltage power supply unit 60. The connections from the components of the low voltage supply unit 60 may have already been made to the multi-wire connector 69 so that to connect the load center 90 wiring to the low voltage power supply unit 60, connections between the wiring and the multi-wire connector 69 may be made. In some embodiments, the low voltage power supply unit 60 may include a fan (not shown) that may augment the heat dissipation of the ventilation space 6935 of the multi-wire connectors 69.

Referring again to FIGS. 36-43 and 43A, in some embodiments, the power tray 64 may also be configured to contain one or more transformers, for example torrodial transformers, current transformers, bridge rectifiers, capacitors, inductors, such as chokes, electronic drivers, for example electronic LED drivers and dimmers. The power tray 64 of the low voltage power supply unit 60 may be configured for AC or DC output depending upon the load requirements to the building structure, subspace of the building structure, and/or individual unit of the building structure. In some embodiments, the low voltage power supply unit 60 may be configured to supply the lighting systems of the individual unit and/or building structure. Some advantages of low voltage lighting may include: may be safer than line voltage lighting, may allow for smaller fixtures, may reduce noise, may have minimal EMF and may allow for live conductors to be used, such as cable or rail conductor systems. As used herein, "low voltage" refers to voltage levels of 30V or less. In some embodiments, the power tray 64 may also include one or more 120/120V isolated power supplies, which may be used for hospital related purposes. As shown in FIGS. 41-43 and 43A the power tray 64 of the low voltage power supply unit 60 may include one or more transformer 67 and may include one or more inductor 6. The low voltage power supply unit 60 may also include one or more circuit breakers 65, which may protect line voltage and/or low voltage circuits.

Referring now to FIGS. 63-67, another example low voltage power supply unit 160 that may be installed in the integrated electrical assembly 10 or used as a standalone unit is shown arranged in accordance with at least some embodiments described herein. In some embodiments, the low voltage power supply unit 160 may be installed in the low voltage enclosure 62 of the master tub 50 or may include a separate low voltage enclosure 162. The low voltage power supply unit 160 may also be provided with a low voltage cover 163 for installation over the low voltage enclosure 62, 162. When the low voltage power supply unit 160 may be a standalone unit, one or more surface wall mounting brackets 185 may be affixed to the low voltage enclosure 162 which may secure the low voltage power supply unit 160 to a wall surface. In some embodiments, the power tray 164 may include a line voltage control compartment 166 with a fold-out door for accessibility to the line voltage control compartment 166, and a low voltage connection compartment 168 that may also include a fold-out door that may provide accessibility to the low voltage connection compartment 168. The various components described in FIGS. 63-67 are merely examples, and other variations, including eliminating components, combining components, and substituting components are all contemplated.

In some embodiments, the low voltage connection compartment 168 may be configured for making appropriate low voltage connections between the low voltage power supply unit 160 and low voltage devices of the building structure and/or individual units of the building structure. In some embodiments, the line voltage control compartment 166 may include one or more control devices 161, for example dimmers, timers and/or switches that may be manually, wired or wirelessly controlled, such as RF controlled. In some embodiments, the line voltage control compartment 166 may also include one or more multi-wire connectors (not shown). In some embodiments, the low voltage connection compartment 168 may also include one or more multi-wire connectors (not shown) that may be configured to connect wiring from the one or more connectors (not shown) that may be installed on the low voltage power supply unit 160. In some embodiments, the power tray 164 may include one or more transformer 167, one or more inductor 106, one or more capacitor 107 and one or more bridge rectifier 105 or combinations thereof. However, it is understood that the present invention is not limited to any particular combinations or types of components installed in the power tray 164 of the low voltage power supply unit 160. Instead, it is understood that any combination of transformers, inductors, capacitors, rectifiers and/or dimmers may be included in the low voltage power supply unit 160. In some embodiments, one or more capacitors 107 may be included in the low voltage power supply unit 160, and the low voltage enclosure 162 may include an extension cover 103 for covering the part of the capacitors 107 that may extend out of the low voltage enclosure 162. In some embodiments, the low voltage power supply unit 160 may also include one or more circuit breakers 165, which may protect line voltage and/or low voltage circuits.

Referring now to FIGS. 68-70, another example low voltage power supply unit 260 that may be installed in the integrated electrical assembly 10 or used as a stand-alone unit is shown arranged in accordance with at least some embodiments described herein. In some embodiments, the low voltage power supply unit 260 may be installed in the low voltage enclosure 62 of the master tub 50 or may include a separate low voltage enclosure 262. In some embodiments, the low voltage power supply unit 260 may also be provided with a low voltage cover (not shown) for installation over the low voltage enclosure 62, 262. In some embodiments, the low voltage power supply unit 260 may include a power tray 264. The power tray 264 may include a line voltage connection compartment 266 with a fold-out door for accessibility to the line voltage connection compartment 266, and a low voltage connection compartment 268 that may also include a fold-out door for accessibility to the low voltage connection compartment 268. In some embodiments, one or more of the fold-out doors are not present. In these embodiments, the components may be secured directly to the compartment. The low voltage connection compartment 268 may be configured for making appropriate low voltage connections between the low voltage power supply unit 260 and low voltage devices of the building structure and/or individual units of the building structure. The various components described in FIGS. 68-70 are merely examples, and other variations, including eliminating components, combining components, and substituting components are all contemplated.

In some embodiments, the line voltage connection compartment 266 may include one or more control devices 261, for example dimmers, timers and/or switches that may be manually, wired or wirelessly controlled, such as RF controlled. In some embodiments, the line voltage connection compartment 266 may also include one or more multi-wire connectors (not shown). The low voltage connection compartment 268 may also include one or more multi-wire connectors (not shown) that may be configured to connect wiring from the one or more connectors (not shown) that may be installed on the low voltage power supply unit 260. In some embodiments, the low voltage power supply unit 260, the power tray 264 may include one or more electronic LED driver 204 and may include one or more driver dimmer 208. However, it is understood that the present invention is not limited to any particular combinations or types of components installed in the power tray 264 of the low voltage power supply unit 260. Instead, it is understood that any combination of transformers, inductors, capacitors, rectifiers and/or dimmers may be included in the low voltage power supply unit 260. The low voltage power supply unit 260 may also include one or more circuit breakers 265, which may protect line voltage and/or low voltage circuits.

Figure 44:
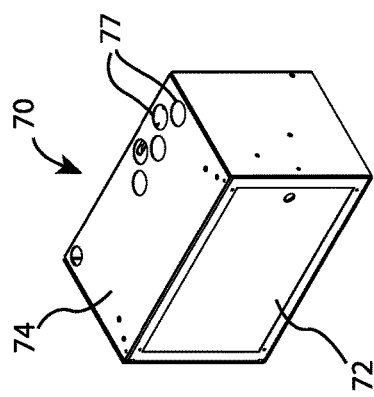
FIG. 44 is a front isometric view of an example data-com component that may be used with an integrated electrical assembly.

FIG. 44 is a front isometric view of an example data-com component that may be used with an integrated electrical assembly arranged in accordance with at least some embodiments described herein. FIGS. 44A-44D and 45-47 show additional views of the example data-com component that may be used with an integrated electrical assembly arranged in accordance with at least some embodiments described herein. In some embodiments, the example data-com component 70 may be installed in the integrated electrical assembly 10. In some embodiments, the data-com component 70 may be installed in the data-com enclosure 74 of the master tub 50. In some embodiments, the data-com component 70 may include an access door 72, which may be formed from solid steel, have a steel frame with a plastic door or be formed from a clear plastic or similar material, and a data-com panel 76 configured for allowing appropriate connections to be made to the data-com component 70. The various components described in FIGS. 44, 44A-44D and 45-47 are merely examples, and other variations, including eliminating components, combining components, and substituting components are all contemplated.

In some embodiments, the data-com panel 76 is configured for removal from the data-com component 70 which may allow installation and/or repair of the wiring connected to the data-com panel 76. In some embodiments, the data-com panel 76 may be removable, which may allow the data-com panel 76 to be upgraded to accommodate newer technologies. The data-com component 70 may also include one or more openings/knock-outs 77 which may allow wiring and/or other parts of the data-com component 70 to be connected to other locations outside of the data-com component 70. In some embodiments, the data-com component 70 within the data-com enclosure 74 may be a Class 2 enclosure, and the data cables provided to the enclosure may be run inside flexible plastic conduit. This may allow for efficient re-wiring of the data-com component 70 in the event of repair and/or upgrade to the wiring of the data-com component 70. Example wires and components that may be run into and included in the data-com component include television wires, such as coaxial cables, fiber optics, CAT 5 or higher communication wires, routers, and other entertainment, WI-FI and telephone wires and components. For example, as shown in FIG. 86, the data-com component 70 of the integrated electrical assembly 10 may be configured to receive one or more data-com wires and/or conduits from a data-com distribution panel of the building structure. In some embodiments, the data-com wire for the individual unit of the integrated electrical assembly 10 may be connected to the data-com panel 76 of the data-com component 70 in order to provide the appropriate data-com services to the ports of the data-com panel 76. Additional data-com wires and/or conduits may be passed through the data-com component 70 of the integrated electrical assembly 10 and into one or more low voltage risers 57 (shown in greater detail in FIGS. 14C, 14D and 14E) that may be connected to another integrated electrical assembly 10 on a separate floor of the building structure in some embodiments. The additional data-com wires and/or conduits may then be appropriately connected to the data-com panel 76 of the data-com component 70 for that integrated electrical assembly 10. In some embodiments, when the data-com components 70 of the integrated electrical assemblies 10 of the building structure may be connected in this manner it may allow for efficient re-wiring of the data-com components 70 from the data-com distribution panel which may allow for upgrades and/or repairs to be made to the data-com system of the building structure.

Figure 48A:
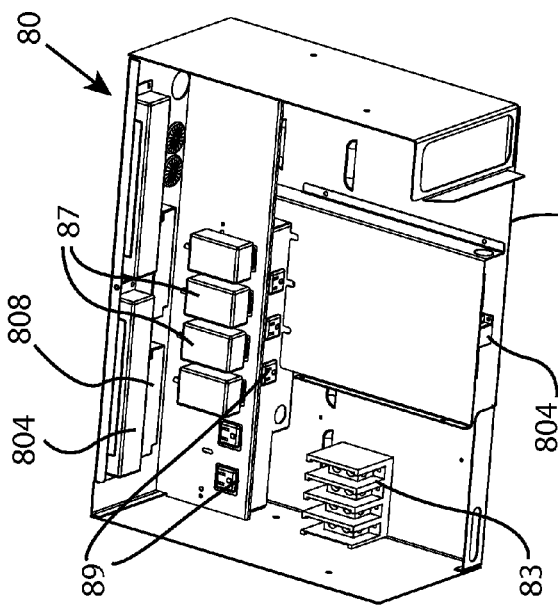
FIG. 48A is a front isometric view of an example alternative power unit that may be used with an integrated electrical assembly with the cover removed.
Figure 50B:
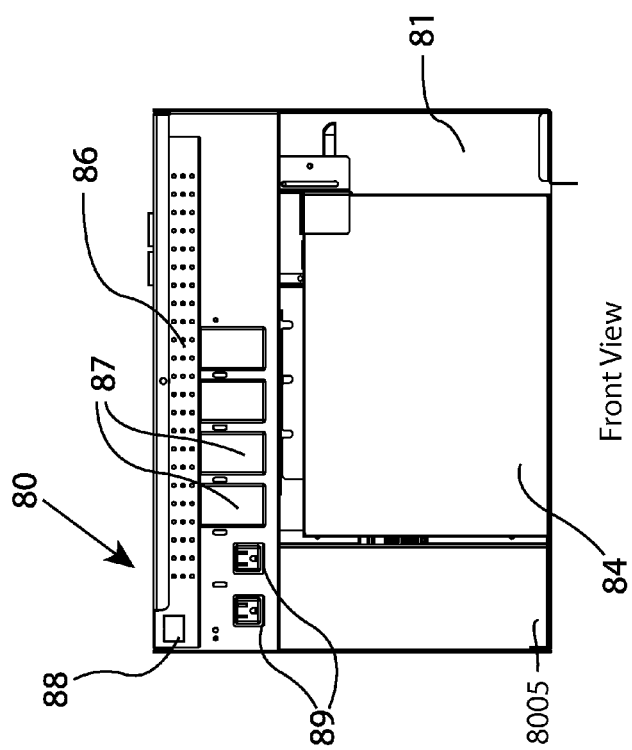
FIG. 50B is a front view of the example alternative power unit that may be used with an integrated electrical assembly with an example cover removed.
Figure 54:
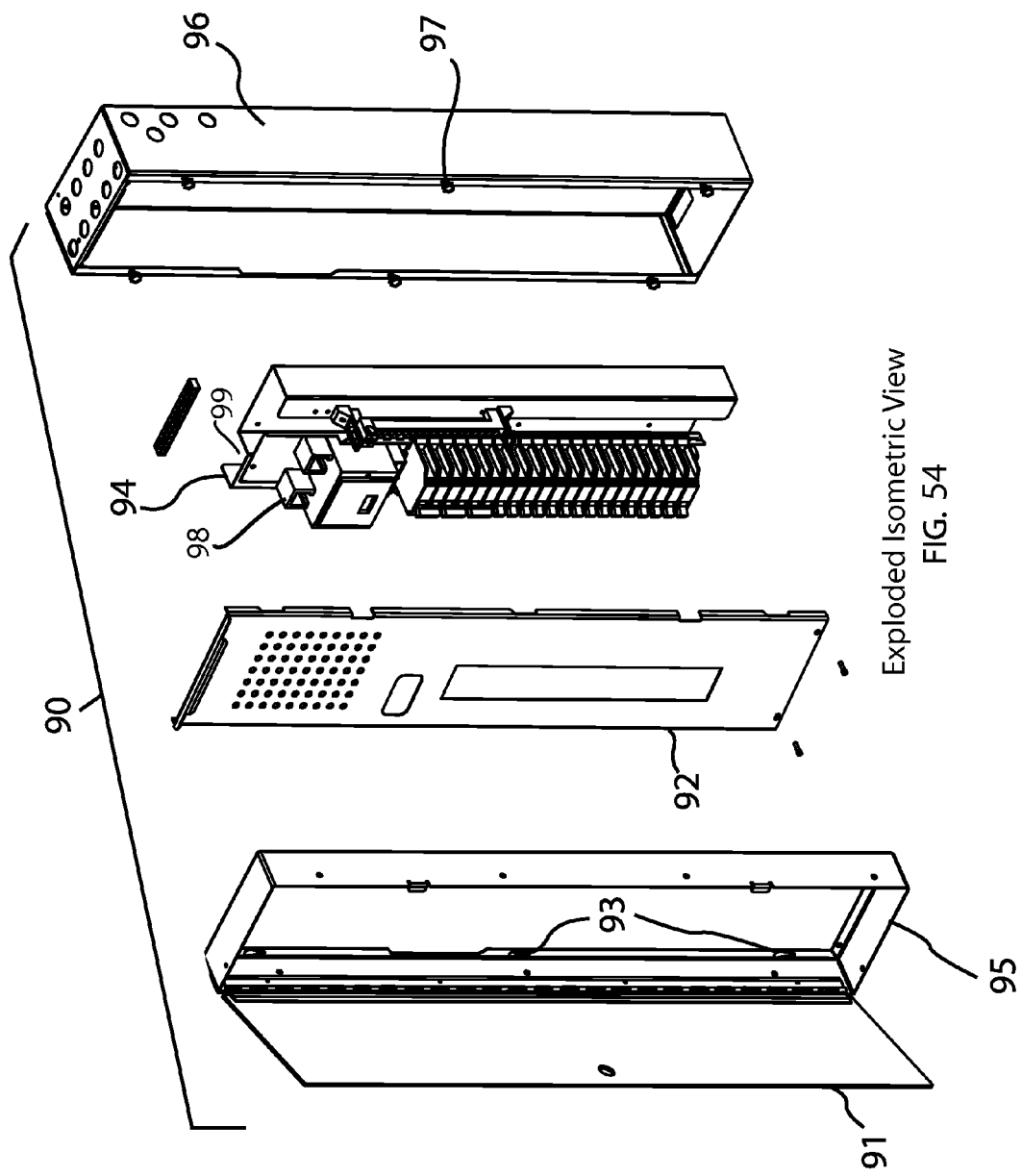
FIG. 54 is an exploded isometric front view of the example load center that may be used with an integrated electrical assembly.
Figures 58, 59:
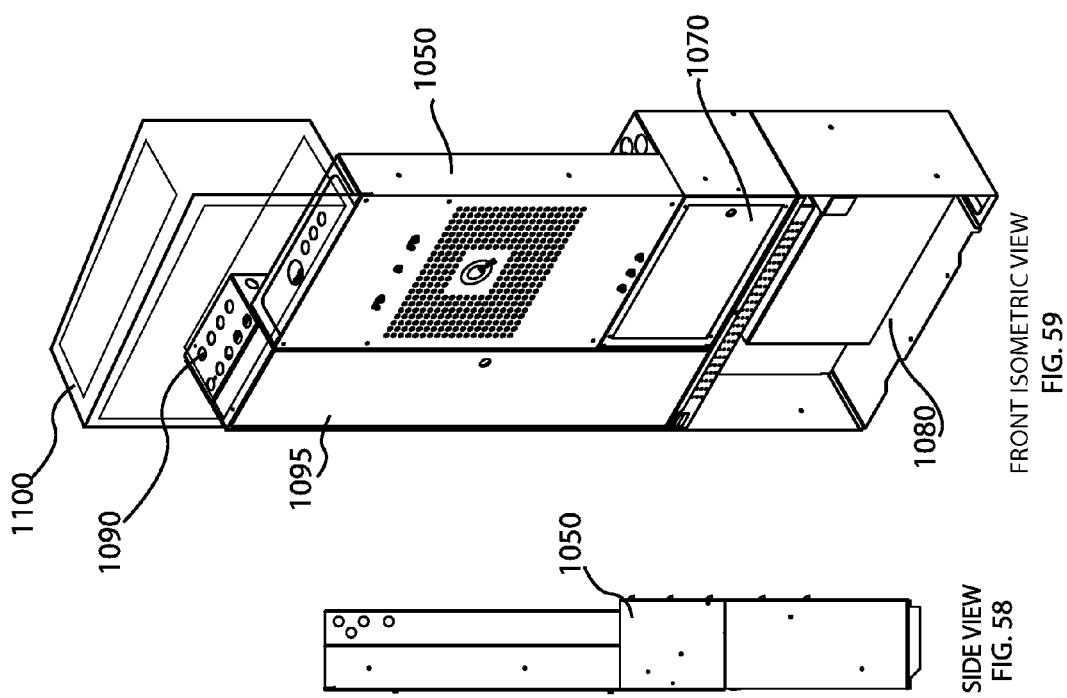
FIG. 58 is a side view of an example master tub that may be used with the other example integrated electrical assembly.
FIG. 59 is a front isometric view of the example master tub with example components that may be used with the other example integrated electrical assembly.
Figure 95:
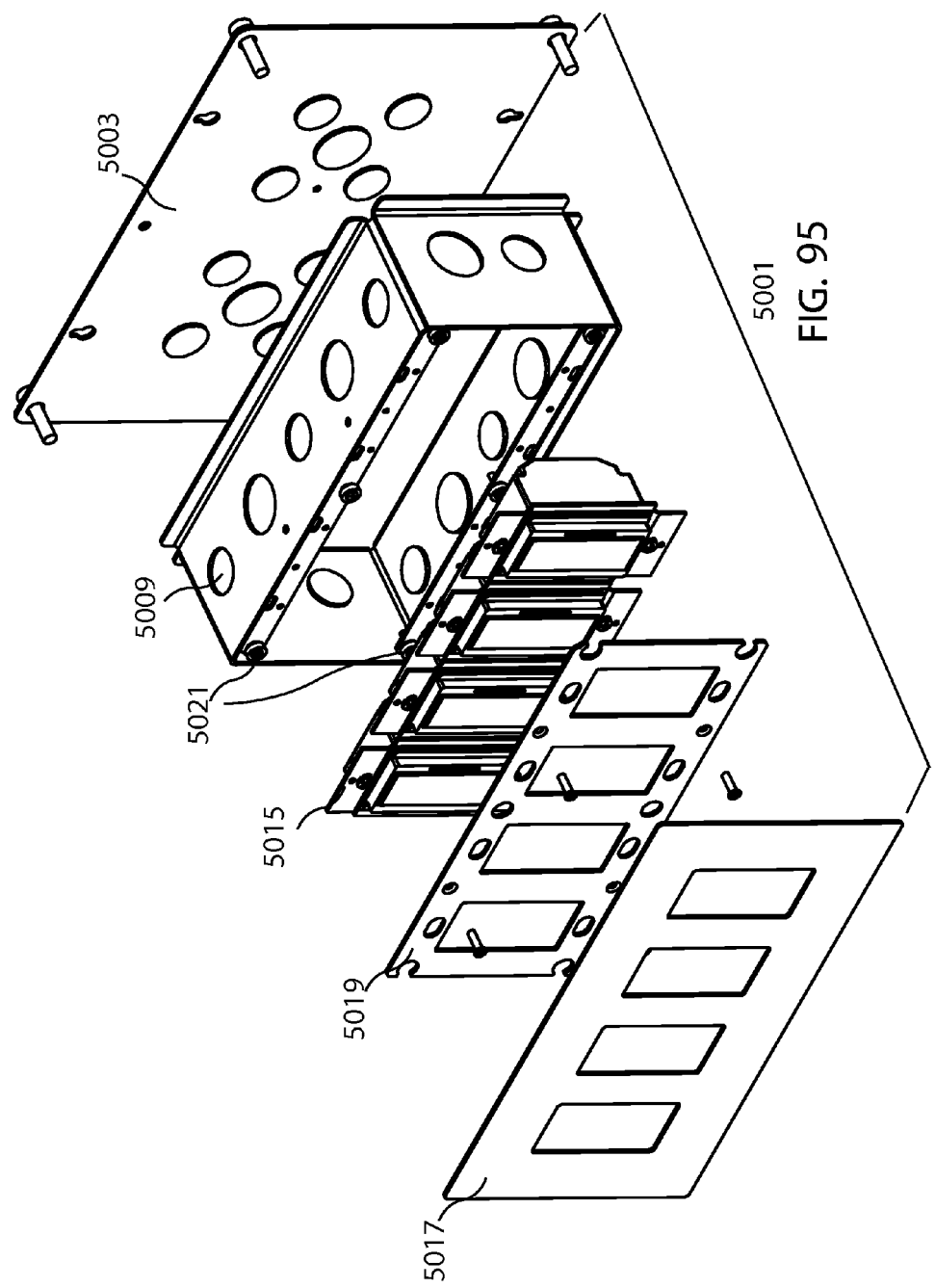

FIG. 48 is a front isometric view of an example alternative power unit that may be used with an integrated electrical assembly arranged in accordance with at least some embodiments described herein. FIGS. 48A, 49, 50A, 50B and 51 show additional views of the example alternative power unit that may be used with an integrated electrical assembly arranged in accordance with at least some embodiments described herein. In some embodiments, the example main electrical feed unit 80 may be installed in the integrated electrical assembly. In some embodiments, the main electrical feed unit 80 of the integrated electrical assembly may include an electrical assembly power distribution block 83 that may be configured for connection to an electrical feed line from an electrical room, if the integrated electrical assembly 10 is acting as the master electrical distribution node for slave integrated electrical assemblies 10, or to an electrical feed line from the master integrated electrical assembly 10 acting as the electrical distribution node. These arrangements are shown in FIG. 71. In this embodiment, the electrical feed line 7101 for the master integrated electrical assembly 10 may be connected to the electrical assembly power distribution block 83, and the other feed lines 7102, 7103, 7104, 7105, 7106 may be connected to the power distribution blocks 43 of the master integrated electrical assembly 10, and then may be connected to each respective slave integrated electrical assembly 10 by the high voltage risers 56 containing wiring connected to the power distribution blocks 43 of the master integrated electrical assembly 10 and the electrical assembly power distribution blocks 83 of the slave integrated electrical assemblies 10. The electrical assembly power distribution block 83 may also be configured for connection to one or more lugs 98 of the load center of the integrated electrical assembly 10, as discussed further below. The various components described in FIGS. 48, 48A, 49, 50A, 50B and 51 are merely examples, and other variations, including eliminating components, combining components, and substituting components are all contemplated.

Referring again to FIGS. 48, 48A, 49, 50A, 50B and 51, in some embodiments, the main electrical feed unit 80 may also include a high voltage feed cover 8005 that may be positioned to form a compartment within the main electrical feed unit 80 for the electrical assembly power distribution block 83 and the high voltage lines connected to the electrical assembly power distribution block 83. In some embodiments, the main electrical feed unit 80 may also be configured to provide back-up and/or emergency power to other components of the integrated electrical assembly 10 in the event of loss of power. For example, the main electrical feed unit 80 may include a power inverter 84 with a battery unit, for example a 120V inverter. In some embodiments, the power inverter 84 may be an emergency power pack inverter providing 120V which may provide power to transformers, LED drivers to power the building structure's exterior lighting systems, individual units' interior lighting systems and/or emergency lighting systems. In some embodiments, the lighting systems may be used during normal operation and for emergency lighting. In some embodiments, the power inverter 84 may be replaced with a transformer to power hospital outlets which may provide isolated 120V power. In some embodiments, the main electrical feed unit 80 may include a low voltage and/or data-com conduit 81 and a removable cover 82, which may be ventilated. In some embodiments, the main electrical feed unit 80 may also include one or more openings/knock-outs 801 for running appropriate wiring to and/or from the alternative power unit. In some embodiments, the main electrical feed unit 80 may also include an electronic driver and/or dimmer module 86 that includes one or more electronic LED drivers 804 and, if desired, one or more driver dimming modules 808, and a switch 88 that may be coupled to a torrodial transformer and/or the electronic driver and/or dimmer module 86 that may activate low voltage lighting strip 17 when the swing door 12 is opened. In some embodiments, the main electrical feed unit 80 may also include one or more plug-in transformers 87 which may provide low voltage Class 2 power to electronic devices in the data-com component 70 and other compartments and/or to remote external locations within an individual unit. In some embodiments, the main electrical feed unit 80 may also include one or more plugs 89 so that additional electronic devices may be plugged directly into the main electrical feed unit 80.

In some embodiments, the LED drivers 804 may be coupled to the power inverter 84 with a battery in addition to the electrical assembly power distribution block 83. In normal operating conditions, the LED drivers 804 may power one or more LED lighting fixtures in outdoor and/or common areas of a building structure with power from the main electrical feed. In the event of a power outage, the LED drivers 804 may draw power from the battery to power the one or more of the outdoor and/or common areas LED lighting fixtures. The LED lighting fixtures powered by the battery may include all or only a portion of the outdoor and/or common area lighting fixtures. This may allow the lighting system to act as both the normal and emergency lighting system. Separate emergency lighting fixtures may not be necessary to provide light during a power outage.

In some embodiments one or more LED lighting fixtures included in one or more subspaces of a building structure may be powered by the main electrical feed during normal operation and the battery during a power outage. For example, a kitchen light of an apartment unit may be powered by the battery to act as emergency lighting for the apartment unit. In some embodiments, an indicator LED in a subspace of the building structure may indicate a power outage. This may alert an occupant of the subspace of the power outage.

In some embodiments, the emergency lighting system may include a photo detector control element. The photo detector control element may be configured to prevent emergency lighting from operating during daylight. This may conserve battery life for powering the emergency lighting system at evening and nighttime. In some embodiments, the photo detector control element may further be configured to couple the battery to a solar charging system during daylight. This may allow the battery to recharge during a power outage and further extend the period time the battery can operate the emergency lighting during a power outage.

FIG. 52 is a top isometric view of an example load center that may be used with an integrated electrical assembly arranged in accordance with at least some embodiments described herein. FIGS. 53-56 show additional views of the example load center that may be used with an integrated electrical assembly arranged in accordance with at least some embodiments described herein. The example load center 90 may be installed in the integrated electrical assembly 10. In some embodiments, the load center 90 may include a load center door 91, which may be formed from a clear plastic, a load center panel cover 92, a panel 94, a load center housing 96 and lugs 98 which may connect the panel 94 to electrical wiring 7190 (FIGS. 71 and 72) that may be connected to electrical assembly power distribution block 83 of the main electrical feed unit 80. The electrical wiring 7190, shown in simplified form in FIGS. 71 and 72, may be pre-wired to the lugs 98 of the load center 90 so that during installation of the load center 90 and/or integrated electrical assembly 10, connection of the wiring 7190 to the electrical assembly power distribution block 83 may be made. However, it is understood that such wiring 7190 may also be preconnected to the electrical assembly power distribution block 83 prior to installation of the integrated electrical assembly 10. In some embodiments, all feed risers may be pre-wired in the factory, which may reduce installation time on site. In some embodiments, the panel 94 may include typical components found on an electrical panel, such as a supplemental or primary main disconnect, breakers, surge protection devices, grounding bars and neutral bars. In addition to including the typical components, in some embodiments, the panel 94 may also be formed to provide a wire channel 99 within the load center 90 for at least the wiring 7190 (FIGS. 71 and 72). Referring still to FIGS. 52-56, the load center 90 may also include current transformers or other current monitoring devices on the main feeds and/or on one or more circuits protected by circuit breakers that may monitor electrical usage. This may allow for users to review information regarding energy usage, and conserve energy as a result. In some embodiments, demand sensing control devices may also be included which may limit and/or control energy usage. In some embodiments, the load center housing 96, panel 94 and load center panel cover 92 may be configured to be installed and secured to the load center housing collar 95 by one or more fasteners 97. The fasteners 97 may be preinstalled on the load center housing 96, and then the head of the fasteners 97 may be positioned within tapered openings 93 of the load center housing collar 95 and then the fasteners 97 may be tightened in order to secure the load center housing 96 to the load center housing collar 95. Since the load center housing 96 and the panel 94 may be prewired with the appropriate wiring for the building structure and/or individual unit in which the load center 90 will be installed, for the load center housing 96 to be installed to the load center housing collar 95 in the manner discussed above, the appropriate connections may be made between the wiring of the panel 94 to the electrical systems of the building structure and/or individual unit within the building structure. This design may allow for labor related cost savings since much of the required wiring may have been connected in a controlled factory environment. As shown in FIG. 72, in some embodiments, wiring from the load center 90 may be connected to the low voltage power supply unit 60 and/or loads of the individual unit, for example outlets, lighting, appliances, etc. The loads of the individual unit may be connected to the load center 90 either through cable connectors 32 or through hard-wired connections 7205. In some embodiments, the cable connectors 32 may be for pre-wired circuits of the individual unit having certain Amp ratings, e.g. 20 Amps or less, and the hard-wired connections 7205 may allow for greater Amp ratings, e.g. 20 Amps or more. The connections may be made to one or more junction boxes 5001 that may supply the loads of the individual unit. In some embodiments, the junction boxes 5001 may be prewired in the walls of the individual unit prior to construction of the building structure. In some embodiments, the load center 90 may be prewired to connectors 32 that are used to make connections to at least some of the loads of the individual unit, and the load center 90 may be efficiently installed and/or removed from the integrated electrical assembly 10.

Example junction boxes 5001 and 5101 that may be used with the integrated electrical assembly 10 are shown in detail in FIGS. 87-99, 87A-91A and 96A-99A arranged in accordance with at least some embodiments described herein. Referring to FIGS. 87-91 and 95, in some embodiments, the junction box 5001 may include a back panel 5003 with threaded adjustment nuts 5006, a body 5009, at least one switch 5015, an interior cover 5019 that may be configured to secure to the body 5009 so as to cover the components housed within the junction box 5001 and an optional decorative cover 5017 that may be configured to magnetically attach to the junction box 5001 by at least one magnet 5021. The magnet 5021 may be a rare-earth magnet, such as a neodymium magnet. In some embodiments, the at least one switch 5015 may also be other electrical components commonly found in junction boxes, such as outlets. In some embodiments, the back panel 5003 and/or the body 5009 of the junction box 5001 may include one or more knock-outs 5011, and the back panel 5003 and the body 5009 may be secured to each other by suitable welding techniques. Referring now to FIGS. 89A-91A and 95, in some embodiments, the decorative cover 5017 of the junction box 5001 may be removably secured to the junction box 5001 by one or more of the magnets 5021. As shown in FIGS. 89A-91A, even when the decorative cover 5017 is removed from the junction box 5001, the interior of the junction box 5001 may be still covered by the interior cover 5019 so that the components therein may not be exposed. In some embodiments, the junction box 5001 without the decorative cover 5017 may be configured for UL listing. The various components described in FIGS. 87-99, 87A-91A and 96A-99A are merely examples, and other variations, including eliminating components, combining components, and substituting components are all contemplated.

Referring now to FIGS. 92-94, the installation and adjustment of the junction box 5001 on an example wall 5020 will now be discussed. As shown for example in FIG. 92, the junction box 5001 may be configured for installation from the back surface of the wall 5020 in some embodiments. This example design may allow for a simple cut-out in wall 5020, to be pre-wired and NRLT listed in a controlled factory environment, to be secured from rear of each junction box 5001, depth adjusted and acoustically sealed. In some embodiments, the junction box 5001 may be provided at the appropriate depth so that the decorative cover 5017 may be flushly secured to the junction box 5001 against the wall 5020. In some embodiments, in order to adjust the junction box 5001 to the appropriate depth within the wall 5020, the tightening or loosening of the adjustment posts 5005 may cause the back panel 5003 to be pulled closer or pushed farther away from the wall 5020 as a result of the operative engagement between the adjustment posts 5005 and the threaded adjustment nuts 5006 on the back panel 5003. This configuration may allow for adjustment and leveling of the junction box 5001 within the wall 5020. The junction box 5001 may then be secured to the wall 5020 by one or more fasteners 5027 that may be placed through the slotted openings 5007 of the back panel 5003.

In some embodiments, a bead of acoustical putty 5023 may be placed between the back panel 5003 of the junction box 5001 and the wall 5020, and a layer of the acoustical putty 5023 may also be placed over the back panel 5003 of the junction box 5001 which may reduce noise transfer through the junction box 5001. In some embodiments, the acoustical putty 5023 may be replaced with or used in combination with fire stop putty and/or another putty material. Once the junction box 5001 has been adjusted so that it is flush with the wall 5020, the decorative cover 5017 may be applied through use of the magnets 5021. In the event that additional materials and or decorations are added or removed from the walls, the junction box 5001 may be adjusted through the use of the adjustment posts 5005 and threaded adjustment nuts 5006. Furthermore, since the decorative cover 5017 is secured by magnets, wall treatments and/or wall panels placed on the wall 5020 may be efficiently and easily moved by removing and replacing the decorative cover 5017 on the junction box 5001. Referring particularly to FIG. 94, the knock-outs 5011 of the junction box 5001 may be positioned on the back panel 5003 and/or body 5009 so as to allow conduit 5025 running into and out of the junction box 5001 to be placed on the same plane so that the space required between walls 5020 to accommodate conduit from separate junction boxes 5001 may be reduced.

Referring now to FIGS. 96-99 and 96A-99A, therein illustrated is another example embodiment of a junction box, generally indicated by reference numeral. The junction box 5101 may contain the same construction, features and functionality as the junction box 5001 discussed above, but it may be configured in a 2-gang configuration. However, it is understood that the junction box may include any number of gangs. The number of gangs may be selected based on the application the junction box is used for. FIG. 100 shows an alternative mounting configuration for the junction box 5101 in which the junction box 5101 may be surface mounted to the wall 5020. The various components described in FIGS. 96-99 and 96A-99A are merely examples, and other variations, including eliminating components, combining components, and substituting components are all contemplated.

FIG. 15 is an isometric front view of the example integrated electrical assembly installed on an example wall arranged in accordance with at least some embodiments described herein. FIGS. 16-24 show additional views of the example integrated electrical assembly installed on an example wall arranged in accordance with at least some embodiments described herein. Referring now to FIGS. 15-24, an alternative use for the integrated electrical assembly 10 is shown in which the integrated electrical assembly 10 may be installed on a wall above the floor and/or ground level. In some embodiments, the integrated electrical assembly 10 may be installed in such a configuration through use of additional support brackets 33 positioned on the bottom of the integrated electrical assembly 10. The additional support brackets 33 may be similar to the support brackets 31 in that they may allow the integrated electrical assembly 10 to be secured to the wall supports 24 while allowing for adjustment, for example leveling, of the integrated electrical assembly 10. In some embodiments, the integrated electrical assembly 10 may also include a removable cover 36 for a conductor compartment for running wiring to additional floors. In some embodiments, the integrated electrical assembly 10 shown in FIGS. 15-24 may include all of the same components and features of the integrated electrical assemblies discussed above. The access cover 4005 has been removed in FIGS. 17 and 22 for clarity. In some embodiments, the integrated electrical assembly 10 may be configured so as to provide an inherently protected type IC NRTL listing that requires zero clearance to combustible materials for installation in wood stud walls and clothing closets with clothes in direct contact with the enclosures.

FIG. 57 a front view of another example integrated electrical assembly arranged in accordance with at least some embodiments described herein. FIGS. 58-62 show additional views of the example integrated electrical assembly arranged in accordance with at least some embodiments described herein. The example embodiment of an integrated electrical assembly is generally indicated by reference numeral 1010. In some embodiments, the integrated electrical assembly 1010 may be configured for installation in a dry location, for example an indoor location, and may include a ventilated door 1013. In some embodiments, the integrated electrical assembly 1010 may be secured to structural members 1025 of a wall, for example wood or steel stud framing, or other structure by mounting brackets 1085. In some embodiments, the integrated electrical assembly 1010 may include a master tub 1050 configured to contain one or more components of the integrated electrical assembly 1010. The components that may be included in the integrated electrical assembly 1010 include, but are not limited to, a low voltage power supply unit 1060, a data-com component 1070, an alternative power unit 1080 and a load center 1090. In some embodiments, the integrated electrical assembly 1010 may also include an access panel 1100 which may be positioned so as to allow accessibility to the wiring and other parts of the components that may be connected to other integrated electrical assemblies and or building systems. The integrated electrical assembly 1010 and components thereof may contain substantially the similar parts and construction as discussed above with respect to the integrated electrical assembly 10. In some embodiments, the integrated electrical assembly 1010 may include fewer components than the integrated electrical assembly 10 due to its suitability for dry location use. For example, the enclosure of the integrated electrical assembly 1010 may not include a door and/or a frame as included in the enclosure of the integrated electrical assembly 10. In some embodiments, the integrated electrical assembly 1010 may be configured to provide an inherently protected type IC NRTL listing that requires zero clearance to combustible materials for installation in wood stud walls and clothing closets with clothes in direct contact with the enclosures.

FIG. 100 is an isometric view of the other example junction box showing surface mounted installation of the example junction box arranged in accordance with at least some embodiments described herein.

FIG. 101 is an isometric view of another example integrated electrical assembly according to In FIGS. 101-103 and 103A, an example embodiment of an integrated electrical assembly is generally indicated by reference numeral 510. In some embodiments, the integrated electrical assembly 510 may be a master electrical distribution node for a building structure and/or a subspace (individual unit) within the building structure, such as one or more living units, hospital rooms, retail spaces, flex warehousing and the like, that may integrate one or more electrical, lighting and/or data-com systems together. In some embodiments, the integrated electrical assembly 510 may be configured as a slave integrated electrical assembly 510 that may receive wiring from a master electrical distribution node. In some embodiments, the integrated electrical assembly 510 may have the same functionality as the integrated electrical assembly 10 discussed above, and that the integrated electrical assembly 510 may be configured to receive and may contain the same components as discussed above with respect to the integrated electrical assembly 10. The various components described in FIGS. 101-103 and 103A are merely examples, and other variations, including eliminating components, combining components, and substituting components are all contemplated.

Still referring to FIGS. 101-103 and 103A, in some embodiments, the integrated electrical assembly 510 may include an enclosure which may include a frame 511, a swing door 512 attached to the frame 511 by a hinge 518 and a mounting flange 516 extending around the periphery of the frame 511. In some embodiments, frame 511, swing door 512, hinge 518, and mounting flange 516 may all be formed of galvanized steel, powder coated galvanealed steel, or another metal. The integrated electrical assembly 510, enclosure of the electrical assembly 510 and components of the enclosure, such as the frame 511 and swing door 512, may be implemented in a variety of shapes and sizes. For example, the swing door 512 may be formed in the shape of an oval. The size and shape of the integrated electrical assembly 510 and components thereof may be selected based on the desired location and application of the integrated electrical assembly 510.

In some embodiments, the hinge 518 may be a continuous plano hinge that may be formed from a non-corrosive or corrosion resistant metal, such as stainless steel. In some embodiments, the hinge 518 may be configured so as to support a heavy durable door, such as the swing door 512, and may provide for pressure relief and/or reduction from high pressure water sprays/jet, for example from power washings of the building structure. The hinge 518 may allow, at least in part, the integrated electrical assembly 510 to obtain at least a NEMA 4 listing. The mounting flange 516 may be constructed from a unitary piece of material, or may be assembled from several pieces of material that are connected by continuous weld seems. In some embodiments, when the mounting flange 516 may be connected to the frame 511 the connections between the mounting flange 516 and the frame 511 and any pieces of the mounting flange 516 may be watertight. In some embodiments, the mounting flange 516 may include one or more compression gaskets 502 around the perimeter of the mounting flange 516. The compression gasket 502 may be adhesive backed so that it may adhere to the surface on which the mounting flange 516 may be installed. In some embodiments, a single compression gasket 502 with a width substantially the same as the width of the mounting flange 516 may be used instead of multiple thinner compression gaskets 502. The compression gasket 502 may be formed from any suitable foam, rubber, polymer, or silicon material or combinations thereof. In some embodiments, the enclosure of the integrated electrical assembly 510 may also include a bottom panel 514 that may contain an outlet 19 with a watertight/water proof cover. For example, the outlet 19 may be a watertight twist lock receptacle, and may be a NEMA 4 rated watertight twist lock receptacle.

In some embodiments, if the integrated electrical assembly 510 is acting as the master node for the building structure, the integrated electrical assembly 510 may also include a master feed enclosure 40 that may be positioned behind the bottom panel 514. The master feed enclosure 40 is shown in greater detail in FIGS. 13A and 13B, and has been discussed above with respect to integrated electrical assembly 10. The master feed enclosure 40 may have the same components and functions in the same manner with the integrated electrical assembly 510 as it does with the integrated electrical assembly 10. In some embodiments, one or more high voltage risers (not shown) may extend from the master feed enclosure 40 and may be configured to connect to another integrated electrical assembly 510 within the building structure.

FIG. 104 is a front view of an example swing door from the other example integrated electrical assembly arranged in accordance with at least some embodiments described herein. FIGS. 105-113 and 107A show additional views of the example swing door from the other example integrated electrical assembly arranged in accordance with at least some embodiments described herein. Referring now to FIGS. 101-107, 107A and 108-113, the swing door 512 of the integrated electrical assembly 510 may contain a door handle 521 for permitting access to and closing of the swing door 512. In some embodiments, the door handle 521 may contain a locking mechanism, such as a keyed tumbler, which may allow for restricting access to the integrated electrical assembly 510. In some embodiments, the door handle 521 may be a swing handle, such as Swing Handle No. 1154 available from EMKA Inc. of Middletown, Pa. In some embodiments, the swing door 512 may also include additional locking mechanisms 521a that may be quarter-turn compression latches, such as Quarter-Turn Assembly Nos. 1000 available from EMKA Inc. In some embodiments, other latches and/or latching systems may be used. For example, screw-type latches may be used. In some embodiments, the locking mechanisms 521a may be operable through the use of a key or tool. Each of the door handle 521 and locking mechanisms 521a may each be operatively connected to a latching mechanism 537, for example cam latches, which may be configured to secure the swing door 512 to the frame 511 when the swing door 512 is in a closed position. In some embodiments, the combination of the door handle 521, locking mechanisms 521a and latching mechanisms 537 may be configured to provide for a three-point closure, in which there is at least one latching mechanism 537 located towards the top, bottom and middle of the swing door 512. While separate locking mechanisms are shown for each latching mechanisms 537, some embodiments may include configurations in which a single locking mechanism 521a and/or handle 521 controls the operation of multiple latching mechanisms 537. The various components described in FIGS. 101-107, 107A and 108-113 are merely examples, and other variations, including eliminating components, combining components, and substituting components are all contemplated.

In some embodiments, the latching mechanisms 537 may engage with corresponding receptacles 538a in the frame 511 of the integrated electrical assembly 510. In some embodiments, each of the receptacles 538a may be a sealed-container with an opening on one side for receiving the corresponding latching mechanism 537. The receptacles 538a may be sealed to the frame 511 and enclosed so that they form a watertight compartment separated from the interior of the integrated electrical assembly 510. In some embodiments, the receptacles 538a may include a convex surface (not shown) configured for engagement with the corresponding latching mechanism 537 which may provide an additional camming surface which may facilitate tight closure of the swing door 512 against the frame 511 of the integrated electrical assembly 510.

In some embodiments, the swing door 512 may also include one or more removable panels 539 which may permit access to the one or more latching mechanisms 537 and interior components of the door handle 521 and locking mechanisms 521a for maintenance and/or repair when the swing door 512 is in an open position. In some embodiments, the removable panels 539 may be gasketed onto the swing door 512 which may provide a watertight seal. In some embodiments, the swing door 512 of the integrated electrical assembly 510 may also include one or more threaded plugs 535 that are configured to threadedly engage with a threaded fastener (not shown) which may allow items, such as rain and/or decorative door panels (not shown), to be secured to the swing door 512 and/or the integrated electrical assembly 510. The threaded plugs 535 may be configured such that the threaded plugs 535 may be compressed when the threaded fastener is tightened onto the threaded plugs 535 which may seal the threaded plugs 535 against the swing door 512. In some embodiments, the swing door 512 of the integrated electrical assembly 510 may also include a low voltage lighting strip (not shown), for example an LED strip or similar, that may provide illumination to the integrated electrical assembly 510 when the swing door 512 of the integrated electrical assembly 510 is in an open position. In some embodiments, the swing door 512 may also include at least one I-beam 529, or other structural member such as a pair of C-channels, formed or fabricated within the swing door 512 which may provide structural rigidity to the swing door 512, and may prevent heat warping of the swing door 512. In some embodiments, the space within the swing door 512 may be at least partially filled with insulation (not shown) so that the integrated electrical assembly 510 may be resistive to heat and/or cold transfer from outside the integrated electrical assembly 510 to the components within the integrated electrical assembly.

In some embodiments, the swing door 512 may be configured to be opened to 180°, but the swing door 512 may include mechanisms (not shown) that may permit the swing door 512 to only open a certain amount which may prevent accidental damage to nearby objects and/or persons, or may include fixed and/or adjustable stops (not shown) that may be configured to hold the swing door 512 open at a particular open position, for example at 90°. In some embodiments, the swing door 512 may also include a continuous peripheral lip 558 that may flare outwardly from the non-hinge side, top and bottom of the swing door 512 which may produce a shoulder formation on the non-hinge side, top and bottom of the swing door 512. The peripheral lip 558 may act to engage a gasket 534e (FIGS. 115A, 115B & 116A) on the frame 511 of the integrated electrical assembly 510 when the swing door 512 is closed which may contribute to a water-tight seal between the swing door 512 and the frame 511, as discussed further below. The gasket 534e may be formed from any suitable foam, rubber, polymer, or silicon material or combinations thereof FIG. 114 is a front view of the other example integrated electrical assembly installed on an example wall arranged in accordance with at least some embodiments described herein. FIGS. 117-120 show additional views of the other example integrated electrical assembly installed on an example wall arranged in accordance with at least some embodiments described herein. In some embodiments, the integrated electrical assembly 510 may be configured for installation in an example wall 20, which may be, for example, an exterior wall. In some embodiments, the integrated electrical assembly 510 may be positioned in an opening formed in the wall 20 that may be flanked by one or more wall supports 24 and a floor surface 22 on the bottom of the opening, as shown in FIGS. 118 and 119. The wall support 24 may be an industry standard steel stud or a formed metal stud, for example a roll formed and stamped steel stud such as a DELTASTUD available from Steelform Building Products Inc. The floor surface 22 may be any suitable building flooring surface and/or structure, and may be for example concrete. In some embodiments, the integrated electrical assembly 510 may be installed on a wall 20 above the floor and/or ground level, as shown in FIGS. 114, 117 and 120. The integrated electrical assembly 510 may be installed in such a configuration through use of support brackets (not shown) that may be positioned on the bottom of the integrated electrical assembly 510, in the same manner that the integrated electrical assembly 10 discussed above is supported on a wall above the floor and/or ground level. The various components described in FIGS. 114 and 117-120 are merely examples, and other variations, including eliminating components, combining components, and substituting components are all contemplated.

Referring now to FIGS. 114A, 118A, 119A and 120A, in some embodiments, the opening in the wall 20 may be bordered along its perimeter by a metallic wall plate 559 that may be affixed to the wall 20 by one or more fasteners (not shown), such as screws or nails, through a wall plate mounting holes 571 that may be spaced about the perimeter of the metallic wall plate 559. In some embodiments, the metallic wall plate 559 may also include one or more mounting holes 523a through which fasteners that may be used to attach the integrated electrical assembly 510 to the wall may be passed. The metallic wall plate 559 may be formed by one or more panels or strips, or may by formed from a unitary piece of material. In some embodiments, the metallic wall plate 559 may be made from a non-corrosive or corrosion resistant material, such as aluminum, stainless steel, or galvanized steel. In some embodiments, a bead of a sealant (not shown), such as silicon, polyurethane, acrylic, adhesive, epoxy, may be placed between the metallic wall plate 559 and the wall 20 which may provide a water tight seal between the metallic wall plate 559 and the wall 20. In some embodiments, a gasket (not shown) may be provided on the metallic wall plate 559 which may seal the metallic wall plate 559 to the wall 20. The metallic wall plate 559 may provide a known mounting surface on which the integrated electrical assembly 510 may be mounted regardless of the material used for the wall 20. The various components described in FIGS. 114A, 118A, 119A and 120A are merely examples, and other variations, including eliminating components, combining components, and substituting components are all contemplated.

Referring again to FIGS. 114 and 117-120, in some embodiments, the mounting flange 516 of the integrated electrical assembly 510 may be secured to the metallic wall plate 559 and the wall 20 through use of one or more fasteners 526, such as nails, screws, bolts, lag screws, lag bolts or a combination thereof, that may be passed through the mounting holes 523 in the mounting flange 516. In some embodiments, the mounting flange 516 may be secured to the metallic wall plate 559 and the wall 20 such that the compression gasket 502 may form a watertight seal between the mounting flange 516 and the metallic wall plate 559 which may prevent the infusion of liquids into the integrated electrical assembly 510.

In some embodiments, a vertical rain channel 573 may also be installed on the integrated electrical assembly 510 by the one or more fasteners 526 on the side of the frame 511 opposite the hinge 518. The vertical rain channel 573 may divert liquids away from the joint between the swing door 512 and the frame 511, and may provide a transition for any decorative panels (not shown) that may be installed on the swing door 512 and/or the wall 20. In some embodiments, a hinge side rain channel 575 may also be included on the on the hinge 518 side of the frame that may divert liquids away from the hinge 518 and may provide a transition for any decorative panels (not shown) that may be installed on the swing door 512 and/or the wall 20. In some embodiments, a top rain shield drip edge 547 may also be installed above the swing door 512 on the top edge of the integrated electrical assembly 510 which may prevent and/or reduce moisture, such as rain, from running down the wall 20 onto the integrated electrical assembly 510. In some embodiments, the rain shields may be made of a corrosion-resistant metal such as galvanized steel, stainless steel, or aluminum.

Referring now to FIGS. 106, 107, 107A, 108, 115A, 115B, 116, 116A, 116B, 121, 122, 122A and 122B, the construction and interaction of the swing door 512 and the frame 511 of the integrated electrical assembly 510 which may provide for a watertight coupling according to some embodiments, will now be discussed in accordance with at least some embodiments described herein. In some embodiments, the top, bottom and sides of the swing door 512 may be sealed to the frame 511 when the swing door 512 is shut by a series of gasket—structure interactions. From the outer perimeter of the door towards the inner area of the frame 511 these gasket—structure interactions may be as follows: (1) gasket 534e—continuous peripheral lip 558, (2) door gasket 534f—housing lip 527, outside perimeter blade 578 and inside perimeter blade 579 and (3) inner frame gasket 534a—interior door blade 585. The various components described in FIGS. 106, 107, 107A, 108, 115A, 115B, 116, 116A, 116B, 121, 122, 122A and 122B are merely examples, and other variations, including eliminating components, combining components, and substituting components are all contemplated.

In some embodiments, the first interaction between the swing door 512 and the frame 511, as mentioned above, may be the interaction between the gasket 534e on the frame 511 and the continuous peripheral lip 558 on the swing door 512. In some embodiments, this interaction may be present on the non-hinge side, top and bottom of the swing door 512. In some embodiments, the continuous peripheral lip 558 may extend at an angle relative to the perimeter of the swing door 512, which may facilitate directing fluids away from the gasket 534e when the continuous peripheral lip 558 may be engaged with the gasket 534e. When the swing door 512 is in a closed position relative to the frame 511 of the integrated electrical assembly 510 the continuous peripheral lip 558 may engage with and may be embedded into the gasket 534e so that a watertight seal may be formed between the continuous peripheral lip 558.

In some embodiments, the second interaction between the swing door 512 and the frame 511 may be the interaction between a housing lip 527 extending around the inside perimeter of the mounting flange 516, which may include an outside perimeter blade 578 and an inside perimeter blade 579 extending around the outside perimeter and inside perimeter respectively of the housing lip 527 and a door gasket 543f that may be positioned in a door channel 528 extending around the perimeter of the swing door 512. The outside perimeter blade 578 and inside perimeter blade 579 may be positioned substantially parallel to each other, and may extend substantially perpendicular to the mounting flange 516. The outside perimeter blade 578 and inside perimeter blade 579 may extend away from the mounting flange 516 a greater distance than the housing lip 527 so that the housing lip 527 may be recessed relative to the heights of the outside perimeter blade 578 and the inside perimeter blade 579. This extension of the outside perimeter blade 578 and the inside perimeter blade 579 relative to the housing lip 527 may facilitate engagement and compression of the door gasket 534f when the swing door 512 is closed. The outside perimeter blade 578 and the inside perimeter blade 579 may provide two points of contact with the door gasket 534f which may assure a watertight seal is formed when the swing door 512 is closed. The outside perimeter blade 578 and the inside perimeter blade 579 may focus compression of the door gasket 534f, instead of spreading compression of the door gasket 534f over a larger area. In some embodiments, the door gasket 534f may be positioned and/or sized such that it also may contact the housing lip 527 which may provide an additional surface on which it may be sealed. In some embodiments, the second interaction discussed above may occur around the entire perimeter of the swing door 512, i.e. top, bottom, hinge side and non-hinge side. The gaskets may be formed from any suitable foam, rubber, polymer, or silicon material or combinations thereof In some embodiments, the third interaction between the swing door 512 and the frame 511 may be the interaction between the interior door blade 585 extending around an inside perimeter edge of the back of the swing door 512 and the inner frame gasket 534*a* positioned on the inside perimeter of the door opening in the frame 511 adjacent to the inside perimeter blade 579 and housing lip 527. The interior door blade 585 may extend around the entire inside perimeter edge of the back of the swing door 512 and may be raised relative to the back of the swing door 512 so that when the swing door 512 is closed, the interior door blade 585 may contact the inner frame gasket 534*a* prior to any contact by the back of the swing door 512 with the inner frame gasket 534*a*. This extension of the interior door blade 585 relative to the back of the swing door 512 may facilitate engagement and compression of the inner frame gasket 534*a* when the swing door 512 is closed. In some embodiments, any of the interactions discussed above may be sufficient to produce a watertight seal, and not all of the interactions may be necessary to provide a watertight seal. In some embodiments, it may be desirable to include one or more of the interactions in the integrated electrical assembly which may provide a backup system should one of the interactions fail due to wear, manufacturing defects or damage. In some embodiments, another interaction between a door top gasket 534*g* and an inner drip edge blade 507 may also be provided to increase the water tightness of the top edge of the integrated electrical assembly 510. In addition to engaging with and compressing the door top gasket 534*g* to produce a watertight seal, the inner drip edge blade 507 may also act as a channel to redirect any water that may penetrate the gasket 534*e*—continuous peripheral lip 558 interaction away from the top edge of the opening to the integrated electrical assembly 510.

Referring now to FIGS. 116 and 116B, in some embodiments, the positioning of the hinge 518 relative to the swing door 512 and the frame 511 of the integrated electrical assembly 510 may be such that the hinge 518 may be positioned outside of the door gasket 534*f*—housing lip 527, outside perimeter blade 578 and inside perimeter blade 579 interaction, and the inner frame gasket 534*a*—interior door blade 585 interaction. Such positioning, in particular having one side of the hinge 518 lay flat on the mounting flange 516 of the integrated electrical assembly 510 may ensure that at least two watertight interactions are positioned after the hinge 518 so that it may not be necessary that the hinge 518 itself be watertight. In some embodiments, the hinges may be watertight hinges.

As mentioned above, in some embodiments, the integrated electrical assembly 510 may have substantially the same functionality and construction as discussed above with respect to the integrated electrical assembly 10 unless otherwise noted. For example, the integrated electrical assembly 510 may be used for and/or replace the uses of the integrated electrical assembly 10 with respect to decorative panels shown in and discussed with respect to FIGS. 2A and 6A, any and/or all components 30, 60, 70, 80, 90 shown in and discussed with respect to FIGS. 9-10 and 13, the wiring connections shown in and discussed with respect to FIGS. 14C, 14D, 14E and 23-24, the master tub 50 shown in and discussed with respect to FIGS. 25-29 and the systems shown in and discussed with respect to FIGS. 71-72. Accordingly, although discussions and drawings are not being repeated, the integrated electrical assembly 510 may be used in a manner and for any purpose discussed and/or shown in relation to integrated electrical assembly 10.

It is understood that the integrated electrical assemblies and components thereof may not be limited to any particular material and/or construction, but it may be the integrated electrical assemblies may be constructed of substantially durable materials to suit their intended purposes. It may also be that the materials used to form or manufacture the integrated electrical assemblies and components thereof may be treated and prepared so as to resist corrosion or physical damage, for example by preparation through suitable powder-coating techniques. In some embodiments, the frames and swing doors of the integrated electrical assemblies 10 and 510 may be formed from galvanized steel with a powder-coating sufficient to obtain a NEMA X rating for salt spray, such as a NEMA 4X rating.

FIG. 123 is a schematic illustration of another example junction box, arranged in accordance with at least some embodiments described herein. FIGS. 124-128 show additional views of the example junction box, arranged in accordance with at least some embodiments described herein. In some embodiments, example junction box 7001 may be used with the integrated electrical assembly 10, 510, and/or 1010. In some embodiments, the junction box 7001 may include a back panel 7003 with threaded adjustment nuts 7006 coupled to adjustment posts 7005, a body 7009, a component 7015, and an interior cover 7019 that may be configured to secure to the body 7009. In some embodiments, as illustrated in FIGS. 123 and 125, the back panel 7003 may include four threaded adjustment nuts 7006 located proximate the corners of the back panel 7003, and aligned with corresponding openings 7004 in the back panel 7003. More or fewer adjustment nuts 7006 may be used. The interior cover 7019 may cover the components housed within the junction box 7001. Optionally, the junction box 7001 may include a decorative cover 7017 that may be configured to attach to the junction box 7001. In some embodiments, the back panel 7003 and/or the body 7009 of the junction box 7001 may include one or more knock-outs 7011. The back panel 7003 and the body 7009 may be secured to each other by suitable welding techniques. In some embodiments, the junction box 7001 may include two L-brackets 7035 positioned on opposite sides of the body 7009. In some embodiments, the junction box 7001 may include four L-brackets 7035 positioned on each side of the body 7009. The body 7009 may have a series of openings 7033 configured to receive fasteners 7037. Fasteners 7037 may be configured to secure the L-brackets 7035 to the body 7009. The series of openings 7033 may allow the L-brackets 7035 to be secured at a variety of positions along the body 7009. In some embodiments, the series of openings 7033 are spaced at quarter inch intervals. The body 7009, back panel 7003, L-brackets 7035, and/or interior cover 7017 may be made from steel, aluminum, rigid polymer, another suitable material, or combinations thereof. The various components described in FIGS. 123-128 are merely examples, and other variations, including eliminating components, combining components, and substituting components are all contemplated.

In some embodiments, the decorative cover 7017 of the junction box 7001 may be removably secured to the interior cover 7019 by one or more magnets. In some embodiments, the decorative cover 7017 may be removably secured to interior cover 7019 by one or more Velcro tabs. Even when the decorative cover 7017 is removed from the junction box 7001, the interior of the junction box 7001 may be still covered by the interior cover 7019 so that the components therein may not be exposed. In some embodiments, the junction box 7001 without the decorative cover 7017 may be configured for UL listing.

In some embodiments, the component 7015 may be coupled to the interior cover 7019 rather than the body 7009 of the junction box 7001 by fasteners 7031. One or more components 7015 may be enclosed in the junction box 7001. For example, in the embodiment illustrated in FIG. 123, four components 7015 are included. In some embodiments, the component 7015 may be electrical components commonly found in junction boxes, such as outlets, switches, dimmers, and USB chargers.

Referring now to FIGS. 126-128, the installation and adjustment of the junction box 7001 on an example wall 7020 is shown arranged in accordance with at least some embodiments described herein. In some embodiments, the junction box 7001 may be configured for installation from the back surface of the wall 7020. This may allow for a simple cut-out in wall 7020 to be pre-wired and NRTL listed in a controlled factory environment. In some embodiments, the junction box 7001 may be secured from rear, depth adjusted and acoustically sealed in a controlled factory environment. In some embodiments, the L-brackets 7035 are removed from the body 7009 before placing the junction box in the wall 7020. Once placed in the wall 7020, to adjust the junction box 7001 to the appropriate depth within the wall 7020, the tightening or loosening of the adjustment posts 7005 may cause the back panel 7003 to be pulled closer or pushed farther away from the wall 7020 as a result of the operative engagement between the adjustment posts 7005 and the threaded adjustment nuts 7006 on the back panel 7003. This configuration may allow for adjustment and leveling of the junction box 7001 within the wall 7020 and securing the junction box 7001 to the wall 7020. The L-brackets 7035 may then be secured to the body 7009 by fasteners 7037. The L-brackets 7035 may be positioned by choosing appropriate openings from the series of openings 7033 such that they are adjacent to the front surface of the wall 7020. This may prevent or reduce movement of the interior cover 7019 side of the junction box 7001. The macro adjustable L-brackets 7035 and adjustment posts 7005 may allow the junction box 7001 to be provided at the appropriate depth so that the decorative cover 7017 may be flushly secured to the junction box 7001 against the wall 7020. The junction box 7001 may then be secured to the wall 7020 by one or more fasteners 7027 that may be placed through the slotted openings 7007 of the back panel 7003. The various components described in FIGS. 126-128 are merely examples, and other variations, including eliminating components, combining components, and substituting components are all contemplated.

In some embodiments, a bead of acoustical putty 7023 may be placed between the back panel 7003 of the junction box 7001 and the wall 7020, and a layer of the acoustical putty 7023 may also be placed over the back panel 7003 of the junction box 7001 which may reduce noise transfer through the junction box 7001. In some embodiments, the acoustical putty 7023 may be replaced or used in combination with fire stop putty and/or other putty material.

In the event that additional materials and or decorations are added or removed from the walls, the junction box 7001 may be adjusted through the use of the adjustment screws 7030 to allow the interior cover 7019 or decorative cover 7017 to be flush with the wall and/or wall coverings. The adjustment screws 7030 may allow for micro adjustment of the interior cover 7019. The adjustment screws 7030 may allow for the interior cover 7019 to be adjusted forward and back in relation to the back panel 7003. The adjustment screws 7030 may also allow the interior cover 7019 to be adjusted up and down parallel in relation to the back panel 7003. In other words, the adjustment screws may allow the interior cover 7019 to be adjusted horizontally and/or vertically and/or adjusted forward and/or backward in relation to the body 7009. The interior cover 7019 may include a lip 7039 and a flange 7041 coupled to the lip 7039 that extends back towards the back panel 7003. The lip 7039 and flange 7041 may surround a perimeter of the interior cover 7019. The lip 7039 and flange 7041 may prevent a gap between the body 7009 and the interior cover 7019 as the interior cover is adjusted by the adjustment screws 7030. A gap between the body 7009 and the interior cover 7019 may present an electrical hazard. In some embodiments, the limit of the range of adjustment of the adjustment screws 7030 may be a height of the lip 7039 and a length of the flange 7041. Once the junction box 7001 has been adjusted so that it is flush with the wall 7020, the decorative cover 7017 may be applied to the interior cover 7019 through use of the magnets or Velcro.

Referring to FIG. 128, the knock-outs 7011 of the junction box 7001 may be positioned on the back panel 7003 and/or body 7009 so as to allow conduit 7025 running into and out of the junction box 7001 to be placed on the same plane so that the space required between walls 7020 to accommodate conduit from separate junction boxes 7001 may be reduced. Furthermore, the back panel 7003 may be configured such that it has an up and a down installation configuration. The up configuration and down configuration may be designated by differently shaped openings 7050, 7055. In the example shown in FIG. 125, one opening 7055 is square shaped, and the other opening 7050 is a circle. Other shape combinations may be used. Also, the spacing of the adjustment posts 7005 may be different on the top and bottom. When installing junction boxes 7001 back-to-back in a wall 7020, one junction box may be installed with the opening 7055 at the top, which may correspond to the up configuration while the other junction box may be installed with opening 7050 at the top, which may correspond to the down configuration. In this manner, both the conduits 7025 and the adjustment posts 7005 from the different junction boxes may not impact each other when installed back-to-back.

In some embodiments, the junction box 7001 may include additional knock outs 7011 and/or notches 7056 configured to allow access to various components, such as fasteners, of the junction box. For example, notches 7056 may allow screwdriver access to fasteners 7037.

FIG. 129 shows a schematic illustration of another example embodiment of a junction box 7101, arranged in accordance with at least some embodiments described herein. The junction box 7101 may contain the same construction, features and functionality as the junction box 7001 discussed above, but it may be configured in a 2-gang configuration. However, it is understood that the junction box may include any number of gangs. The number of gangs may be selected based on the application the junction box is used for. The various components described in FIG. 129 are merely examples, and other variations, including eliminating components, combining components, and substituting components are all contemplated.

FIG. 130 shows a schematic illustration of another example embodiment of a junction box, arranged in accordance with at least some embodiments described herein. The junction box 7201 includes an extender box 7260 coupled to the back panel. In some embodiments, the extender box 7260 may include an opening (not shown) aligned with an opening in the back panel 7203 and an opening 7262 on the upper surface of the box. The extender box 7260 may be configured to protect a conduit, such as conduit 7025 illustrated in FIG. 128, where it runs into and out of the junction box 7201. The extender box may protect the conduit from breakage when it bends to enter the junction box. The various components described in FIG. 130 are merely examples, and other variations, including eliminating components, combining components, and substituting components are all contemplated.

FIG. 131 is a schematic illustration of an example manufactured wire assembly 2000, arranged in accordance with at least some embodiments described herein. The manufactured wire assembly 2000 may include a connector 2005 and a load 2015 coupled to opposite ends of a cord 2010. The cord 2010 may be a sheath enclosing one or more wires (not shown). The various components described in FIG. 131 are merely examples, and other variations, including eliminating components, combining components, and substituting components are all contemplated.

In some embodiments, the cord 2010 may be implemented using metal coils, plastic coating, rubber tubing, another material, or combinations thereof. The cord 2010 may provide organization, protection, and/or insulation for the one or more wires enclosed. In some embodiments, the wires enclosed in the cord 2010 may be electrical wires configured for conducting electricity. For example, the electrical wires may be tin-coated copper wires. In some embodiments, the cord 2010 may include at least one wire configured to act as a hot, at least one wire configured to act as a neutral, and at least one wire configured to act as a ground. Other wiring configurations may be used. The number of wires and the configuration of each wire may be chosen based on the electrical requirements of the application. In some embodiments, the cord 2010 may include data and telecommunication cables in addition to or instead of electrical wires.

In some embodiments, the load 2015 may be a plurality of loads. Loads may include, but are not limited to, junction boxes, lighting systems, appliances, and battery chargers. In some embodiments, the connector 2005 may be configured to be coupled to a power source. A power source may include, but is not limited to, a battery, a generator, an electrical feed unit. The power source may be configured to accept the connector 2005 with a complementary connector. In some embodiments, a power source may be configured to accept a plurality of connectors 2005. In some embodiments, the manufactured wire assembly 2000 may be configured to couple multiple loads 2015 to a power source.

In some embodiments, the manufactured wire assembly 2000 may allow for coupling between a load and a power source in a reduced period of time. The manufactured wire assembly 2000 may reduce or eliminate the number of wires that need to be individually coupled between a load and a power source. This may allow electrical components to be pre-wired in a controlled factory environment and coupled to a power source when delivered to a remote site.

FIG. 132 is a schematic illustration of an example circuit 2100 including a manufactured wire assembly 2105 arranged in accordance with at least some embodiments described herein. The manufactured wire assembly 2105 may include a connector 2110 coupled to a complementary connector 2115 coupled to a power source 2120. The opposite end of the manufactured wire assembly 2105 may be coupled to a junction box 2125. The junction box 2125 may be implemented as junction box 5001, 7000, 7100, 7200, and/or another junction box. The various components described in FIG. 132 are merely examples, and other variations, including eliminating components, combining components, and substituting components are all contemplated.

In some embodiments, the junction box 2125 may be installed in a pre-manufactured wall such that the wall is pre-wired. The manufactured wire assembly 2105 may be coupled to the junction box 2125 and a cord 2130 of the manufactured wire assembly may run through the wall (not shown). For example, the cord 2130 may run through a chase or an air gap within the wall. A length of the cord 2130 including the connector 2110 may extend beyond the edge of the pre-manufactured wall. The pre-manufactured wall may be transported to a construction site and installed as a portion of a building structure. During installation, the connector 2110 may be coupled to a connector 2115 of a power source 2120, completing the electrical connections of the wall.

FIG. 133 is a schematic illustration of an example circuit 2200 including a manufactured wire assembly 2205, arranged in accordance with at least some embodiments described herein. The manufactured wire assembly 2205 may include a connector 2210 coupled to a complementary connector 2215 coupled to a power source 2220. The opposite end of the manufactured wire assembly 2205 may be coupled to a plurality of junction boxes 2225a-c. The junction boxes 2225a-c may be implemented as junction box 7000, 7100, 7200, another junction box, and/or combinations thereof. The various components described in FIG. 133 are merely examples, and other variations, including eliminating components, combining components, and substituting components are all contemplated.

In some embodiments, the junction boxes 2225a-c may be installed in a pre-manufactured wall such that the wall is pre-wired. The manufactured wire assembly 2205 may be coupled to the junction boxes 2225a-c and a cord 2230 of the manufactured wire assembly may run through the wall (not shown). For example, the cord 2230 may run through a chase or an air gap within the wall. A length of the cord 2230 including the connector 2210 may extend beyond the edge of the pre-manufactured wall. The pre-manufactured wall may be transported to a construction site and installed as a portion of a building structure. During installation, the connector 2210 may be coupled to a connector 2215 of a power source 2220, completing the electrical connections of the wall. The junction boxes 2225a-c do not need to be individually wired and/or coupled to the power source 2220 during installation. This may reduce time and/or labor costs during construction of the building structure.

FIG. 134 is a schematic illustration of an example circuit 2300 including a manufactured wire assembly 2305 arranged in accordance with at least some embodiments described herein. The manufactured wire assembly 2305 may include a connector 2310 coupled to a complementary connector 2315 coupled to a low-voltage power source 2320. The opposite end of the manufactured wire assembly 2305 may be coupled to a lighting fixture 2325. In some embodiments, the lighting fixture is an LED lighting fixture. Other low voltage lighting fixtures may be used. The various components described in FIG. 134 are merely examples, and other variations, including eliminating components, combining components, and substituting components are all contemplated.

In some embodiments, the lighting fixture 2325 may be installed in a pre-manufactured wall such that the wall is pre-wired with lighting components. The manufactured wire assembly 2305 may be coupled to the lighting fixture 2325 and a cord 2330 of the manufactured wire assembly may run through the wall (not shown). For example, the cord 2330 may run through a chase or an air gap within the wall. A length of the cord 2330 including the connector 2310 may extend beyond the edge of the pre-manufactured wall. The pre-manufactured wall may be transported to a construction site and installed as a portion of a building structure. During installation, the connector 2310 may be coupled to a connector 2315 of a low-voltage power source 2320, completing the electrical connections of the lighting fixture 2325 in the wall.

Similar to what was shown in FIG. 133, multiple lighting fixtures 2325 may be installed in a pre-manufactured wall and coupled to the manufactured wire assembly 2305. The lighting fixtures 2325 do not need to be individually wired and/or coupled to the low-voltage power source 2320 during installation. This may reduce time and/or labor costs during construction of the building structure.

In some embodiments, manufactured wire assemblies may be used to pre-wire a building structure and/or subspace of a building structure. For example, an apartment and/or a room of an apartment may be pre-wired. Lighting fixtures, junction boxes, kitchen appliances, and/or additional loads may be coupled to manufactured wire assemblies and pre-installed in walls, ceilings, floors, and/or other elements of the building structure. One or more of the elements of the building structure may be pre-manufactured in a factory or off-site from the building structure. The elements may arrive at the site of the building structure pre-wired. Once the elements are installed to form the building structure and/or subspace of the building structure, the manufactured wire assemblies may be coupled to one or more power sources. The wiring of some or all of the lighting fixtures, junction boxes, appliances, and/or additional loads may then be complete. The coupling of connectors may reduce time and/or labor costs during construction of the building structure.

In some embodiments, manufactured wire assemblies may be used with an integrated electrical assembly. For example, integrated electrical assembly 10, 510, and/or 1010 may be used. In some embodiments, manufactured wire assemblies may be coupled to cable connectors of the electrical assembly. The cable connectors may provide a connection to a load center, a low voltage power unit, and/or another component of the integrated electrical assembly. An example integrated electrical assembly 10 that may be used with manufactured wire assemblies is shown in FIG. 13. One or more connectors from one or more manufactured wire assemblies may be coupled to the cable connectors 32. Some of the cable connectors 32 may be coupled to a load center 90 while other cable connectors 32 may be coupled to a low voltage power unit 60. In some embodiments, the connectors of the manufactured wire assemblies and the cable connectors 32 may be color coded to facilitate proper coupling of connectors. In some embodiments, an adaptor may be used which may provide compatibility between the cable connectors 32 and connectors of the manufactured wire assembly.

In some embodiments, the integrated electrical assembly may be installed in a pre-manufactured wall in a controlled factory environment and one or more manufactured wire assemblies may also be installed in one or more pre-manufactured elements in a controlled factory environment. The wall and elements may arrive at the site of the building structure pre-wired. Once the elements are installed to form the building structure and/or subspace of the building structure, the one or more manufactured wire assemblies may be coupled to the integrated electrical assembly as described previously. The integrated electrical assembly may be coupled to a power main or power distribution node. The wiring of the building structure and/or subspace may then be complete. The coupling of connectors of the manufactured wire assemblies and the cable connectors 32 may reduce time and/or labor costs during construction of the building structure.

The present disclosure is not to be limited in terms of the particular combinations of the various elements disclosed. Additional combinations may be possible. For example, an enclosure of an integrated electrical assembly may be utilized separately from the integrated electrical assembly. The enclosure may be used with a printed circuit board, plumbing, or other instruments that may be desirous to be in a weather-resistant enclosure. In another example, multi-wire connectors may be used independently of an integrated electrical assembly, master tub, and/or low voltage power unit. The multi-wire connectors may be used to couple wires in an unrelated circuit in some embodiments. Junction boxes may be used with a manufactured wire assembly, but may also be wired by conventional means. The above combinations are only exemplary and other combinations may be formed.

The present disclosure is not to be limited in terms of the particular examples described in this application, which are intended as illustrations of various aspects. Many modifications and examples can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and examples are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular examples only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 items refers to groups having 1, 2, or 3 items. Similarly, a group having 1-5 items refers to groups having 1, 2, 3, 4, or 5 items, and so forth.

While the foregoing detailed description has set forth various examples of the devices and/or processes via the use of block diagrams, flowcharts, and/or examples, such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one example, several portions of the subject matter described herein, for example the LED drivers, may be implemented via Application Specific Integrated Circuits (ASICs), Field Programmable Gate Arrays (FPGAs), digital signal processors (DSPs), or other integrated formats. However, those skilled in the art will recognize that some aspects of the examples disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. For example, if a user determines that speed and accuracy are paramount, the user may opt for a mainly hardware and/or firmware vehicle; if flexibility is paramount, the user may opt for a mainly software implementation; or, yet again alternatively, the user may opt for some combination of hardware, software, and/or firmware.

In addition, those skilled in the art will appreciate that the mechanisms of the subject matter described herein are capable of being distributed as a program product in a variety of forms, and that an illustrative example of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While various aspects and examples have been disclosed herein, other aspects and examples will be apparent to those skilled in the art. The various aspects and examples disclosed herein are for purposes of illustration and are not intended to be limiting, with the true scope and spirit being indicated by the following claims.

What is claimed is:

1. A junction box, comprising:
   a body having four sides forming a perimeter;
   a back panel coupled to the body, wherein the back panel includes a plurality of openings, wherein the back panel extends beyond the perimeter of the body;
   a plurality of threaded adjustment nuts;
   a plurality of adjustment posts coupled to the adjustment nuts, wherein the adjustment posts pass through at least some of the plurality of openings; and
   an interior cover plate reversibly coupled to the body by a plurality of adjustment screws, wherein the interior cover plate includes a lip around a perimeter of the interior cover plate and a flange coupled to the lip, and wherein the adjustment screws in combination with the flange and the lip of the interior cover plate facilitate movement of the interior cover plate at least forward and backward relative to the back panel.

2. The junction box of claim 1, wherein the flange extends toward the back panel and fits within the perimeter of the body.

3. The junction box of claim 1 further comprising at least two L-brackets removably coupled to the body on two of the four sides, wherein the two of the four sides are parallel to each other and wherein the two of the four sides include a plurality of openings spaced at regular intervals, wherein the openings accept fasteners to couple the L-brackets to the body.

4. The junction box of claim 1, wherein the back panel includes a first shape opening proximate a first edge and a second shape opening proximate a second edge parallel to the first edge, wherein the first and second shapes are different.

* * * * *